(12) United States Patent
Yang et al.

(10) Patent No.: US 11,641,738 B2
(45) Date of Patent: May 2, 2023

(54) THREE-DIMENSIONAL SEMICONDUCTOR MEMORY DEVICE

(71) Applicant: Samsung Electronics Co., Ltd., Suwon-si (KR)

(72) Inventors: Woosung Yang, Gwangmyeong-si (KR); Byungjin Lee, Hwaseong-si (KR); Bumkyu Kang, Suwon-si (KR); Dong-Sik Lee, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 304 days.

(21) Appl. No.: 17/021,416

(22) Filed: Sep. 15, 2020

(65) Prior Publication Data

US 2021/0217760 A1 Jul. 15, 2021

(30) Foreign Application Priority Data

Jan. 15, 2020 (KR) .................. 10-2020-0005350

(51) Int. Cl.
*H01L 27/11539* (2017.01)
*H01L 23/522* (2006.01)
(Continued)

(52) U.S. Cl.
CPC .......... *H01L 27/11539* (2013.01); *G11C 7/18* (2013.01); *G11C 16/08* (2013.01);
(Continued)

(58) Field of Classification Search
CPC .......... H01L 27/11539; H01L 23/5226; H01L 23/5283; H01L 27/11519; H01L 27/11543;
(Continued)

(56) References Cited

U.S. PATENT DOCUMENTS 8,059,443 B2 11/2011 McLaren et al.
8,824,184 B2 9/2014 Baek et al.
(Continued)

FOREIGN PATENT DOCUMENTS

JP 2019-102744 6/2019
KR 10-2013-0019644 A 2/2013
KR 101574358 B1 12/2015

*Primary Examiner* — David Vu
(74) *Attorney, Agent, or Firm* — Fish & Richardson P.C.

(57) ABSTRACT

A three-dimensional semiconductor memory device including a first peripheral circuit including different decoder circuits, a first memory on the first peripheral circuit, the first memory including a first stack structure having first electrode layers stacked on one another and first inter-electrode dielectric layers therebetween, a first planarized dielectric layer covering an end of the first stack structure, and a through via that penetrates the end of the first stack structure, the through via electrically connected to one of the decoder circuits, and a second memory on the first memory and including a second stack structure having second electrode layers stacked on one another and second inter-electrode dielectric layers therebetween, a second planarized dielectric layer covering an end of the second stack structure, and a cell contact plug electrically connecting one of the second electrode layers to the through via.

20 Claims, 52 Drawing Sheets

(51) Int. Cl.
  *H01L 27/11519* (2017.01)
  *H01L 27/11551* (2017.01)
  *H01L 27/11565* (2017.01)
  *H01L 27/11573* (2017.01)
  *H01L 23/528* (2006.01)
  *H01L 27/11543* (2017.01)
  *G11C 16/08* (2006.01)
  *G11C 7/18* (2006.01)
  *H01L 27/11578* (2017.01)

(52) U.S. Cl.
  CPC ...... *H01L 23/5226* (2013.01); *H01L 23/5283* (2013.01); *H01L 27/11519* (2013.01); *H01L 27/11543* (2013.01); *H01L 27/11551* (2013.01); *H01L 27/11565* (2013.01); *H01L 27/11573* (2013.01); *H01L 27/11578* (2013.01)

(58) Field of Classification Search
  CPC ......... H01L 27/11551; H01L 27/11565; H01L 27/11573; H01L 27/11578; H01L 27/11582; H01L 27/1157; H01L 27/11563; H01L 27/11568; H01L 29/66833; H01L 29/792; G11C 7/18; G11C 16/08; G11C 16/0483
  See application file for complete search history.

(56) References Cited

U.S. PATENT DOCUMENTS

| | | |
|---|---|---|
| 10,074,667 B1 | 9/2018 | Higashi et al. |
| 10,283,493 B1 | 5/2019 | Nishida |
| 10,297,578 B2 | 5/2019 | Tagami et al. |
| 10,354,987 B1 | 7/2019 | Mushiga et al. |
| 11,211,397 B2 * | 12/2021 | Lu ................... H01L 27/11573 |
| 2017/0243650 A1 | 8/2017 | Ogawa et al. |
| 2017/0352678 A1 | 12/2017 | Lu et al. |
| 2019/0057974 A1 | 2/2019 | Lu et al. |
| 2019/0221557 A1 | 7/2019 | Kim et al. |

* cited by examiner

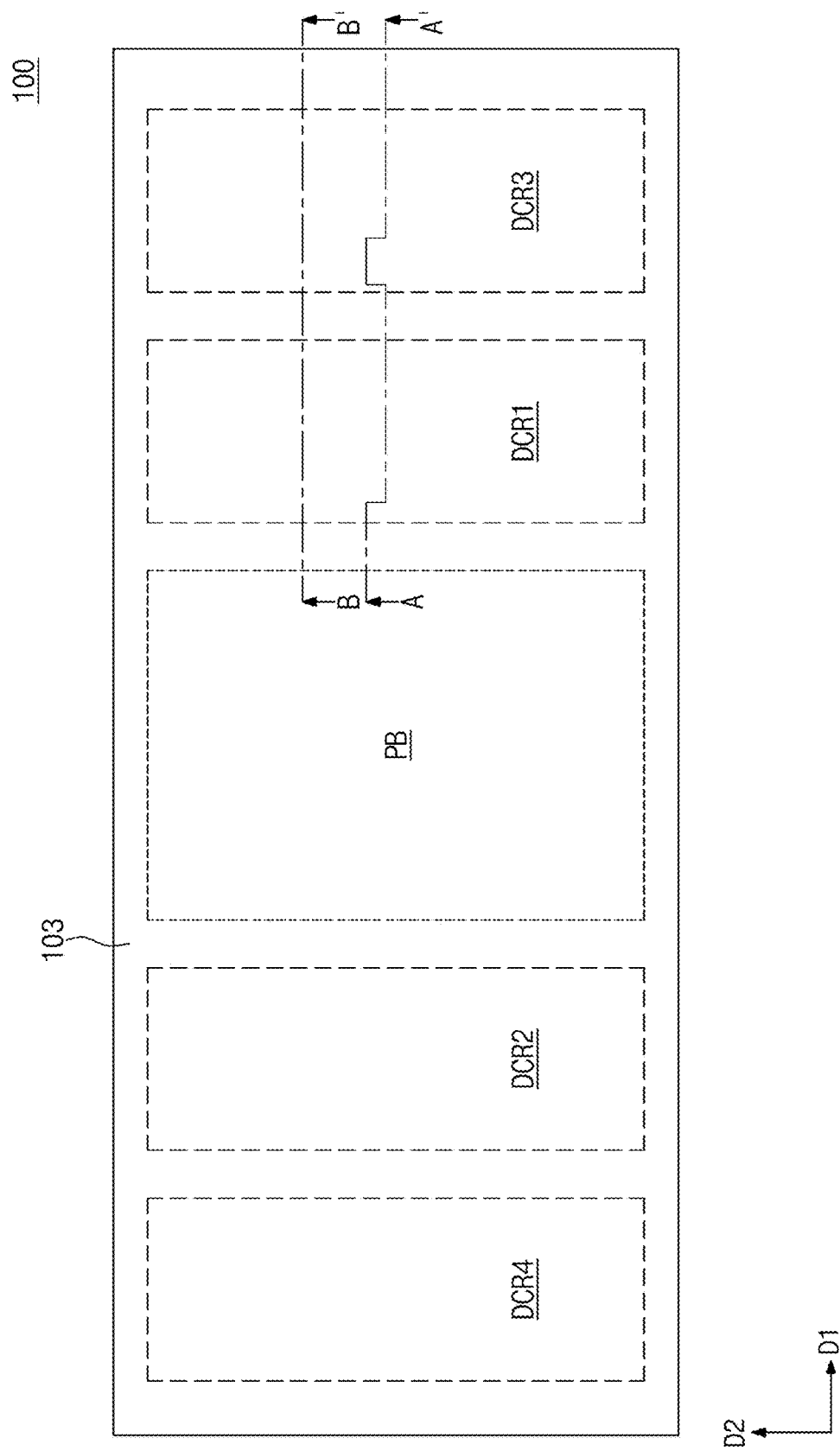

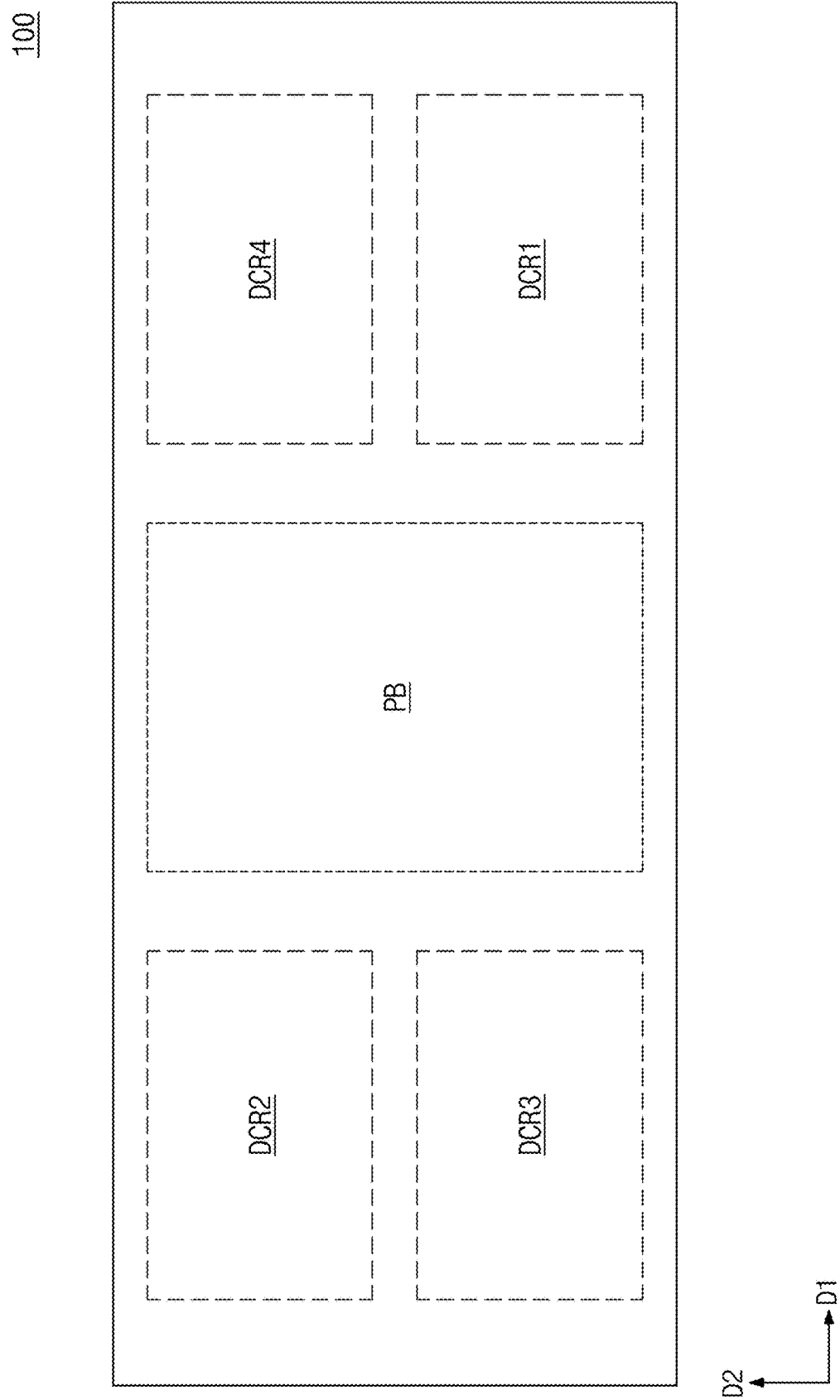

THREE-DIMENSIONAL SEMICONDUCTOR MEMORY DEVICE

CROSS-REFERENCE TO RELATED APPLICATION

This U.S. nonprovisional application claims priority under 35 U.S.C § 119 to Korean Patent Application No. 10-2020-0005350 filed on Jan. 15, 2020 in the Korean Intellectual Property Office, the disclosure of which is hereby incorporated by reference in its entirety.

BACKGROUND

The present inventive concepts relate to three-dimensional semiconductor memory devices, and more particularly, to three-dimensional semiconductor memory devices with increased reliability.

Semiconductor devices have been highly integrated to meet high performance and low manufacturing cost which are desired by customers. Because integration of the semiconductor devices is an important factor in determining product price, high integration is increasingly requested. Integration of typical two-dimensional or planar semiconductor devices is primarily determined by the area occupied by a unit memory cell, such that it is influenced by the level of technology for forming fine patterns. However, the expensive processing equipment used to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present inventive concepts provide three-dimensional semiconductor memory devices with enhanced reliability and increased integration.

An object of the present inventive concepts is not limited to the mentioned above, and other objects which have not been mentioned above will be clearly understood to those skilled in the art from the following description.

According to some example embodiments of the present inventive concepts, a three-dimensional semiconductor memory device may include a first peripheral circuit including a plurality of different decoder circuits, a first memory on the first peripheral circuit, the first memory including a first stack structure having a plurality of first electrode layers stacked on one another and a plurality of first inter-electrode dielectric layers between the first electrode layers of the plurality of first electrode layers, a first planarized dielectric layer covering an end of the first stack structure, and a first through via that penetrates the first planarized dielectric layer and the end of the first stack structure, the first through via being insulated from the plurality of first electrode layers and electrically connected to one of the plurality of different decoder circuits, and a second memory on the first memory, the second memory including a second stack structure having a plurality of second electrode layers stacked on one another and a plurality of second inter-electrode dielectric layers between the second electrode layers of the plurality of second electrode layers, a second planarized dielectric layer covering an end of the second stack structure, and a first cell contact plug that penetrates the second planarized dielectric layer, the first cell contact plug electrically connecting one of the plurality of second electrode layers to the first through via.

According to some example embodiments of the present inventive concepts, a three-dimensional semiconductor memory device may include a peripheral circuit including a plurality of different decoder circuits, a first memory on the peripheral circuit, the first memory including a first stack structure and a second stack structure spaced apart from each other in a first direction parallel to a top surface of the peripheral circuit, the first stack structure including a plurality of first electrode layers stacked on one another, the plurality of first electrode layers being electrically connected to a first decoder circuit among the plurality of different decoder circuits, and the second stack structure including a plurality of second electrode layers stacked on one another, and a second memory on the first memory, the second memory including a third stack structure and a fourth stack structure spaced apart from each other in the first direction, the third stack structure including a plurality of third electrode layers stacked on one another, the plurality of third electrode layers being electrically connected to a second decoder circuit among the plurality of different decoder circuits, and the fourth stack structure including a plurality of fourth electrode layers stacked on one another.

According to some example embodiments of the present inventive concepts, a three-dimensional semiconductor memory device may include a peripheral circuit including a first decoder circuit and a second decoder circuit, the first decoder circuit and the second decoder circuit are side by side in a first direction and different from each other, a first memory on the peripheral circuit, the first memory including a first stack structure electrically connected to the first decoder, and a second memory on the first memory, the second memory including a second stack structure electrically connected to the second decoder circuit, a portion of the second stack structure protruding beyond the first stack structure.

According to some example embodiments of the present inventive concepts, a three-dimensional semiconductor memory device may include a first peripheral circuit including a plurality of different decoder circuits, the plurality of different decoder circuits including a first decoder circuit, a second decoder circuit, a third decoder circuit and a fourth decoder circuit, a first memory on the first peripheral circuit, the first memory including a first stack structure and a second stack structure that are spaced apart from each other, and a second memory on the first memory, the second memory including a third stack structure and a fourth stack structure that are spaced apart from each other, the first stack structure and the third stack structure overlapping at least one of the first decoder circuit or the third decoder circuit, and the second stack structure and the fourth stack structure overlapping at least one of the second decoder circuit or the fourth decoder circuit.

According to some example embodiments of the present inventive concepts, a three-dimensional semiconductor memory device may include a peripheral circuit including a first decoder circuit and a second decoder circuit different from the first decoder circuit, a first memory on the peripheral circuit, the first memory including a first stack structure having a plurality of first electrode layers stacked on one another and a plurality of first inter-electrode dielectric layers between first electrode layers of the plurality of first electrode layers, the plurality of first electrode layers being connected to the first decoder circuit, a plurality of first vertical patterns penetrating the first stack structure, a first gate dielectric layer between the plurality of first vertical patterns and the first stack structure, and a first planarized dielectric layer that covers an end of the first stack structure; and a second memory on the first memory, the second memory including a second stack structure having a plurality of second electrode layers stacked on one another and a plurality of second inter-electrode dielectric layers between second electrode layers of the plurality of second electrode layers, the plurality of second electrode layers being electrically connected to the second decoder circuit, a plurality of second vertical patterns penetrating the second stack structure, a second gate dielectric layer between the plurality of second vertical patterns and the second stack structure, and a second planarized dielectric layer that covers an end of the second stack structure.

BRIEF DESCRIPTION OF THE DRAWINGS

FIG. 6A illustrates a plan view showing a logic chip of FIG. 1A.

FIG. 22B illustrates a plan view showing a logic chip included in the three-dimensional semiconductor memory device of FIG. 22A.

DETAILED DESCRIPTION OF EMBODIMENTS

Some example embodiments of the present inventive concepts will now be described in detail with reference to the accompanying drawings to aid in clearly explaining the present inventive concepts.

Figure 1A:
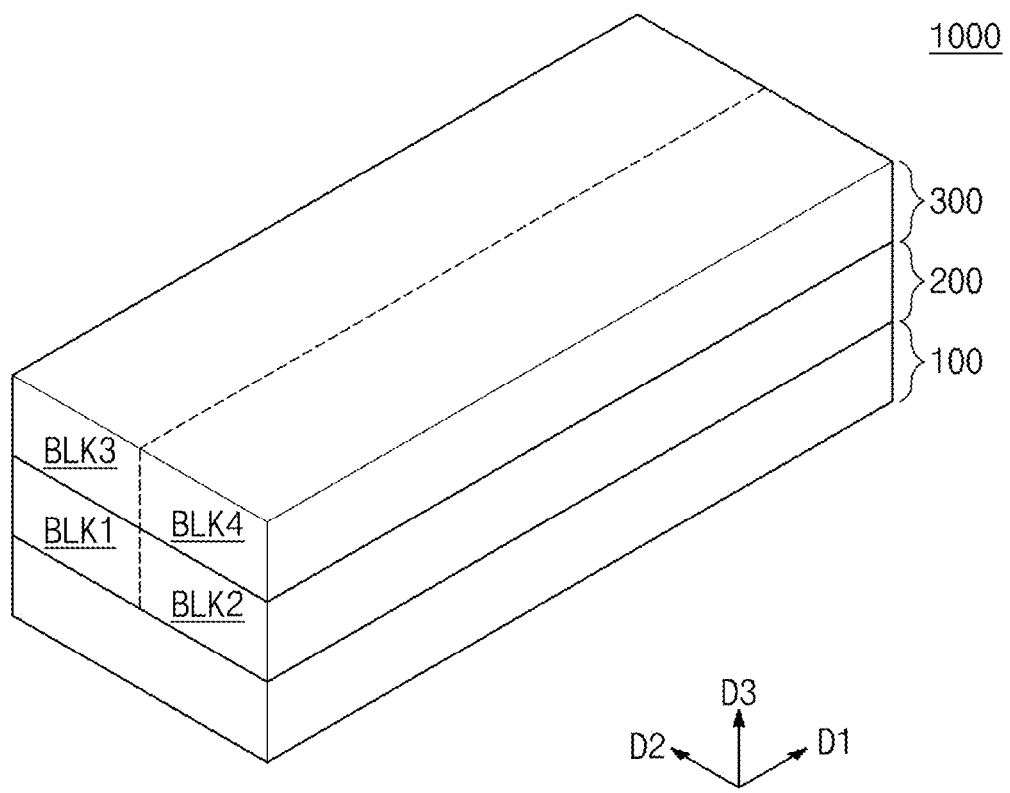
FIG. 1A illustrates a block diagram showing a three-dimensional semiconductor memory device according to some example embodiments of the present inventive concepts.

FIG. 1A illustrates a block diagram showing a three-dimensional semiconductor memory device according to some example embodiments of the present inventive concepts.

Referring to FIG. 1A, a three-dimensional semiconductor memory device 1000 according to some example embodiments of the present inventive concepts may include a plurality of memory chips 200 and 300 that are sequentially stacked on a logic chip 100. The memory chips 200 and 300 may include, for example, a first memory chip 200 and a second memory chip 300 (memory chips may also be referred to as memory devices, memory sections and/or memories herein).

The logic chip 100 may include decoder circuit parts, a page buffer circuit part, and/or control circuits.

The first memory chip 200 may include a plurality of, for example, first and second memory blocks BLK1 and BLK2. The second memory chip 300 may include a plurality of, for example, third and fourth memory blocks BLK3 and BLK4. Each of the memory blocks BLK1 to BLK4 may include a memory cell array having a three-dimensional structure (or vertical structure). Although FIG. 1A simply shows four memory blocks BLK1 to BLK4, the number of memory blocks is not be limited thereto, but may be greater than four. According to the present inventive concepts, driver circuits (e.g., the decoder circuit part and the page buffer circuit part) for driving the memory blocks BLK1 to BLK4 included in the memory chips 200 and 300 may be separated from each other such that the three-dimensional semiconductor memory device 1000 may increase in performance and have advantages of high integration.

Figure 1B:
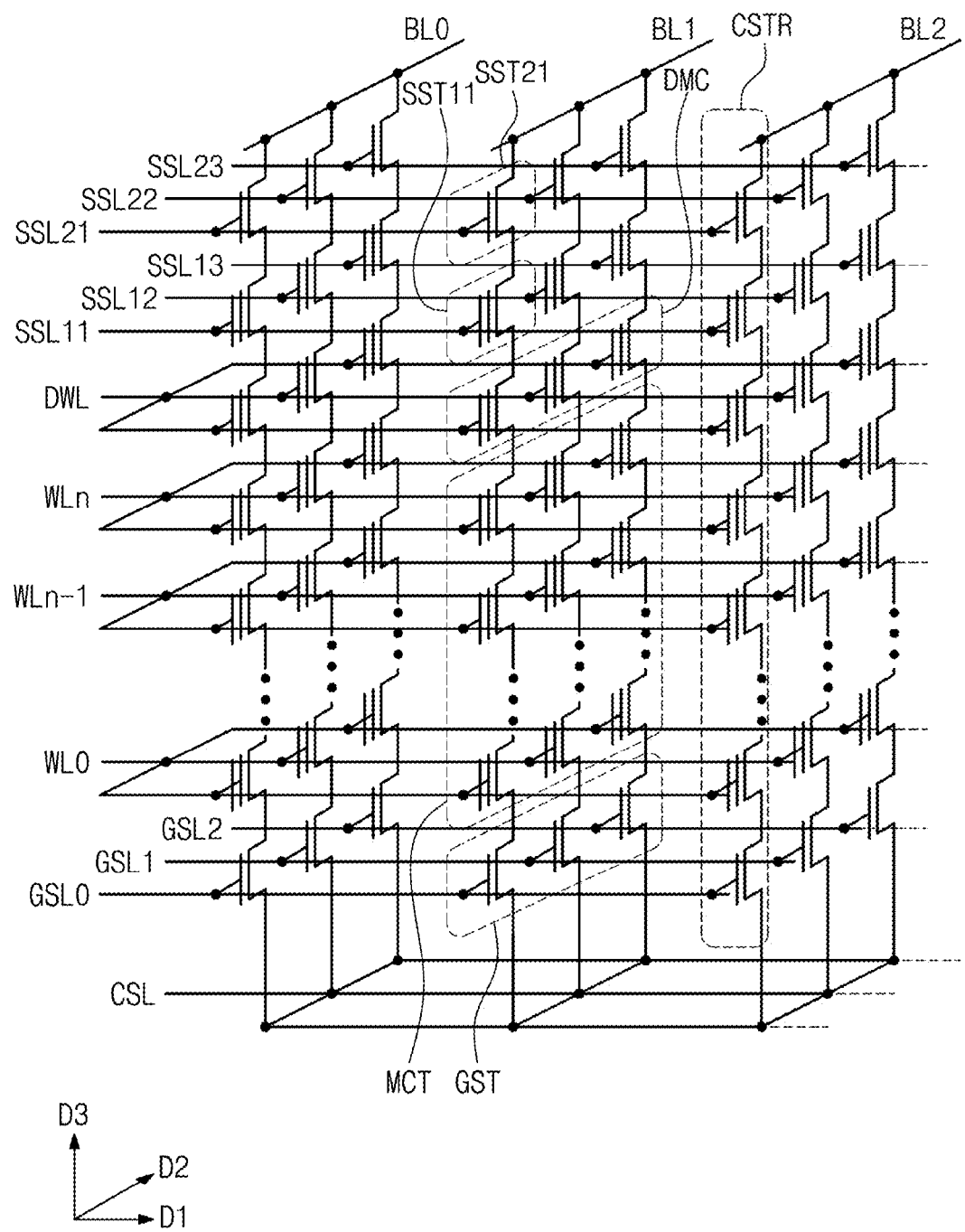
FIG. 1B illustrates a circuit diagram showing a three-dimensional semiconductor memory device according to some example embodiments of the present inventive concepts.

FIG. 1B illustrates a circuit diagram showing a three-dimensional semiconductor memory device according to some example embodiments of the present inventive concepts.

Referring to FIG. 1B, each of the memory blocks BLK1 to BLK4 may be configured such that cell strings CSTR are two-dimensionally arranged along first and second directions D1 and D2 and extend along a third direction D3. A plurality of cell strings CSTR may be connected in parallel to each of bit lines BL0 to BL2. A plurality of cell strings CSTR may be connected in common to a common source line CSL.

The bit lines BL0 to BL2 may be two-dimensionally arranged, and a plurality of cell strings CSTR may be connected in parallel to each of the bit lines BL0 to BL2. A plurality of cell strings CSTR may be connected in common to the common source line CSL. For example, a plurality of cell strings CSTR may be disposed between one common source line CSL and a plurality of bit lines BL0 to BL2. The common source line CSL may be provided in plural arranged two-dimensionally. The common source lines CSL may be supplied with the same voltage or a similar voltage, or may be electrically controlled independently of each other.

In some example embodiments, each of the cell strings CSTR may include string selection transistors SST21 and SST11 connected in series, memory cell transistors MCT connected in series, and a ground selection transistor GST. Each of the memory cell transistors MCT may include a data storage element. One of the cell strings CSTR may further include dummy cells DMC between the string selection transistor SST11 and the memory cell transistor MCT and between the ground selection transistor GST and the memory cell transistor MCT. Other cell strings CSTR may have an identical or similar structure to that discussed above.

The string selection transistor SST21 may be coupled to a first bit line BL1, and the ground selection transistor GST may be coupled to the common source line CSL. The memory cell transistors MCT connected to one cell string CSTR may be connected in series between, for example, the string selection transistor SST11 and the ground selection transistor GST.

Alternatively, in each of the cell strings CSTR, the ground selection transistor GST may include a plurality of MOS transistors connected in series similar to the string selection transistors SST21 and SST11. Dissimilarly, each of the cell strings CSTR may include one string selection transistor.

In some example embodiments, the string selection transistor SST11 may be controlled by a string selection line SSL11, and the string selection transistor SST21 may be controlled by a string selection line SSL21. The memory cell transistors MCT may be controlled by a plurality of word lines WL0 to WLn, and the dummy cells DMC may be controlled by a dummy word line DWL. The ground selection transistor GST may be controlled by a ground selection line GSL. The common source line CSL may be connected in common to sources of the ground selection transistors GST. Ground selection lines GSL0 to GSL2 may be collectively connected to each other to perform simultaneously or contemporaneously with each other or may be divided separately from each other to perform independently of each other.

One cell string CSTR may include a plurality of memory cell transistors MCT located at different distances from the common source line CSL. A plurality of word lines WL0 to WLn and DWL may be disposed between the common source lines CSL and the bit lines BL0 to BL2.

The memory cell transistors MCT may include gate electrodes located at the same or substantially the same distance from the common source line CSL, and the gate electrodes may be connected in common to one of the word lines WL0 to WLn and DWL and thus may have the same potential state or similar potential states. Alternatively, although the gate electrodes of the memory cell transistors MCT are disposed at the same or substantially the same distance from the common source line CSL, the gate electrodes disposed at different rows or columns may be controlled independently of each other.

The following will describe operations of the three-dimensional semiconductor memory device of FIG. 1B.

For example, in a write operation, when one of the memory blocks BLK1 to BLK4 is selected by an address, the decoder circuit (also referred to herein as the decoder circuit part) may apply a program voltage to a selected word line of the selected memory block, and may apply pass voltages to non-selected word lines of the selected memory block. The decoder circuit part may apply turn-off voltages to the ground selection lines GSL0 to GSL2 of the selected memory block, and may apply turn-on voltages to the dummy word line DWL and the string selection lines SSL11 to SSL13 and SSL21 to SSL23.

In a read operation, when one of the memory blocks BLK1 to BLK4 is selected by an address, the decoder circuit part may apply a selected read voltage to a selected word line of the selected memory block, and may apply non-selected read voltages to non-selected word lines of the selected memory block. The decoder circuit part may apply turn-on voltages to the string selection lines SSL11 to SSL13 and SSL21 to SSL23, the dummy word line DWL, and the ground selection lines GSL0 to GSL2 of the selected memory block.

In an erase operation, when one of the memory blocks BLK1 to BLK4 is selected by an address, the decoder circuit part may apply erase voltages (e.g., ground voltages or lower voltages similar to the ground voltages) to word lines of the selected memory block. The decoder circuit part may electrically float the string selection lines SSL11 to SSL13 and SSL21 to SSL23, the dummy word line DWL, and the ground selection lines GSL0 to GSL2 of the selected memory block.

The page buffer circuit (also referred to herein as the page buffer circuit part) may be connected to the memory cell array through a plurality of bit lines BL0 to BL2. The page buffer circuit part may be connected to a data input/output circuit. The page buffer circuit part may operate under control of the logic circuit.

In a write operation, the page buffer circuit part may store data to be written to memory cells. Based on the stored data, the page buffer circuit part may apply voltages to a plurality of bit lines BL0 to BL2. In a verification read operation for the read, write, or erase operation, the page buffer circuit part may detect voltages of the bit lines BL0 to BL2 and may store verification results.

Figure 2A:
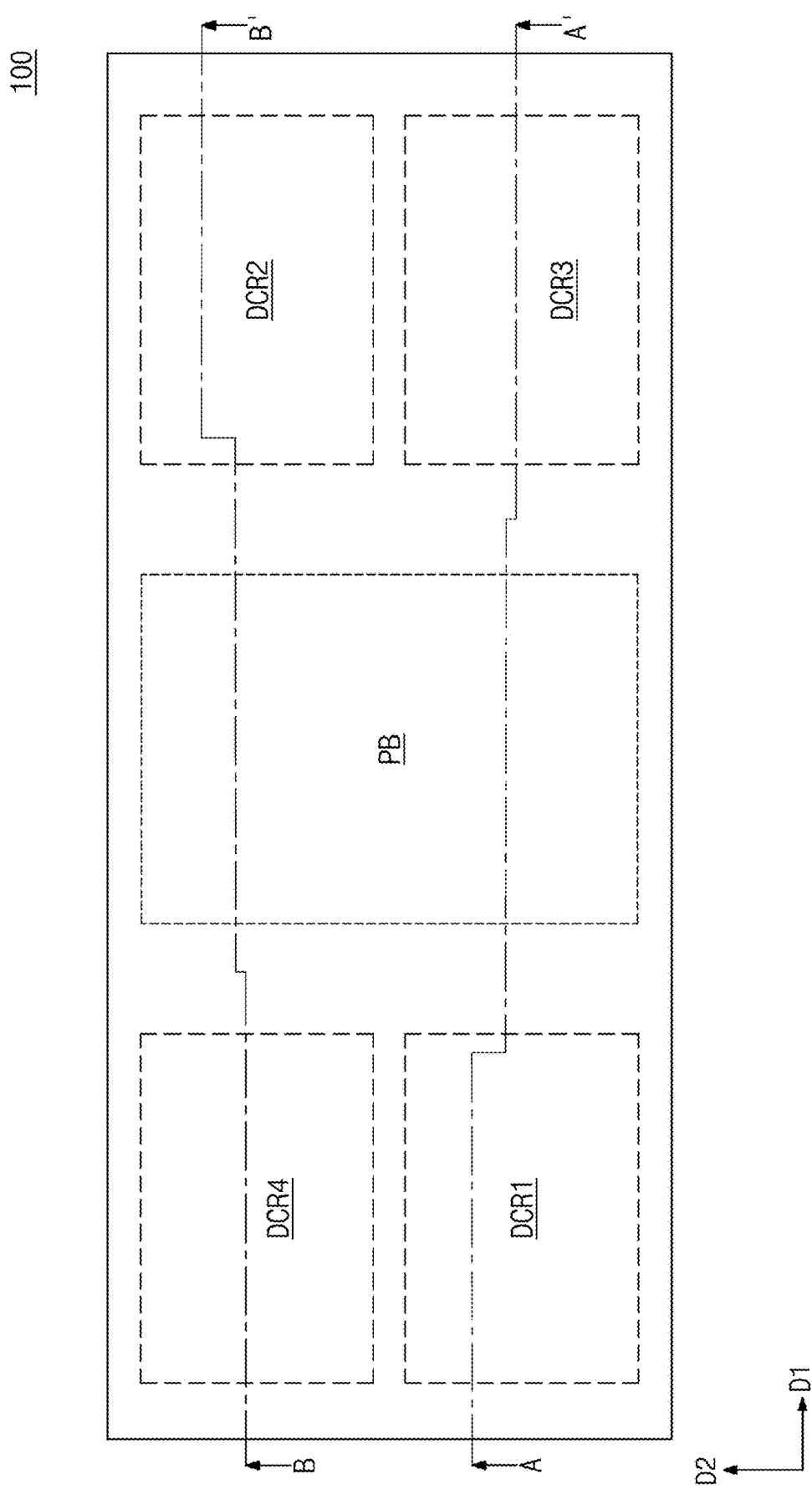
FIG. 2A illustrates a plan view showing a logic chip of FIG. 1A.
Figure 2B:
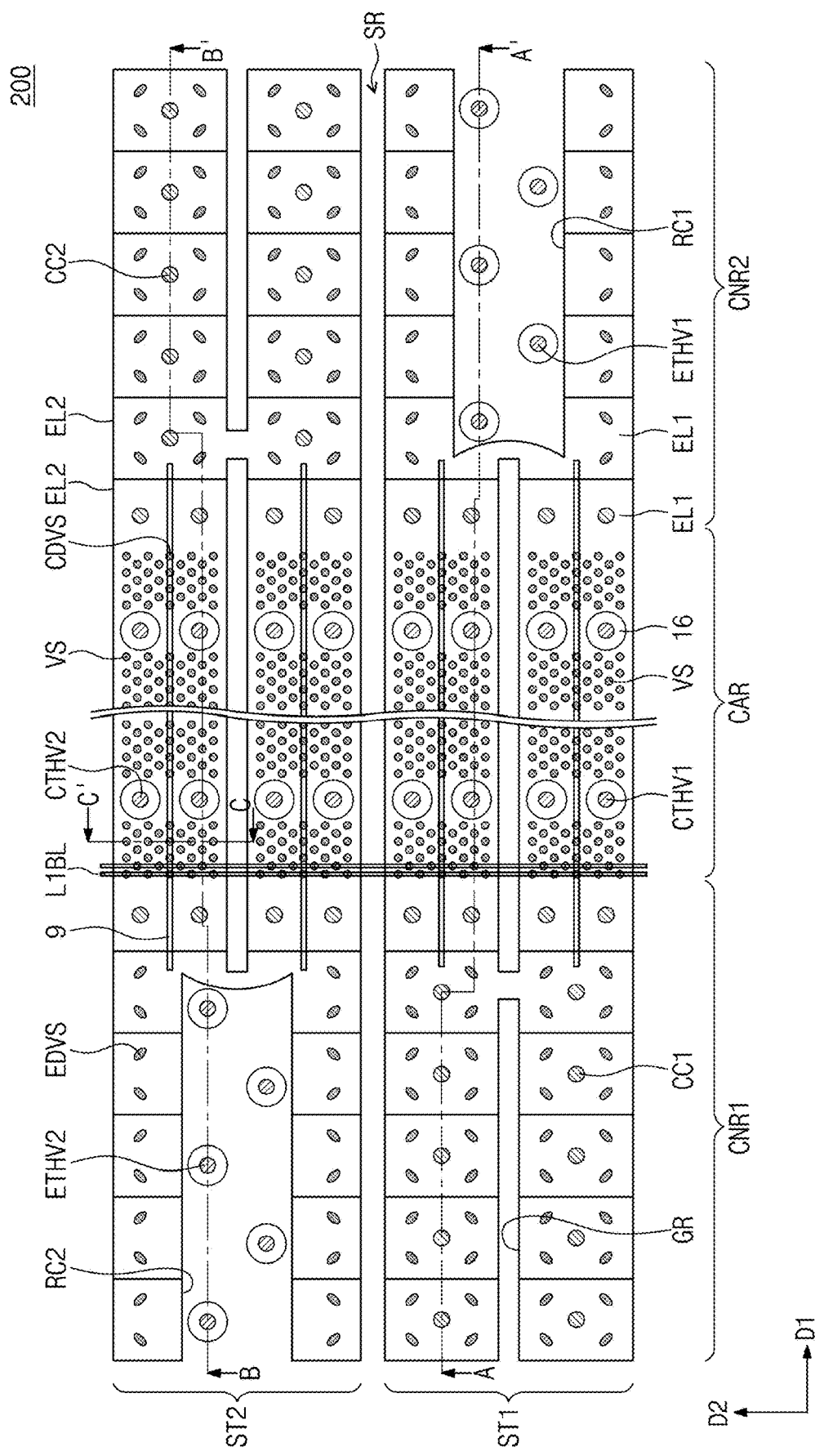
FIG. 2B illustrates a plan view showing a first memory chip of FIG. 1A.
Figure 2C:
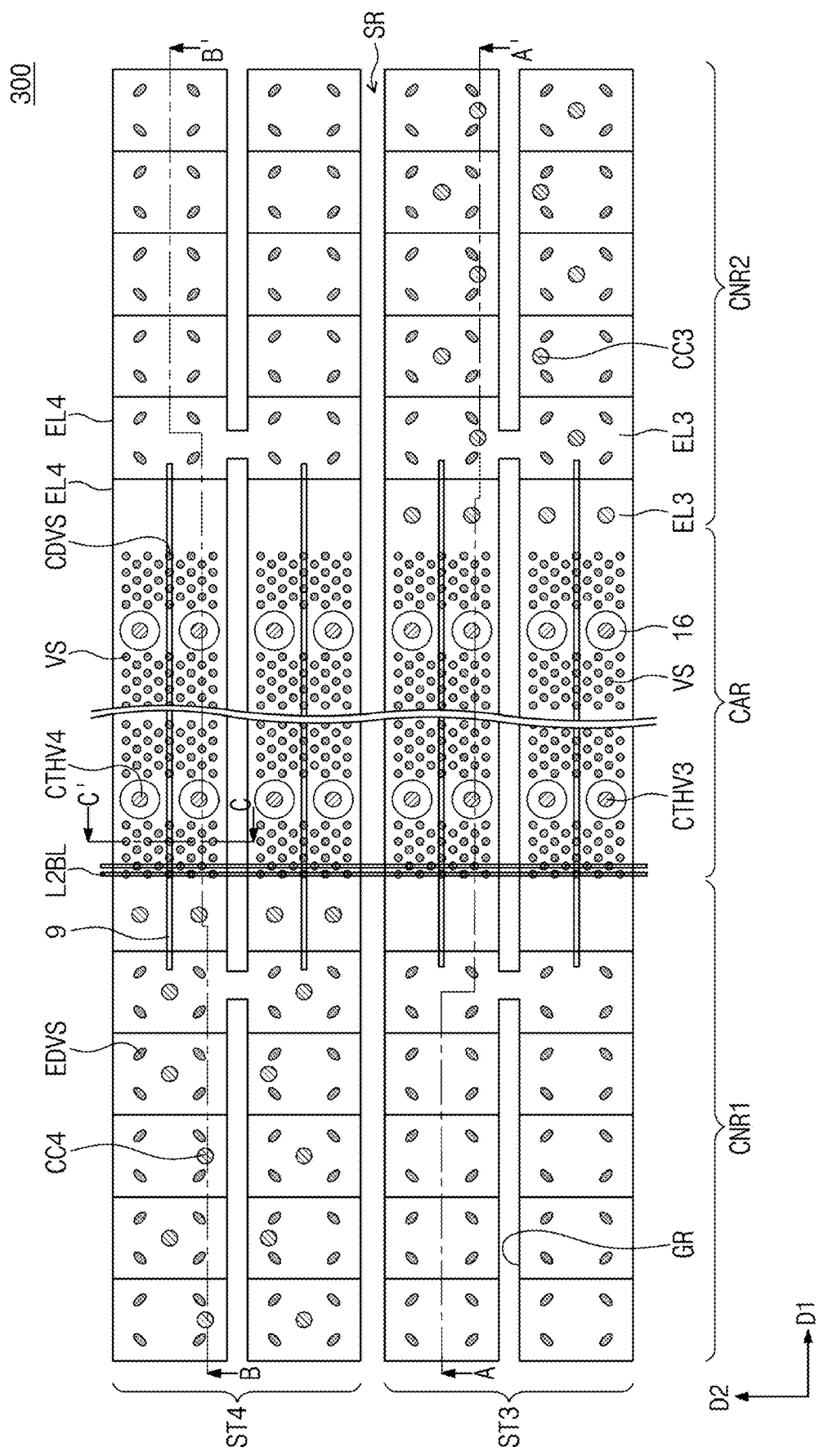
FIG. 2C illustrates a plan view showing a second memory chip of FIG. 1A.
Figure 3A:
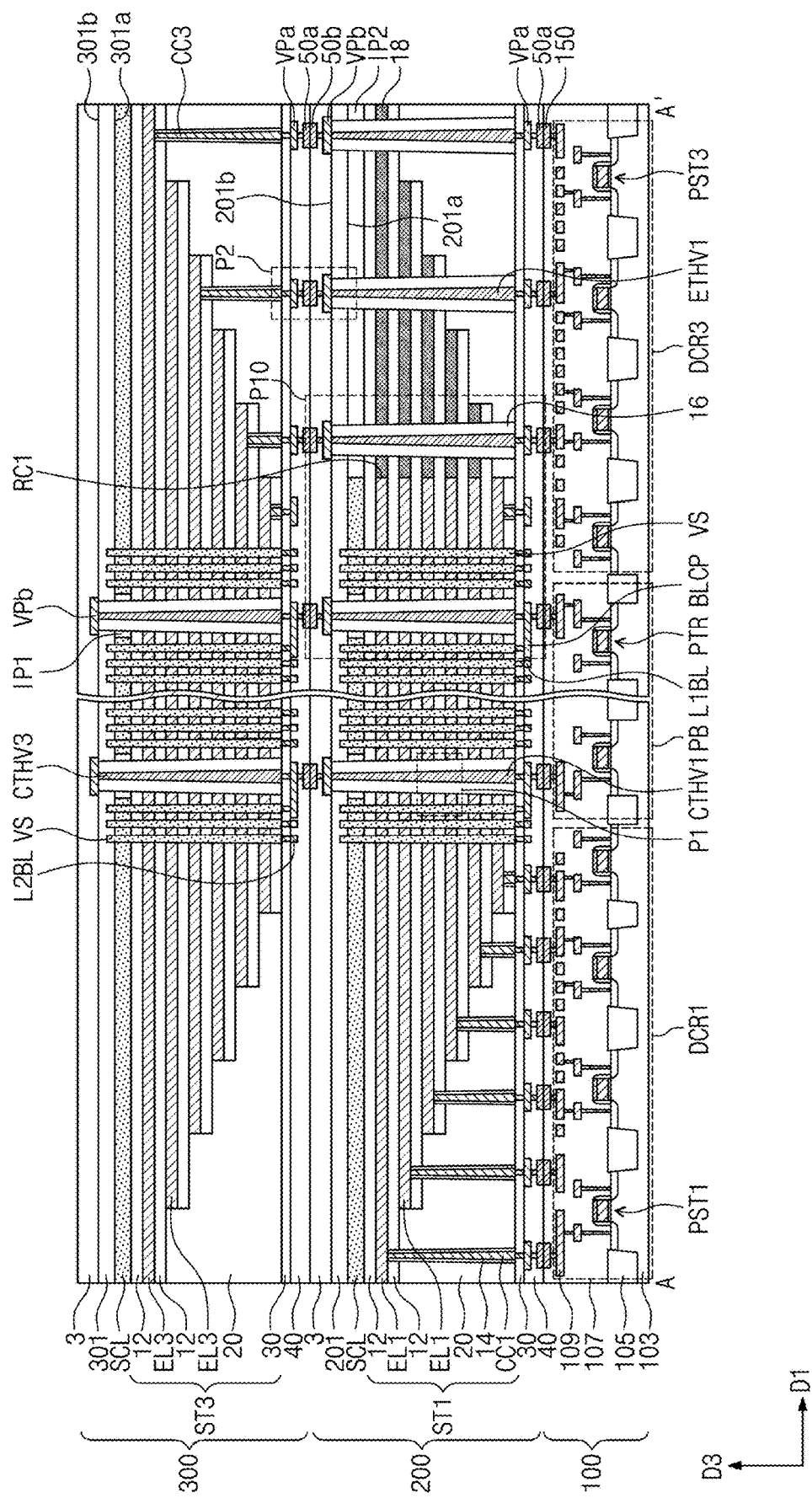
FIG. 3A illustrates a cross-sectional view taken along line A-A' of FIG. 2A or 2B.
Figure 3B:
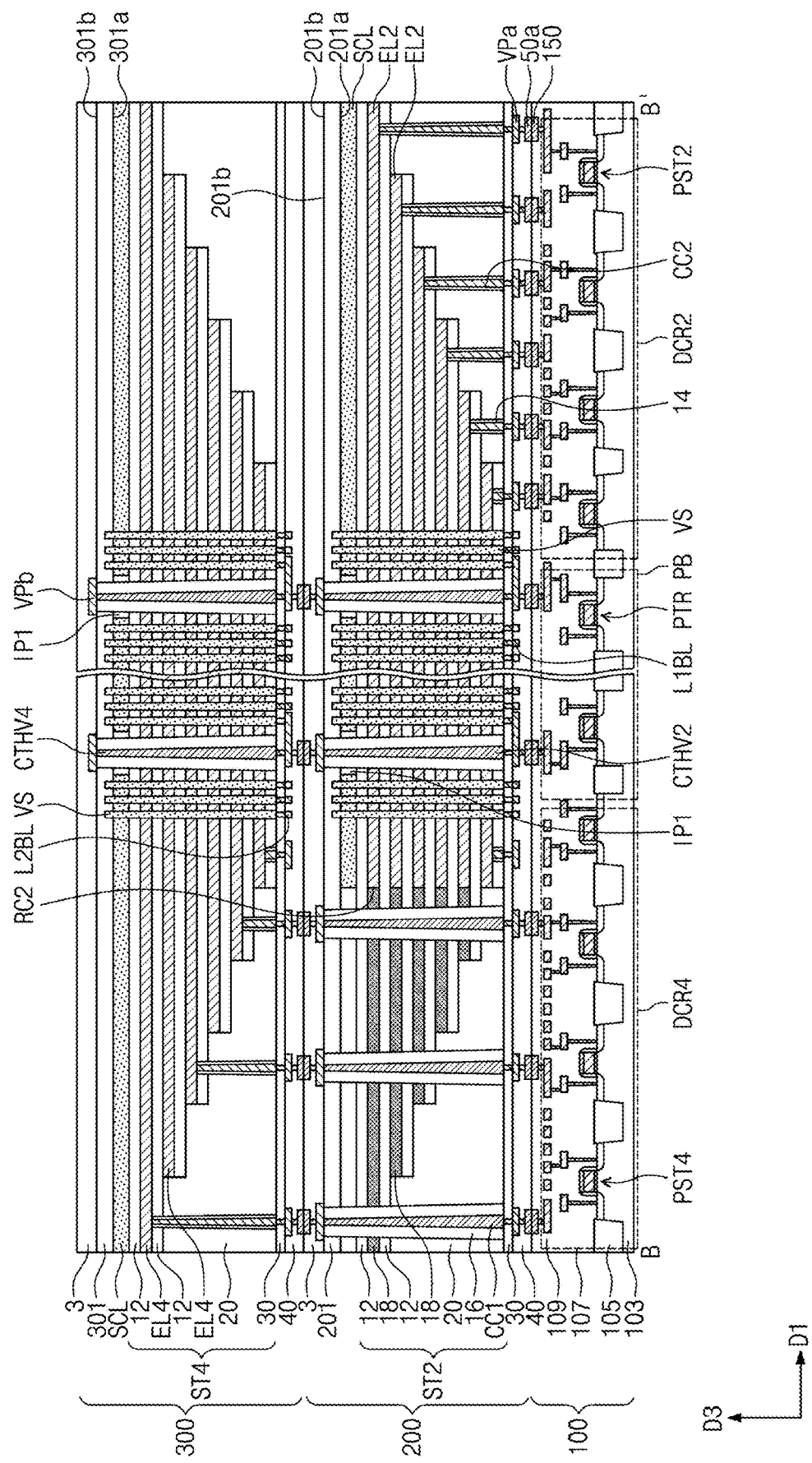
FIG. 3B illustrates a cross-sectional view taken along line B-B' of FIG. 2B or 2C.
Figure 3C:
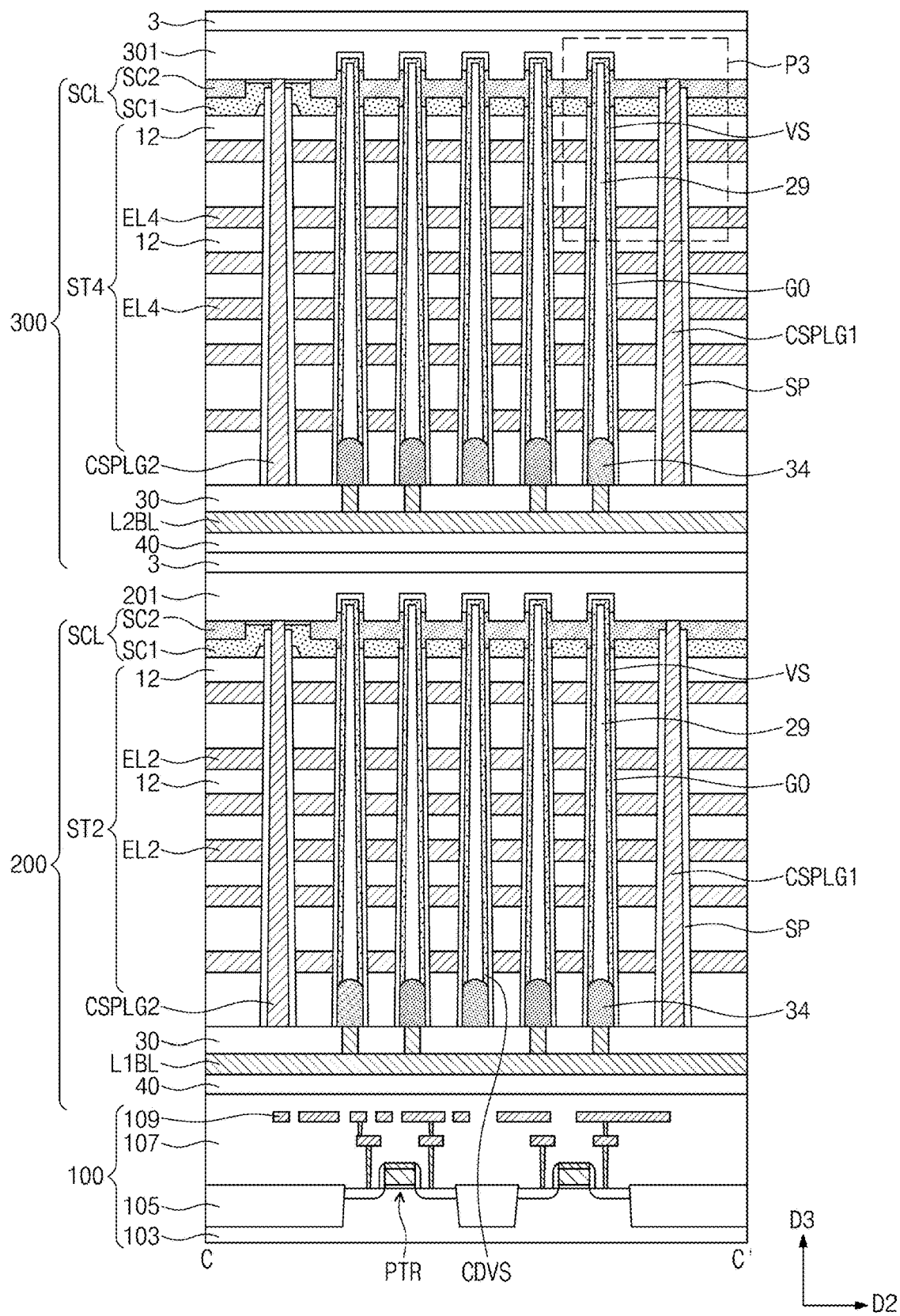
FIG. 3C illustrates a cross-sectional view taken along line C-C' of FIG. 2B or 2C.
Figure 4A:
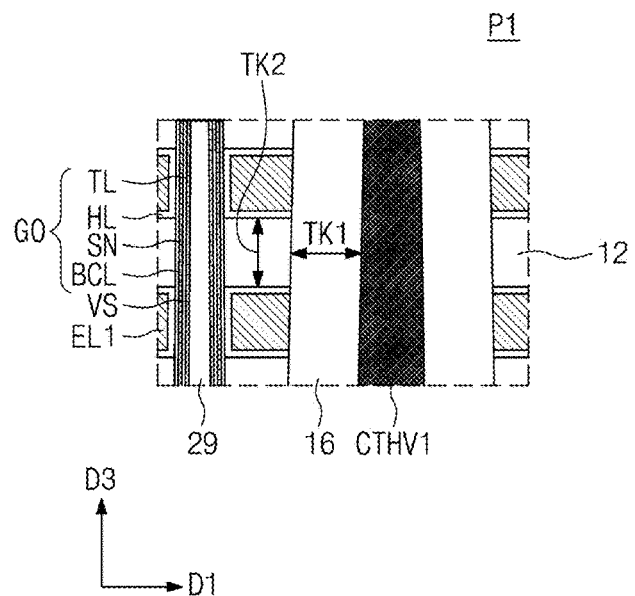
FIG. 4A illustrates an enlarged view showing section P1 of FIG. 3A.
Figure 4B:
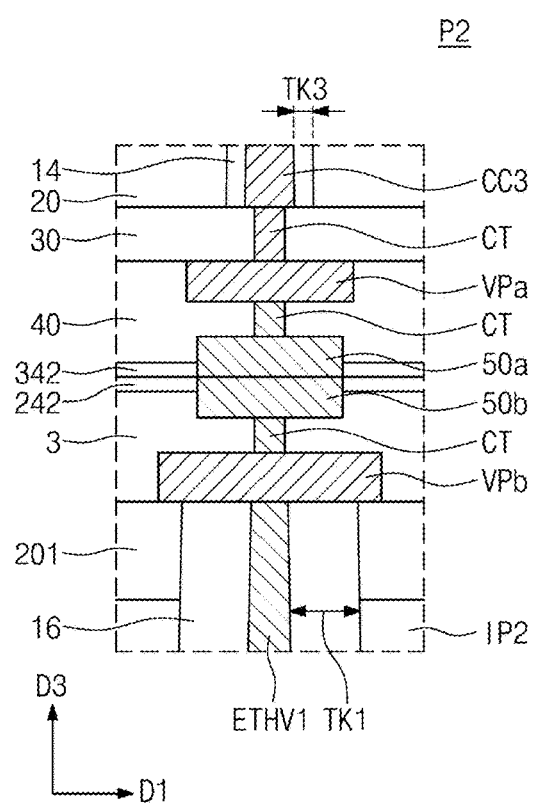
FIG. 4B illustrates an enlarged view showing section P2 of FIG. 3A.
Figure 4C:
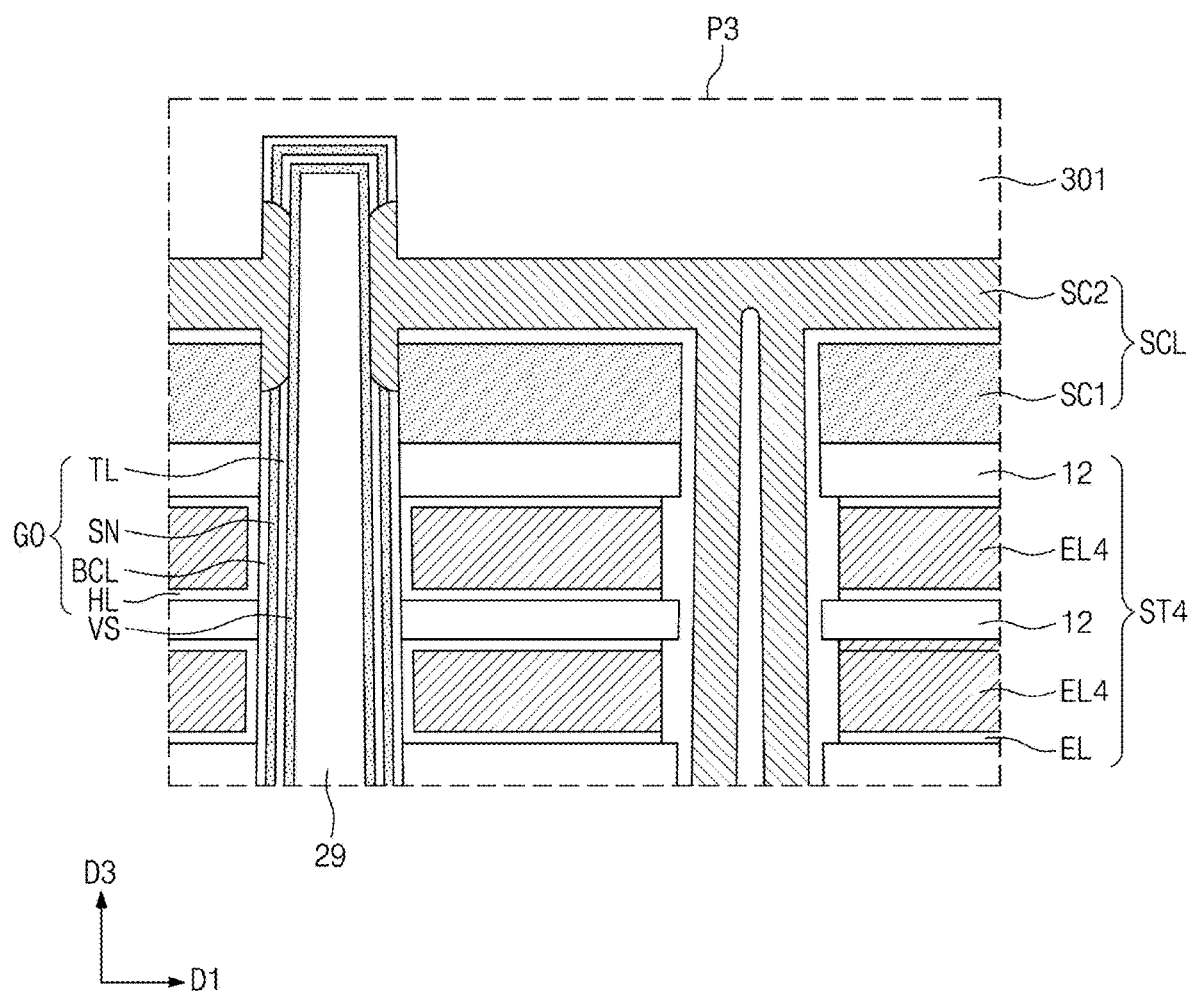
FIG. 4C illustrates an enlarged view showing section P3 of FIG. 3C.
Figure 4D:
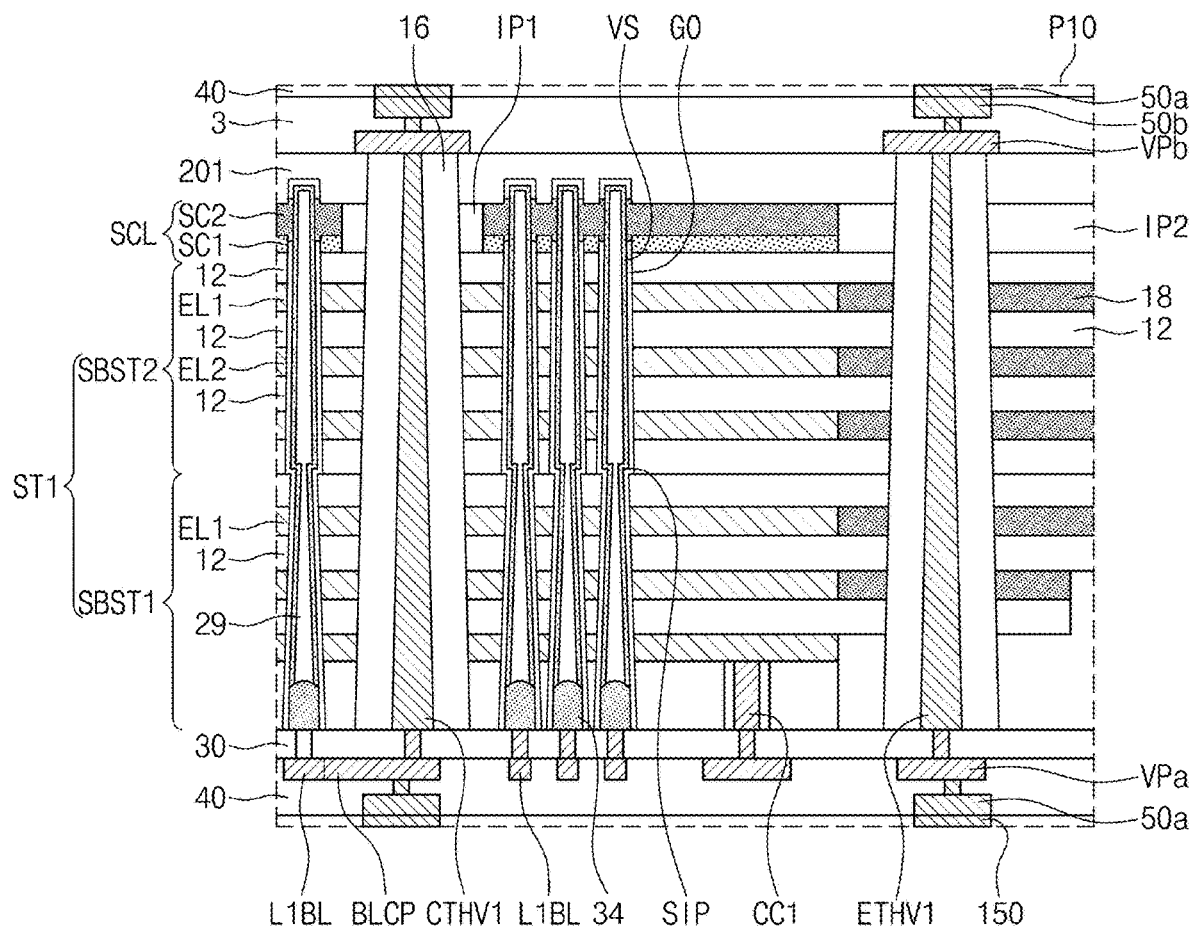
FIG. 4D illustrates an enlarged view showing section P10 of FIG. 3A.
Figure 5:
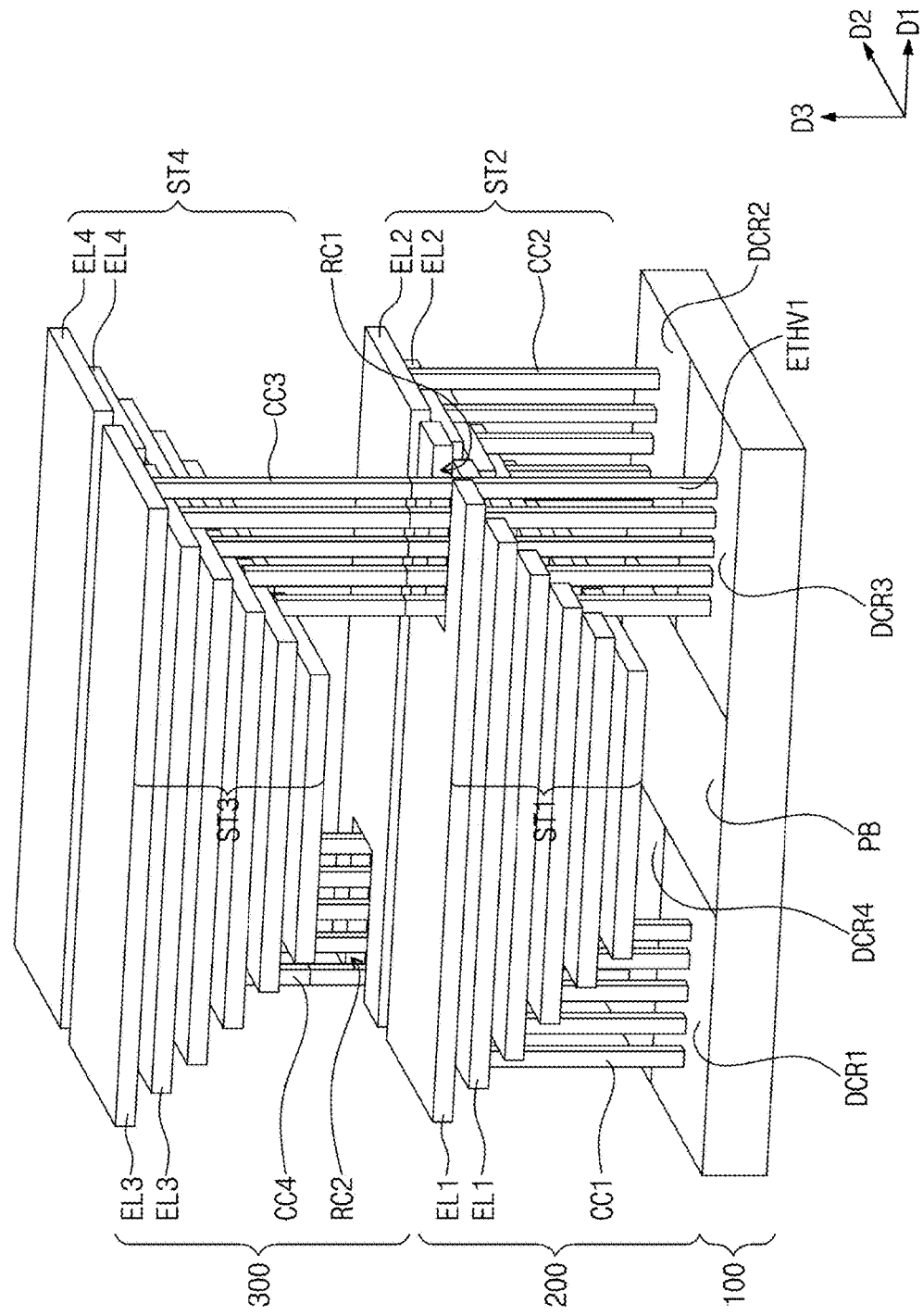
FIG. 5 illustrates a detailed perspective view of FIG. 1A.

FIG. 2A illustrates a plan view showing the logic chip of FIG. 1A. FIG. 2B illustrates a plan view showing the first memory chip of FIG. 1A. FIG. 2C illustrates a plan view showing the second memory chip of FIG. 1A. FIG. 3A illustrates a cross-sectional view taken along line A-A' of FIG. 2A or 2B. FIG. 3B illustrates a cross-sectional view taken along line B-B' of FIG. 2B or 2C. FIG. 3C illustrates a cross-sectional view taken along line C-C' of FIG. 2B or 2C. FIG. 4A illustrates an enlarged view showing section P1 of FIG. 3A. FIG. 4B illustrates an enlarged view showing section P2 of FIG. 3A. FIG. 4C illustrates an enlarged view showing section P3 of FIG. 3C. FIG. 5 illustrates a detailed perspective view of FIG. 1A. FIG. 4D illustrates an enlarged view showing section P10 of FIG. 3A.

Referring to FIGS. 2A, 3A, and 3B, the logic chip 100 may include a logic substrate 103. The logic substrate 103 may be, for example, a single-crystalline silicon substrate or a silicon-on-insulator (SOI) substrate. The logic substrate 103 may be provided therein with a device isolation layer 105 that defines active regions. The device isolation layer 105 may include one or more of a silicon oxide layer, a silicon nitride layer, and a silicon oxynitride layer. A plurality of logic transistors PST1 to PST4 and PTR may be disposed on the active regions. Each of the logic transistors PST1 to PST4 and PTR may be one or more of planar-type MOSFET, FinFET, MBCFET, and VFET. The logic transistors PST1 to PST4 and PTR may be covered with a logic interlayer dielectric layer 107. The logic interlayer dielectric layer 107 may include one or more of a silicon oxide layer, a silicon nitride layer, a silicon oxynitride layer, a porous dielectric layer, and a low-k dielectric layer. The logic interlayer dielectric layer 107 may have therein multi-layered logic lines 109. The logic transistors PST1 to PST4 and PTR and the logic lines 109 may constitute first to fourth decoder circuit parts DCR1 to DCR4 and a page buffer circuit part PB. The logic transistors PST1 to PST4 and PTR may include first to fourth pass transistors PST1 to PST4 and bit-line selection transistors PTR. The first to fourth pass transistors PST1 to PST4 may be included in the first to fourth decoder circuit parts DCR1 to DCR4, respectively. The bit-line selection transistors PTR may be included in the page buffer circuit part PB. Logic connection terminals 150 may be disposed on a top end of the logic interlayer dielectric layer 107. The logic connection terminals 150 may be electrically connected to the logic lines 109. The page buffer circuit part PB may be disposed on a central portion of the logic chip 100. The first and fourth decoder circuit parts DCR1 and DCR4 may be adjacent to one side of the page buffer circuit part PB. The second and third decoder circuit parts DCR2 and DCR3 may be adjacent to another side of the page buffer circuit part PB.

Referring to FIGS. 2B, 3A, and 3B, the first memory chip 200 may include a first memory substrate 201. The first memory chip 200 may include a first connection region CNR1 and a second connection region CNR2 that are spaced apart from each other in the first direction D1, and may also include a cell array region CAR positioned between the first and second connection regions CNR1 and CNR2. The cell array region CAR may overlap the page buffer circuit part PB of the logic chip 100. The first connection region CNR1 may overlap the first and fourth decoder circuit parts DCR1 and DCR4. The second connection region CNR2 may overlap the second and third decoder circuit parts DCR2 and DCR3.

The first memory substrate 201 may be, for example, a single-crystalline silicon substrate or a silicon-on-insulator (SOI) substrate. The first memory substrate 201 may be a semiconductor layer or a dielectric layer. The first memory substrate 201 may have a first surface 201a and a second surface 201b opposite to each other. The first surface 201a of the first memory substrate 201 may face the logic chip 100. A source layer SCL may be disposed on the first surface 201a of the first memory substrate 201.

The source layer SCL may be provided thereon with a first stack structure ST1 and a second stack structure ST2 that are spaced apart from each other in the second direction D2. The first stack structure ST1 may correspond to a portion of the first memory block BLK1 shown in FIG. 1A. The second stack structure ST2 may correspond to a portion of the second memory block BLK2 shown in FIG. 1A. As shown In FIG. 2B, the second stack structure ST2 may have a shape the same as or similar to that obtained when the first stack structure ST1 rotates about 180 degrees.

The first stack structure ST1 may include stacked first electrode layers EL1 and inter-electrode dielectric layers 12 between the first electrode layers EL1. The first electrode layers EL1 may contain metal, such as tungsten. The inter-electrode dielectric layers 12 may include, for example, a silicon oxide layer. Among the first electrode layers EL1, one closest to the logic chip 100 may be divided into a plurality of conductive lines by a separation dielectric pattern 9 and a groove region GR. The conductive lines may correspond to one of the string selection lines SSL11 to SSL13 and SSL21 to SSL23, which are shown in FIG. 1B, of the first memory block BLK1. Among the first electrode layers EL1, one closest to the source layer SCL may be divided into a plurality of conductive lines by another separation dielectric pattern (not shown), and the conductive lines may correspond to one of the ground selection lines GSL0 to GSL2, which are illustrated in FIG. 1B, of the first memory block BLK1. The first electrode layers EL1 other than the ones mentioned above may correspond to the word lines WL0 to WLn of FIG. 1B.

The first stack structure ST1 may have stepwise ends on the first and second connection regions CNR1 and CNR2. The ends of the first stack structure ST1 may each be covered with a planarized dielectric layer 20. The first stack structure ST1 may include the groove region GR elongated in the first direction D1 on each of the cell array region CAR and the first connection region CNR1. The first electrode layers EL1 of the first stack structure ST1 may include corresponding first recesses RC1 on the second connection region CNR2 (e.g., at the end of the first stack structure ST1). The first recesses RC1 may have their inner walls aligned with each other.

The second stack structure ST2 may include stacked second electrode layers EL2 and inter-electrode dielectric layers 12 between the second electrode layers EL2. The second electrode layers EL2 may contain metal, such as tungsten. Among the second electrode layers EL2, one closest to the logic chip 100 may be divided into a plurality of conductive lines by a separation dielectric pattern 9 and a groove region GR. The conductive lines may correspond to one of the string selection lines SSL11 to SSL13 and SSL21 to SSL23, which are shown in FIG. 1B, of the second memory block BLK2. Among the second electrode layers EL2, one closest to the source layer SCL may be divided into a plurality of conductive lines by another separation dielectric pattern (not shown), and the conductive lines may correspond to one of the ground selection lines GSL0 to GSL2, which are illustrated in FIG. 1B, of the second memory block BLK2. The second electrode layers EL2 other than the ones mentioned above may correspond to the word lines WL0 to WLn of FIG. 1B.

The second stack structure ST2 may have stepwise ends on the first connection region CNR1 and the second connection region CNR2. The ends of the second stack structure ST2 may each be covered with a planarized dielectric layer 20. According to some example embodiments, the planarized dielectric layer 20 that covers the ends of the first stack structure ST1 may extend to cover the ends of the second stack structure ST2. The second stack structure ST2 may include the groove region GR elongated in the first direction D1 on each of the cell array region CAR and the second connection region CNR2. The second electrode layers EL2 of the second stack structure ST2 may include corresponding second recesses RC2 on the first connection region CNR1 (e.g., at the end of the second stack structure ST2). The second recesses RC2 may have their inner walls aligned with each other.

The first and second recesses RC1 and RC2 may be filled with residual sacrificial patterns 18. The residual sacrificial patterns 18 may be formed of a material, such as a silicon nitride layer, having an etch selectivity with respect to the inter-electrode dielectric layers 12.

On the cell array region CAR, a plurality of cell vertical patterns VS may penetrate each of the first and second stack structures ST1 and ST2. The cell vertical patterns VS may have their ends that are connected through first-layered bit lines L1BL. The first-layered bit lines L1BL may extend in the second direction D2 and may be parallel to each other. A single first-layered bit line L1BL may simultaneously or contemporaneously connect the ends of the cell vertical patterns VS that penetrate the first and second stack structures ST1 and ST2 and are arranged linearly along the second direction D2. Although FIG. 2B partially illustrates the first-layered bit lines L1BL in the interest of brevity, the first-layered bit lines L1BL may be disposed all over the cell array region CAR.

On the cell array region CAR, first cell through vias CTHV1 may penetrate the first stack structure ST1 and the first memory substrate 201, and second cell through vias CTHV2 may penetrate the second stack structure ST2 and the first memory substrate 201. When viewed in plan, the first cell through vias CTHV1 and the second cell through vias CTHV2 may be positioned between the first-layered bit lines L1BL. The first and second cell through vias CTHV1 and CTHV2 may each be electrically connected to one of the first-layered bit lines L1BL through a bit-line connection line BLCP. In the first memory chip 200, the bit-line connection line BLCP may be either a laterally protruding portion of the first-layered bit line L1BL or a conductive pattern located at a height different from that of the first-layered bit line L1BL.

Referring to FIGS. 2B, 3A, and 5, on the second connection region CNR2, first edge through vias ETHV1 may penetrate the first stack structure ST1 and the first memory substrate 201. The first edge through vias ETHV1 may be disposed in the first recesses RC1. The first edge through vias ETHV1 may penetrate the planarized dielectric layer 20, the inter-electrode dielectric layers 12, and the residual sacrificial patterns 18.

On the first connection region CNR1, second edge through vias ETHV2 may penetrate the second stack structure ST2 and the first memory substrate 201. The second edge through vias ETHV2 may be disposed in the second recesses RC2. The second edge through vias ETHV2 may penetrate the planarized dielectric layer 20, the inter-electrode dielectric layers 12, and the residual sacrificial patterns 18. The first and second edge through vias ETHV1 and ETHV2 may have no electrical connection with the first and second electrode layers EL1 and EL2. When viewed in plan, the first and second edge through vias ETHV1 and ETHV2 may be arranged in a zigzag fashion along the first direction D1 or may be arranged linearly along the first direction D1.

Referring to FIGS. 2B, 3A, and 4A, the first and second cell through vias CTHV1 and CTHV2 and the first and second edge through vias ETHV1 and ETHV2 may each be surrounded by a via dielectric layer 16. The via dielectric layer 16 may include, for example, a silicon oxide layer. The via dielectric layer 16 may have a first thickness TK1 parallel to the first direction D1. One of the inter-electrode dielectric layers 12 may have a second thickness TK2 parallel to the third direction D3 perpendicular to the first direction D1. When the via dielectric layer 16 includes the same material as or a similar material to that of the inter-electrode dielectric layers 12, the first thickness TK1 may be equal to or greater than the second thickness TK2. Thus, even when voltages are applied to the first and second cell through vias CTHV1 and CTHV2 and the first and second edge through vias ETHV1 and ETHV2, signal interference may be reduced or prevented between the first electrode layers EL1 and EL2, and the first and second edge through vias ETHV1 and ETHV2 (e.g., due to the insulation provided by the dielectric layer 16 between each of the first and second cell through vias CTHV1 and CTHV2 and the first and second edge through vias ETHV1 and ETHV2, and the first electrode layers EL1 and EL2).

On the first connection region CNR1, first cell contact plugs CC1 may each penetrate the planarized dielectric layer 20 and one or more inter-electrode dielectric layers 12, thereby contacting an end of one of the first electrode layers ELL On the second connection region CNR2, second cell contact plugs CC2 may each penetrate the planarized dielectric layer 20 and one or more inter-electrode dielectric layers 12, thereby contacting an end of one of the second electrode layers EL2. The first and second cell contact plugs CC1 and CC2 may each be surrounded by a contact dielectric layer 14. The contact dielectric layer 14 may include, for example, a silicon nitride layer or a silicon oxide layer. The contact dielectric layer 14 may have a third thickness TK3 parallel to the third direction D3. The third thickness TK3 may be less than the first thickness TK1.

Referring to FIGS. 2B and 3C, a first source contact plug CSPLG1 may be disposed at a separation region SR between the first stack structure ST1 and the second stack structure ST2. A second source contact plug CSPLG2 may be disposed in the groove region GR. The first and second source contact plugs CSPLG1 and CSPLG2 may be spaced apart from each other, and may penetrate the first and second stack structures ST1 and ST2, thereby being adjacent to the first memory substrate 201. A dielectric spacer SP may be interposed between each of the first and second source contact plugs CSPLG1 and CSPLG2 and each of the first and second stack structures ST1 and ST2.

Central dummy vertical patterns CDVS may be disposed between the separation dielectric patterns 9. The central dummy vertical patterns CDVS may be disposed linearly along the first direction D1. The central dummy vertical pattern CDVS may not be electrically connected to the first-layered bit line L1BL. On the first and second connection regions CNR1 and CNR2, edge dummy vertical patterns EDVS may penetrate the planarized dielectric layer 20 and the first and second stack structures ST1 and ST2.

The cell vertical patterns VS, the central dummy vertical patterns CDVS, and the edge dummy vertical patterns EDVS may each have a hollow cup shape whose inner empty space is filled with a buried dielectric pattern 29. The buried dielectric pattern 29 may include, for example, a silicon oxide layer.

Bit-line conductive pads 34 may be correspondingly provided on the cell vertical patterns VS, the central dummy vertical patterns CDVS, and the edge dummy vertical patterns EDVS. The bit-line conductive pad 34 may be an impurity-doped region or may be formed of a conductive material.

As shown in FIG. 4A or 4C, a gate dielectric layer GO may be interposed between each of the vertical patterns VS, CDVS, and EDVS and each of the first and second stack structures ST1 and ST2. The gate dielectric layer GO may include a tunnel dielectric layer TL, a charge storage layer SN, and a blocking dielectric layer BCL. The charge storage layer SN may be a trap dielectric layer, a floating gate electrode, or a dielectric layer including conductive nano-dots. For example, the charge storage layer SN may include one or more of a silicon nitride layer, a silicon oxynitride layer, a silicon-rich nitride layer, a nano-crystalline silicon layer, and a laminated trap layer. The tunnel dielectric layer TL may include one of materials whose bandgap is greater than that of the charge storage layer SN, and the blocking dielectric layer BCL may include a high-k dielectric layer such as an aluminum oxide layer or a hafnium oxide layer. The gate dielectric layer GO may further include a high-k dielectric layer HL. The high-k dielectric layer HL may be interposed between the blocking dielectric layer BCL and each of the electrode layers EL1 and EL2. The high-k dielectric layer HL may also be interposed between the inter-electrode dielectric layer 12 and each of the electrode layers EL1 and EL2. The high-k dielectric layer HL may include a metal oxide layer, such as a hafnium oxide layer or an aluminum oxide layer, having a dielectric constant greater than that of a silicon oxide layer.

Referring to FIGS. 3C and 4C, the source layer SCL may include a first source pattern SC1 and a second source pattern SC2. The first and second source patterns SC1 and SC2 may each include, for example, a polysilicon pattern or a single-crystalline silicon pattern doped with impurities having a first conductivity type. The second source pattern SC2 may penetrate the tunnel dielectric layer TL, the charge storage layer SN, and the blocking dielectric layer BCL, thereby contacting sidewalls of the vertical patterns VS, CDVS, and EDVS.

Referring to FIGS. 3A and 4B, a first interlayer dielectric layer 3 may cover the second surface 201b of the first memory substrate 201. A second interlayer dielectric layer 30 and a third interlayer dielectric layer 40 may be sequentially stacked on a bottom surface of the planarized dielectric layer 20. On the cell array region CAR, the first-layered bit line L1BL may be disposed between the second interlayer dielectric layer 30 and the third interlayer dielectric layer 40. On the first and second connection regions CNR1 and CNR2, the first and second edge through vias ETHV1 and ETHV2 and the first and second cell contact plugs CC1 and CC2 may be electrically connected to corresponding first conductive patterns VPa. The first conductive patterns VPa may be disposed between the second interlayer dielectric layer 30 and the third interlayer dielectric layer 40.

The first and second cell through vias CTHV1 and CTHV2 and the first and second edge through vias ETHV1 and ETHV2 may be electrically connected to corresponding second conductive patterns VPb disposed on the second surface 201b of the first memory substrate 201.

The first interlayer dielectric layer 3 of the first memory chip 200 may be in contact with the third interlayer dielectric layer 40 of the second memory chip 300. Alternatively, as shown in FIG. 4B, a first passivation layer 242 may be formed on the first interlayer dielectric layer 3, and a second passivation layer 342 may be formed on a bottom surface of the third interlayer dielectric layer 40. The first and second passivation layers 242 and 342 may be formed of, for example, a silicon oxide layer. The first and second passivation layers 242 and 342 may be in contact with each other.

The first memory chip 200 may further include first connection terminals 50a disposed on a bottom end of the third interlayer dielectric layer 40 and second connection terminals 50b disposed on a top end of the first interlayer dielectric layer 3. The first and second connection terminals 50a and 50b may include metal, such as copper, aluminum, tungsten, nickel, or tin. For example, the first and second connection terminals 50a and 50b may be formed of copper. According to some example embodiments, the first and second connection terminals 50a and 50b may also be referred to as the first and second conductive patterns 50a and 50b. As shown in FIG. 4B, the first and second connection terminals 50a and 50b may be in contact with each other. Alternatively, the first and second connection terminals 50a and 50b may be merged to form a unitary shape without a boundary therebetween. The first and second conductive patterns VPa and VPb may be electrically connected through vias CT to the first and second connection terminals 50a and 50b, respectively.

Referring to FIG. 4D, each of the first and second stack structures ST1 and ST2 may include a first sub-stack structure SBST1 and a second sub-stack structure SBST2. This description may hold true for third and fourth stack structures ST3 and ST4 which will be discussed below. The second sub-stack structure SBST2 may be closer than the first sub-stack structure SBST1 to the source layer SCL. The first sub-stack structure SBST1 may be closer than the second sub-stack structure SBST2 to the logic chip 100. The sidewalls of the vertical patterns VS, CDVS, and EDVS may have their inflection points SIP adjacent to a boundary between the first sub-stack structure SBST1 and the second sub-stack structure SBST2. In addition, a sidewall of the gate dielectric layer GO may have an inflection point adjacent to the boundary between the first sub-stack structure SBST1 and the second sub-stack structure SBST2.

Referring to FIGS. 3A and 3B, none of the through vias CTHV1, CTHV2, ETHV1, and ETHV2 may penetrate the source layer SCL. A first dielectric pattern IP1 may be interposed between the source layer SCL and each of the via dielectric layers 16 that cover sidewalls of the first and second cell through vias CTHV1 and CTHV2. A second dielectric pattern IP2 may be interposed between the source layer SCL and each of the via dielectric layers 16 that cover sidewalls of the first and second edge through vias ETHV1 and ETHV2 adjacent to the cell array region CAR. The first and second dielectric patterns IP1 and IP2 may be formed of, for example, a silicon oxide layer. According to some example embodiments, the vertical patterns VS may penetrate and contact the source layer SCL.

Referring to FIGS. 2C, 3A, and 3B, the second memory chip 300 may include a second memory substrate 301. The second memory chip 300 may have a similar structure to that of the first memory chip 200. The second memory substrate 301 may have a first surface 301a that faces the logic chip 100. A source layer SCL may be disposed on the first surface 301a of the second memory substrate 301.

The source layer SCL may be provided thereon with a third stack structure ST3 and a fourth stack structure ST4 that are spaced apart from each other in the second direction D2. The third stack structure ST3 may correspond to a portion of the third memory block BLK3 shown in FIG. 1B. The fourth stack structure ST4 may correspond to a portion of the fourth memory block BLK4 shown in FIG. 1B. The fourth stack structure ST4 may have a shape the same as or similar to that obtained when the third stack structure ST3 rotates about 180 degrees.

The third stack structure ST3 may include stacked third electrode layers EL3 and inter-electrode dielectric layers 12 between the third electrode layers EL3. The fourth stack structure ST4 may include stacked fourth electrode layers EL4 and inter-electrode dielectric layers 12 between the fourth electrode layers EL4. Each of the third and fourth stack structures ST3 and ST4 may have stepwise ends on the first connection region CNR1 and the second connection region CNR2. The total number of the third electrode layers EL3 may be the same as or different from that of the fourth electrode layers EL4. The total number of the third electrode layers EL3 may be the same as or different from that of the first electrode layers EL1. Different from the first electrode layers EL1, the third electrode layers EL3 may not have the first recesses RC1. Different from the second electrode layers EL2, the fourth electrode layers EL4 may not have the second recesses RC2.

On the cell array region CAR, a plurality of cell vertical patterns VS may penetrate each of the third and fourth stack structures ST3 and ST4. The cell vertical patterns VS may have their ends that are connected through second-layered bit lines L2BL. The second-layered bit lines L2BL may extend in the second direction D2 and may be parallel to each other. In the second memory chip 300, a bit-line connection line BLCP may be either a laterally protruding portion of the second-layered bit line L2BL or a conductive pattern located at a height different from that of the second-layered bit line L2BL.

On the cell array region CAR, third cell through vias CTHV3 may penetrate the third stack structure ST3 and the second memory substrate 301, and fourth cell through vias CTHV4 may penetrate the fourth stack structure ST4 and the second memory substrate 301. The third and fourth cell through vias CTHV3 and CTHV4 may each be electrically connected through the bit-line connection line BLCP to one of the second-layered bit lines L2BL. The second memory chip 300 may not include the edge through vias ETHV1 and ETHV2 of the first memory chip 200.

On the second connection region CNR2, third cell contact plugs CC3 may each penetrate a planarized dielectric layer 20 and one or more inter-electrode dielectric layers 12, thereby contacting an end of one of the third electrode layers EL3. On the first connection region CNR1, fourth cell contact plugs CC4 may each penetrate a planarized dielectric layer 20 and one or more inter-electrode dielectric layers 12, thereby contacting an end of one of the fourth electrode layers EL4. The third and fourth cell contact plugs CC3 and CC4 may each be surrounded by a contact dielectric layer 14. Other structural features may be the same as or similar to those of the first memory chip 200.

Referring to FIGS. 3A and 5, the ends of the first to fourth stack structures ST1 to ST4 may have their stepwise shapes whose distances from the logic chip 100 progressively increase in the first direction D1. The first electrode layers EL1 of the first stack structure ST1 included in the first memory chip 200 may be electrically connected to corresponding first pass transistors PST1 of the first decoder circuit part DCR1 through the first cell contact plugs CC1, the first conductive patterns VPa, the first connection terminals 50a, and the logic connection terminals 150. For example, the ground selection lines (see GSL0 to GSL2 of FIG. 1B), the word lines (see WL0 to WLn of FIG. 1B), the dummy word line (see DWL of FIG. 1B), and the string selection lines (see SSL11 to SSL13 and SSL21 to SSL22 of FIG. 1B) included in the first memory block BLK1 of FIG. 1A may be electrically connected to corresponding first pass transistors PST1 of the first decoder circuit part DCR1.

Referring to FIGS. 3B and 5, the second electrode layers EL2 of the second stack structure ST2 included in the first memory chip 200 may be electrically connected to corresponding second pass transistors PST2 of the second decoder circuit part DCR2 through the second cell contact plugs CC2, the first conductive patterns VPa, the first connection terminals 50a, and the logic connection terminals 150. For example, the ground selection lines (see GSL0 to GSL2 of FIG. 1B), the word lines (see WL0 to WLn of FIG. 1B), the dummy word line (see DWL of FIG. 1B), and the string selection lines (see SSL11 to SSL13 and SSL21 to SSL22 of FIG. 1B) included in the second memory block BLK2 of FIG. 1A may be electrically connected to corresponding second pass transistors PST2 of the second decoder circuit part DCR2.

Referring back to FIGS. 3A and 5, the third electrode layers EL3 of the third stack structure ST3 included in the second memory chip 300 may be electrically connected to corresponding third pass transistors PST3 of the third decoder circuit part DCR3 through the third cell contact plugs CC3, the first conductive patterns VPa, the first connection terminals 50a, the second conductive patterns VPb, the second connection terminals 50b, the first edge through vias ETHV1, and the logic connection terminals 150. For example, the ground selection lines (see GSL0 to GSL2 of FIG. 1B), the word lines (see WL0 to WLn of FIG. 1B), the dummy word line (see DWL of FIG. 1B), and the string selection lines (see SSL11 to SSL13 and SSL21 to SSL22 of FIG. 1B) included in the third memory block BLK3 of FIG. 1A may be electrically connected to corresponding third pass transistors PST3 of the third decoder circuit part DCR3.

Referring back to FIGS. 3B and 5, the fourth electrode layers EL4 of the fourth stack structure ST4 included in the second memory chip 300 may be electrically connected to corresponding fourth pass transistors PST4 of the fourth decoder circuit part DCR4 through the fourth cell contact plugs CC4, the first conductive patterns VPa, the first connection terminals 50a, the second conductive patterns VPb, the second connection terminals 50b, the second edge through vias ETHV2, and the logic connection terminals 150. For example, the ground selection lines (see GSL0 to GSL2 of FIG. 1B), the word lines (see WL0 to WLn of FIG. 1B), the dummy word line (see DWL of FIG. 1B), and the string selection lines (see SSL11 to SSL13 and SSL21 to SSL22 of FIG. 1B) included in the fourth memory block BLK4 of FIG. 1A may be electrically connected to corresponding fourth pass transistors PST4 of the fourth decoder circuit part DCR4.

In conventional three-dimensional semiconductor memory devices, stacked memory chips share a common pass transistor. Accordingly, the common pass transistor is applies electrical signals to all of the electrode layers of all of the memory blocks contained in the stacked memory chips. As a result, the conventional three-dimensional semiconductor memory devices have increased memory blocks and repair blocks causing an overall increase in memory device size and a decrease in memory device performance. Moreover, when memory blocks are all connected in common, there may be a possibility of increase in signal transmission paths, which may increase noise or may reduce performance of semiconductor devices.

According to some example embodiments of the present inventive concepts, the three-dimensional semiconductor memory device 1000 may be configured to separately divide regions where are disposed the decoder circuit parts DCR1 to DCR4 or the pass transistors PST1 to PST4 and to independently apply electrical signals to the first to fourth electrode layers EL1 to EL4. With this configuration, it may be possible to obtain effects that practical storage spaces are increased compared to the case where memory blocks of memory chips are all connected to a single decoder circuit part and are operated at the same time or contemporaneously. Accordingly, some example embodiments of the present inventive concepts enable in the reduction of the memory block and repair block and the decrease in size of all memory blocks and semiconductor memory devices, thereby improving performance of the three-dimensional semiconductor memory device 1000 relative to the conventional memory devices. Also, some example embodiments of the present inventive concepts may provide for decreased signal noise relative to the conventional memory devices and, thus, may increase reliability of semiconductor devices.

The following will explain a method of fabricating the three-dimensional semiconductor memory device 1000 discussed with reference to FIGS. 2A to 5. The logic chip 100, the first memory chip 200, and the second memory chip 300 may be fabricated independently of each other. The logic chip 100, the first memory chip 200, and the second memory chip 300 may be positioned to allow the connection terminals 150, 50a, and 50b to correspond to each other, and then a thermocompression process may be performed to bond the chips 100, 200, and 300 to each other. Although not shown, bumps or solder balls may be interposed between the connection terminals 150, 50a, and 50b, and in this case, the passivation layers 242 and 342 may be spaced apart from each other. Although not shown in FIG. 5, additional first and second memory chips may be repeatedly and alternately stacked on the second memory chip 300.

Figure 6B:
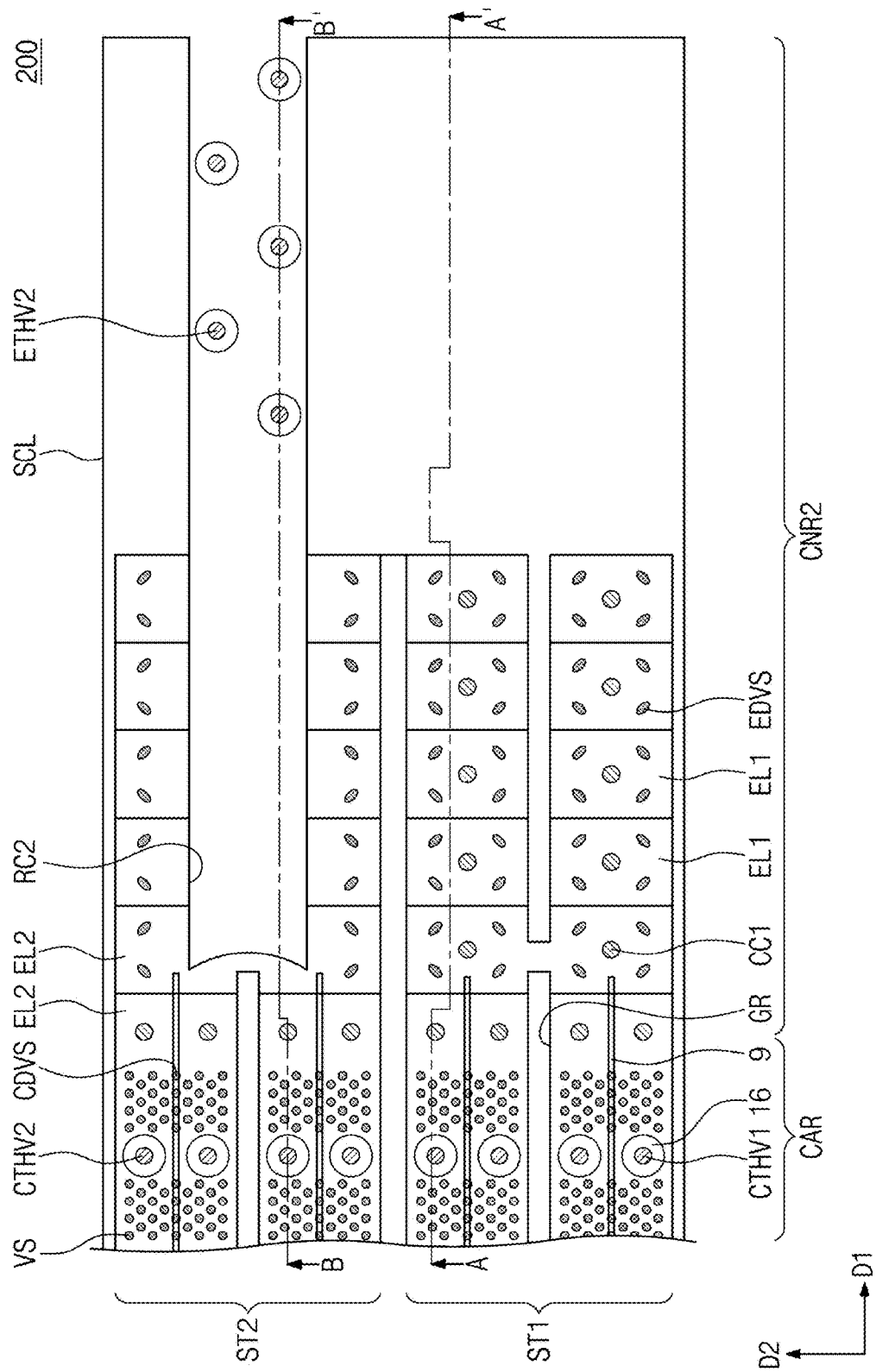
FIG. 6B illustrates a plan view showing a first memory chip of FIG. 1A.
Figure 6C:
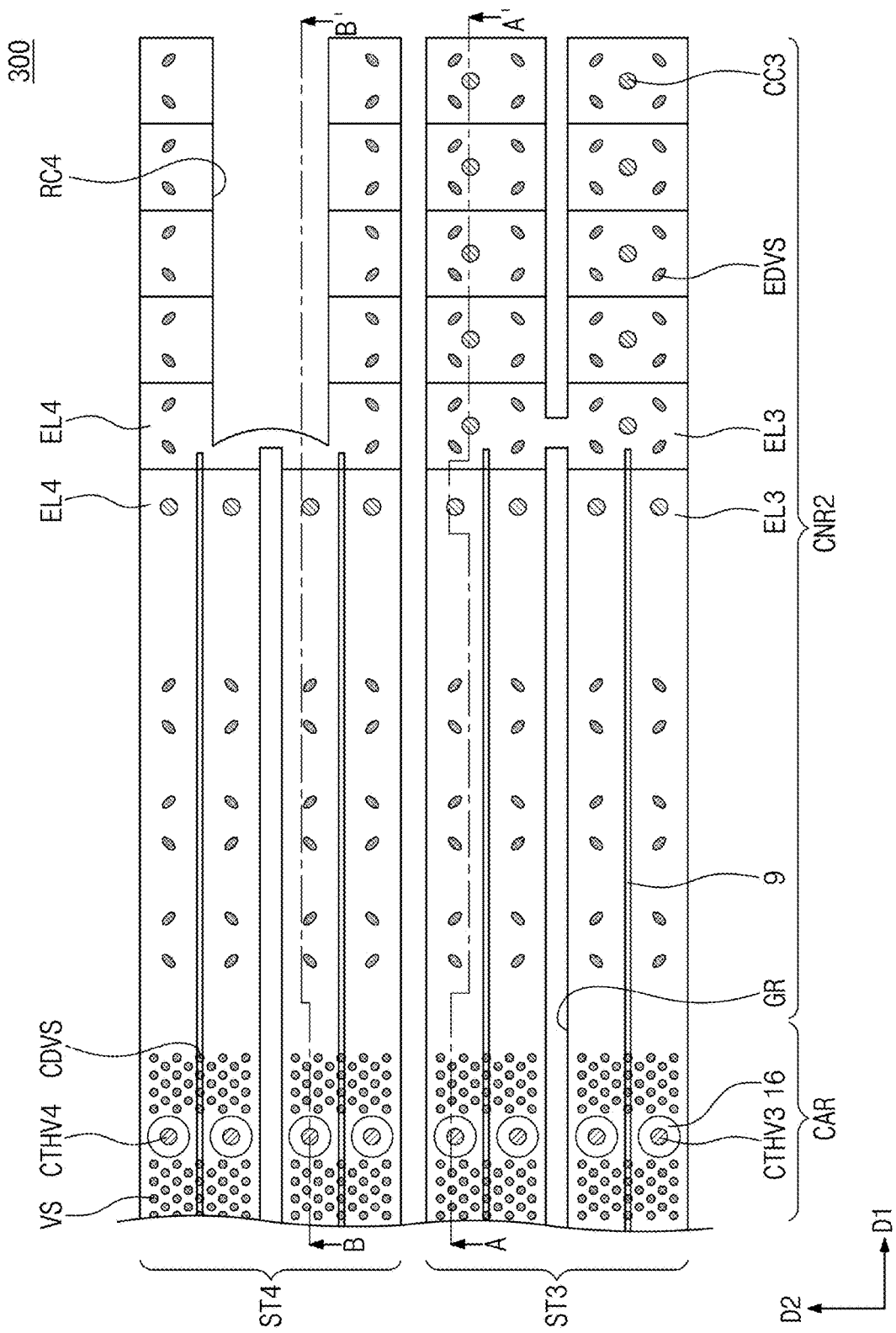
FIG. 6C illustrates a plan view showing a second memory chip of FIG. 1A.
Figure 7A:
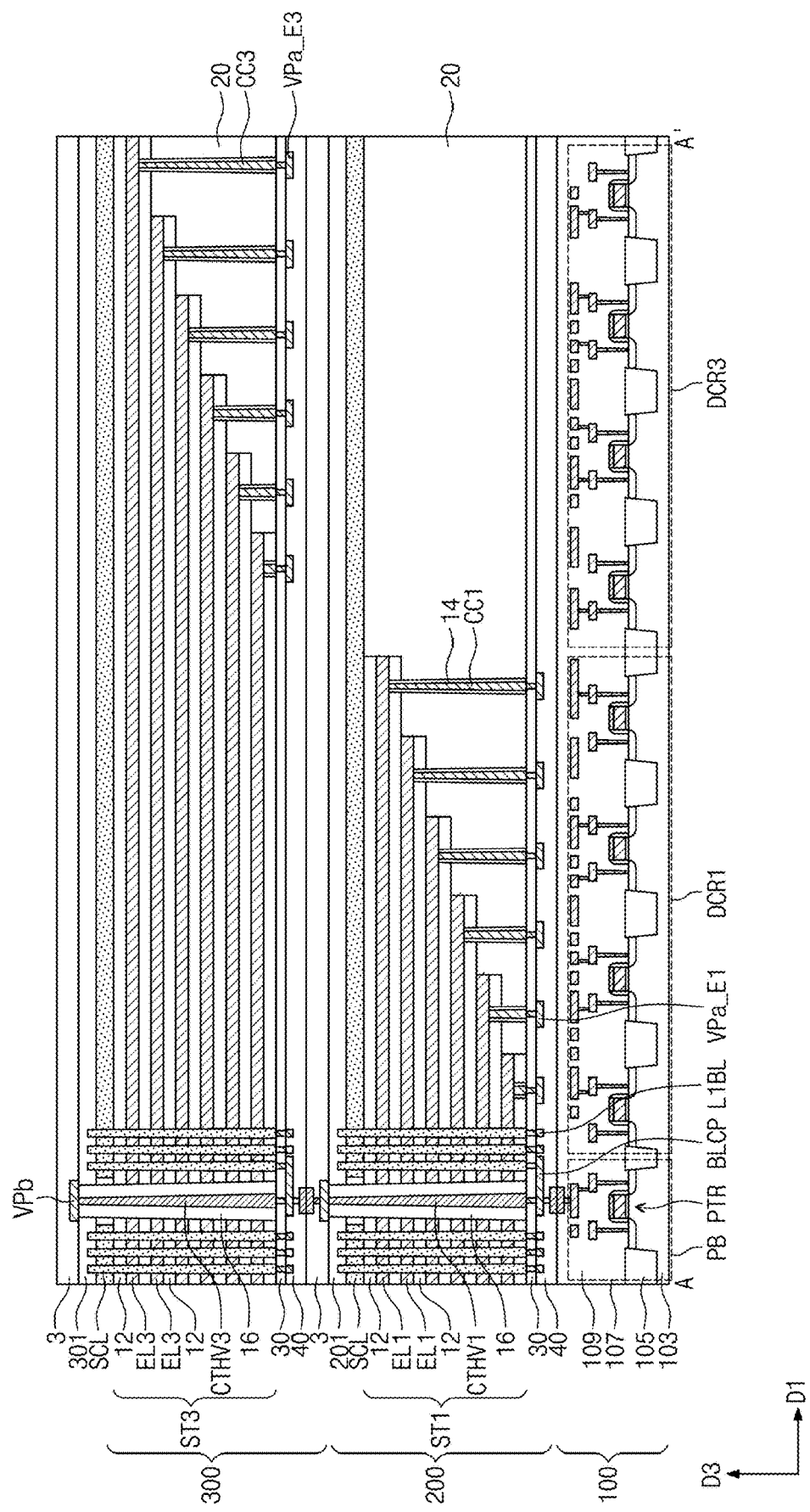
FIG. 7A illustrates a cross-sectional view taken along line A-A' of FIG. 6B or 6C.
Figure 7B:
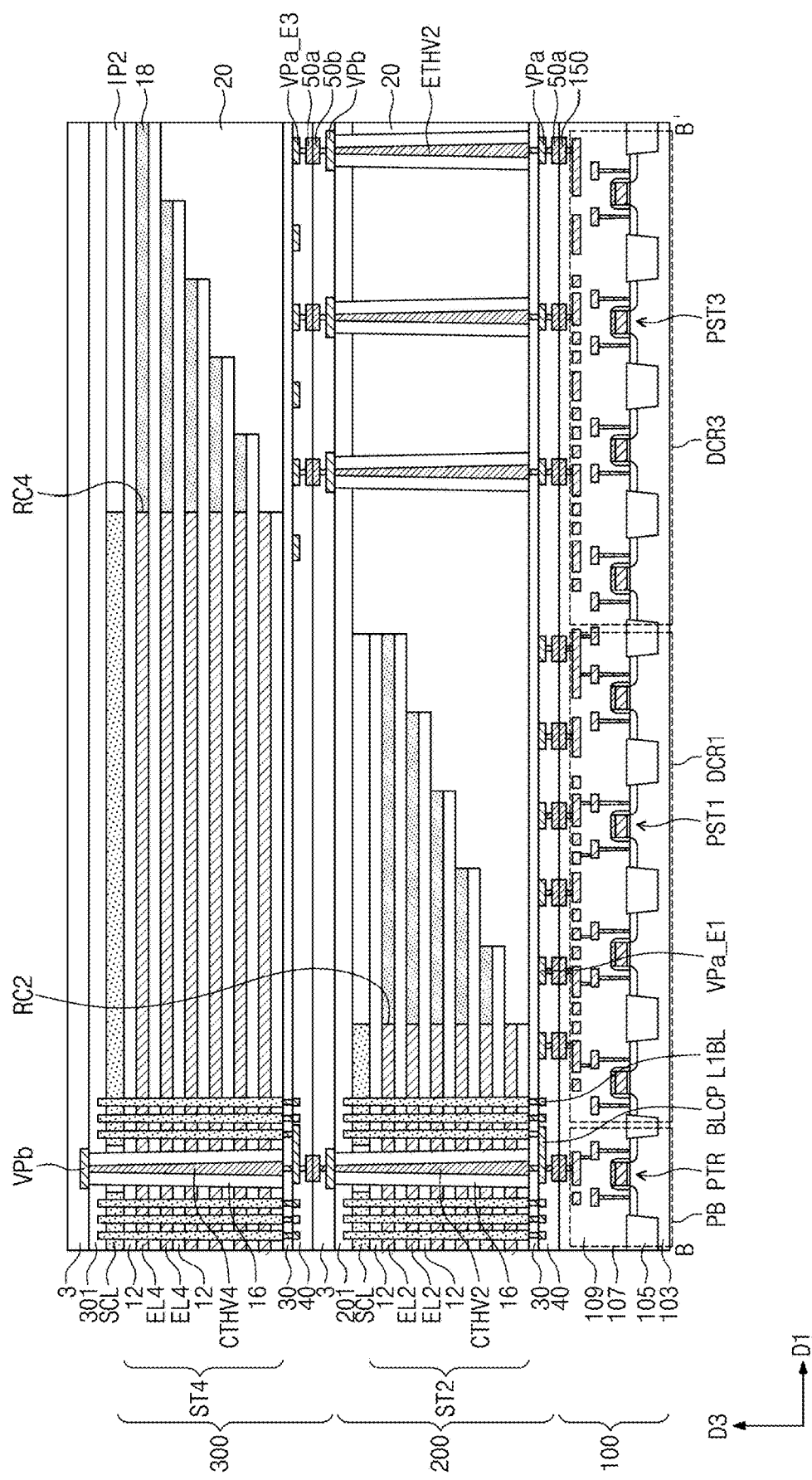
FIG. 7B illustrates a cross-sectional view taken along line B-B' of FIG. 6B or 6C.
Figure 8:
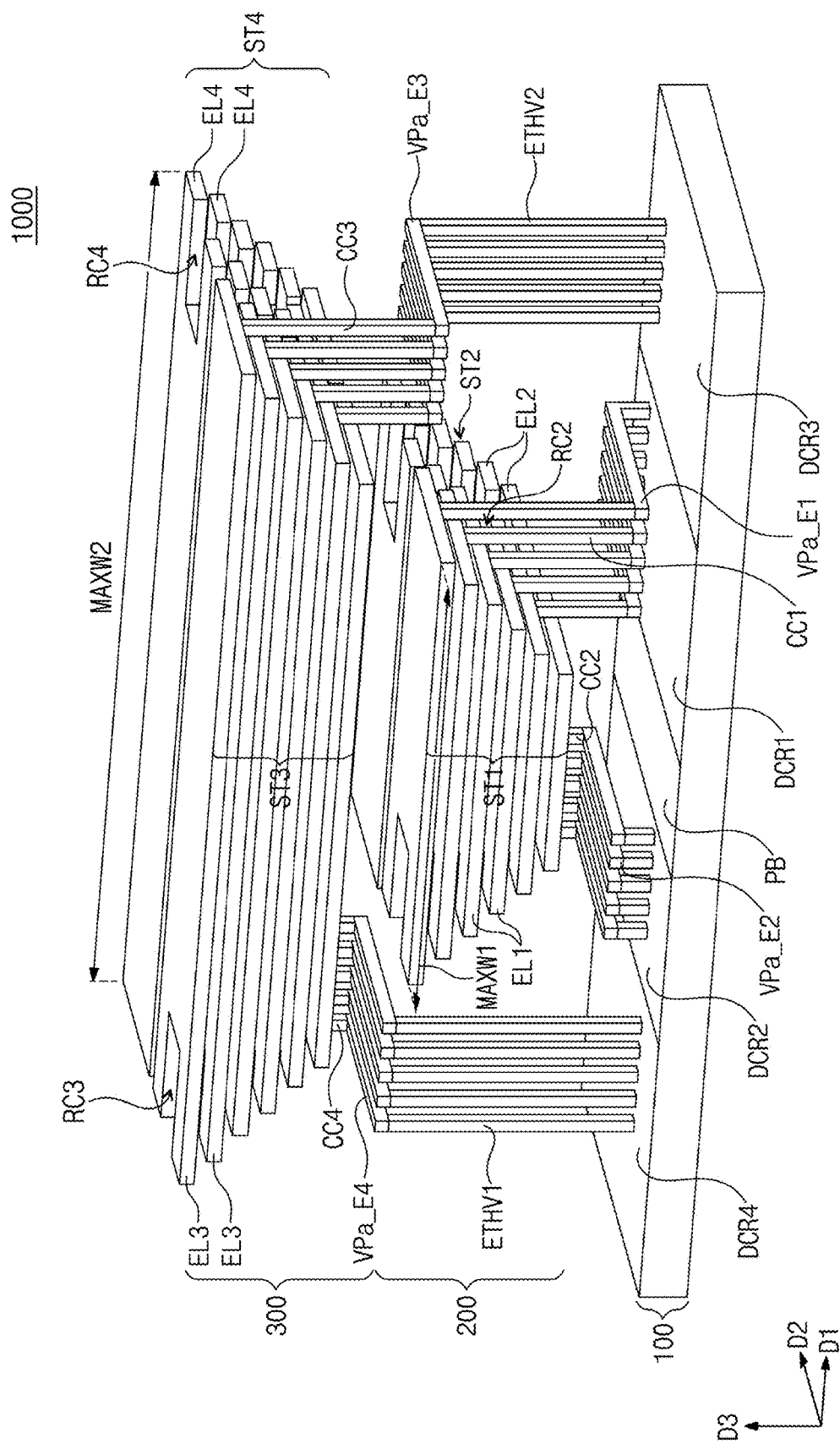
FIG. 8 illustrates a detailed perspective view of FIG. 1A.

FIG. 6A illustrates a plan view showing the logic chip of FIG. 1A. FIG. 6B illustrates a plan view showing the first memory chip of FIG. 1A. FIG. 6C illustrates a plan view showing the second memory chip of FIG. 1A. FIG. 7A illustrates a cross-sectional view taken along line A-A' of FIG. 6B or 6C. FIG. 7B illustrates a cross-sectional view taken along line B-B' of FIG. 6B or 6C. FIG. 8 illustrates a detailed perspective view of FIG. 1A.

Referring to FIG. 6A, the logic chip 100 may include a logic substrate 103. First to fourth decoder circuit parts DCR1 to DCR4 and a page buffer circuit part PB may be disposed on the logic substrate 103. In this description, the term "decoder circuit parts" may be called decoder regions. Alternatively, in this description, the term "decoder circuit parts" may be called regions where are disposed pass transistors that are connected to electrode layers. The first to fourth decoder circuit parts DCR1 to DCR4 and the page buffer circuit part PB may be spaced apart from each other in the first direction D1. The page buffer circuit part PB may be disposed on a central portion of the logic chip 100. The third decoder circuit part DCR3 and the fourth decoder circuit part DCR4 may be spaced apart from each other across the page buffer circuit part PB. The first decoder circuit part DCR1 may be disposed between the third decoder circuit part DCR3 and the page buffer circuit part PB. The second decoder circuit part DCR2 may be disposed between the fourth decoder circuit part DCR4 and the page buffer circuit part PB. Other structural features may be identical or similar to those discussed above.

Referring to FIGS. 6B, 7A, 7B, and 8, the first memory chip 200 may include a first stack structure ST1 and a second stack structure ST2 that are spaced apart from each other in the second direction D2. The second stack structure ST2 may have a shape obtained when the first stack structure ST1 rotates about 180 degrees. The first memory chip 200 may include a first connection region CNR1 and a second connection region CNR2 that are spaced apart from each other in the first direction D1, and may also include a cell array region CAR positioned between the first and second connection regions CNR1 and CNR2. In some example embodiments, the cell array region CAR may overlap the page buffer circuit part PB of the logic chip 100. The first connection region CNR1 may overlap the second and fourth decoder circuit parts DCR2 and DCR4. The second connection region CNR2 may overlap the first and third decoder circuit parts DCR1 and DCR3.

Although FIG. 6B omits illustration of the first stack structure ST1 on the first connection region CNR1, the first stack structure ST1 on the first connection region CNR1 may have the same shape as or a similar shape to that of the second stack structure ST2 on the second connection region CNR2. Likewise, although FIG. 6B omits illustration of the second stack structure ST2 on the first connection region CNR1, the second stack structure ST2 on the first connection region CNR1 may have the same shape as or a similar shape to that of the first stack structure ST1 on the second connection region CNR2. The first stack structure ST1 may have first electrode layers EL1 with first recesses RC1 on the first connection region CNR1. The second stack structure ST2 may have second electrode layers EL2 with second recesses RC2 on the second connection region CNR2.

On the second connection region CNR2, the first electrode layers EL1 may be connected to corresponding first cell contact plugs CC1. The first cell contact plugs CC1 may be connected to corresponding first electrode connection lines VPa_E1. On the first connection region CNR1, the second electrode layers EL2 may be connected to corresponding second cell contact plugs CC2. The second cell contact plugs CC2 may be connected to corresponding second electrode connection lines VPa_E2. The first and second electrode connection lines VPa_E1 and VPa_E2 may extend in the second direction D2. In the first memory chip 200, the first and second electrode connection lines VPa_E1 and VPa_E2 may be located at the same height as or a height similar to that of the first conductive patterns VPa. On the second connection region CNR2, second edge through vias ETHV2 may be closer to the second stack structure ST2 than to the first stack structure ST1 and may be disposed outside the second stack structure ST2. On the first connection region CNR1, first edge through vias ETHV1 may be closer to the first stack structure ST1 than to the second stack structure ST2 and may be disposed outside the first stack structure ST1. The first edge through vias ETHV1 may not penetrate the first stack structure ST1, and the second edge through vias ETHV2 may not penetrate the second stack structure ST2. The first and second edge through vias ETHV1 and ETHV2 may penetrate a planarized dielectric layer 20 and a first memory substrate 201. Other structural features may be identical or similar to those discussed above.

Referring to FIGS. 6C, 7A, 7B, and 8, the second memory chip 300 may include a third stack structure ST3 and a fourth stack structure ST4 that are spaced apart from each other in the second direction D2. The third stack structure ST3 may have a shape obtained when the fourth stack structure ST4 rotates about 180 degrees. Although FIG. 6C omits illustration of the third stack structure ST3 on the first connection region CNR1, the third stack structure ST3 on the first connection region CNR1 may have the same shape as or a similar shape to that of the fourth stack structure ST4 on the second connection region CNR2. Likewise, although FIG. 6C omits illustration of the fourth stack structure ST4 on the first connection region CNR1, the fourth stack structure ST4 on the first connection region CNR1 may have the same shape as or a similar shape to that of the third stack structure ST3 on the second connection region CNR2. The third stack structure ST3 may have third electrode layers EL3 with third recesses RC3 on the first connection region CNR1. The fourth stack structure ST4 may have fourth electrode layers EL4 with fourth recesses RC4 on the second connection region CNR2.

On the second connection region CNR2, the third electrode layers EL3 may be connected to corresponding third cell contact plugs CC3. The third cell contact plugs CC3 may be connected to corresponding third electrode connection lines VPa_E3. On the first connection region CNR1, the fourth electrode layers EL4 may be connected to corresponding fourth cell contact plugs CC4. The fourth cell contact plugs CC4 may be connected to corresponding fourth electrode connection lines VPa_E4. The third and fourth electrode connection lines VPa_E3 and VPa_E4 may extend in the second direction D2. In the second memory chip 300, the third and fourth electrode connection lines VPa_E3 and VPa_E4 may be located at the same height as or a height similar to that of the first conductive patterns VPa. The second edge through vias ETHV2 may be electrically connected to corresponding third electrode connection lines VPa_E3. The first edge through vias ETHV1 may be electrically connected to corresponding fourth electrode connection lines VPa_E4.

Referring to FIG. 8, on the first and second connection regions CNR1 and CNR2, the third stack structure ST3 may have opposite ends that laterally protrude beyond the first stack structure ST1. On the first and second connection regions CNR1 and CNR2, the fourth stack structure ST4 may have opposite ends that laterally protrude beyond the second stack structure ST2. The third and fourth electrode layers EL3 and EL4 may be longer in the first direction D1 than the first and second electrode layers EL1 and EL2. Each of the first and second stack structures ST1 and ST2 may have a first maximum width MAXW1 (as referred to herein, a maximum width may refer to an upper limit width) parallel to the first direction D1. Each of the third and fourth stack structures ST3 and ST4 may have a second maximum width MAXW2 parallel to the first direction D1. The second maximum width MAXW2 may be greater than the first maximum width MAXW1. Each of the third and fourth stack structures ST3 and ST4 may have a minimum width (as referred to herein, a minimum width may refer to an lower limit width) parallel to the first direction D1 greater than the first maximum width MAXW1. Other structural features may be identical or similar to those discussed above.

Referring to FIGS. 7A, 7B, and 8, the first electrode layers EL1 of the first stack structure ST1 included in the first memory chip 200 may be electrically connected to corresponding first pass transistors PST1 of the first decoder circuit part DCR1 through the first cell contact plugs CC1, the first electrode connection lines VPa_E1, the first connection terminals 50a, and the logic connection terminals 150.

Referring back to FIG. 8, the second electrode layers EL2 of the second stack structure ST2 included in the first memory chip 200 may be electrically connected to corresponding second pass transistors PST2 of the second decoder circuit part DCR2 through the second cell contact plugs CC2, the second electrode connection lines VPa_E2, the first connection terminals 50a, and the logic connection terminals 150.

Referring back to FIGS. 7A, 7B, and 8, the third electrode layers EL3 of the third stack structure ST3 included in the second memory chip 300 may be electrically connected to corresponding third pass transistors PST3 of the third decoder circuit part DCR3 through the third cell contact plugs CC3, the third electrode connection lines VPa_E3, the first connection terminals 50a, the second conductive patterns VPb, the second connection terminals 50b, the second edge through vias ETHV2, and the logic connection terminals 150.

Referring again to FIG. 8, the fourth electrode layers EL4 of the fourth stack structure ST4 included in the second memory chip 300 may be electrically connected to corresponding fourth pass transistors PST4 of the fourth decoder circuit part DCR4 through the fourth cell contact plugs CC4, the fourth electrode connection lines VPa_E4, the first connection terminals 50a, the second conductive patterns VPb, the second connection terminals 50b, the first edge through vias ETHV1, and the logic connection terminals 150.

Figure 9A:
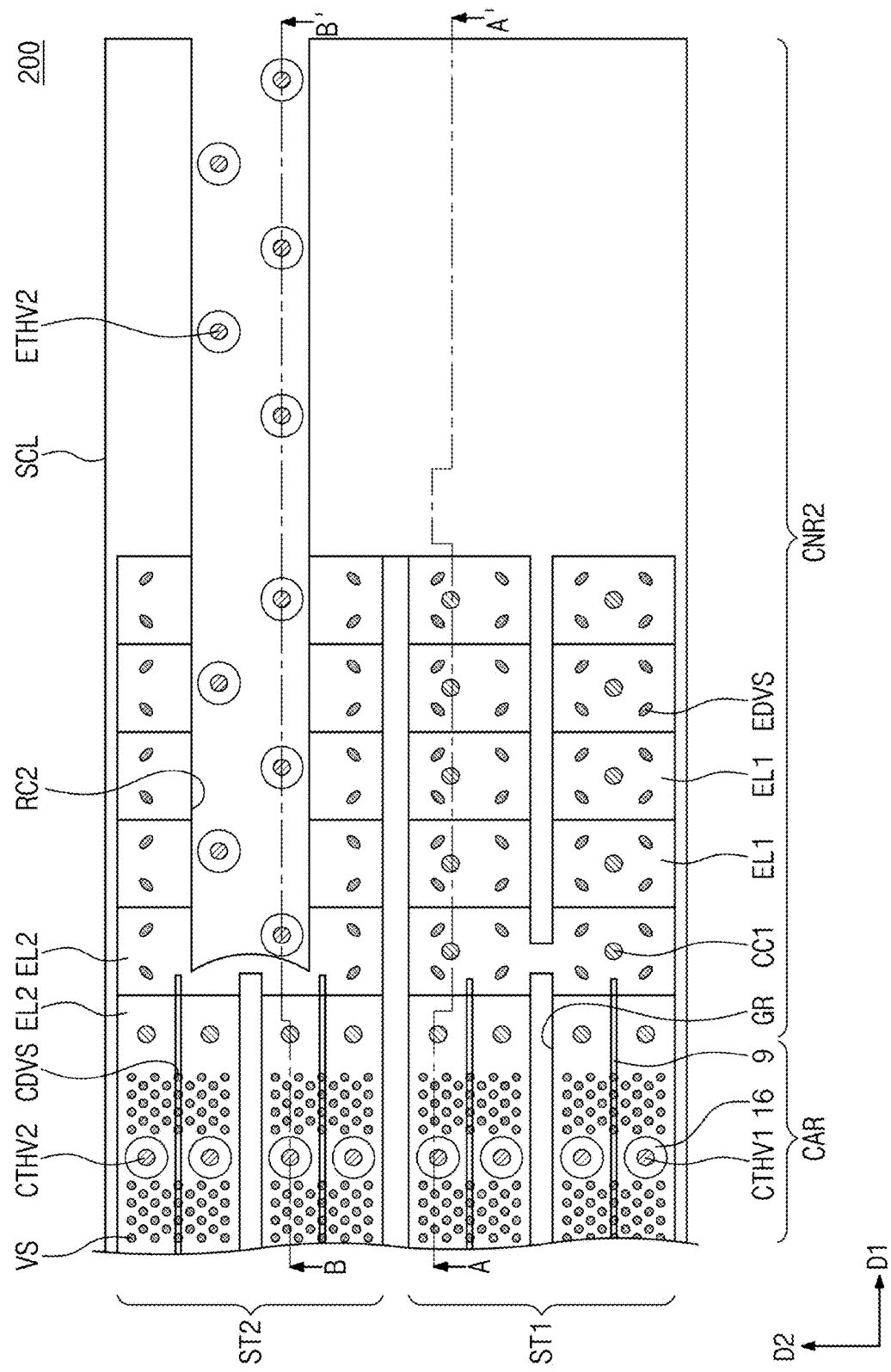
FIG. 9A illustrates a plan view showing a first memory chip of FIG. 1A.
Figure 9B:
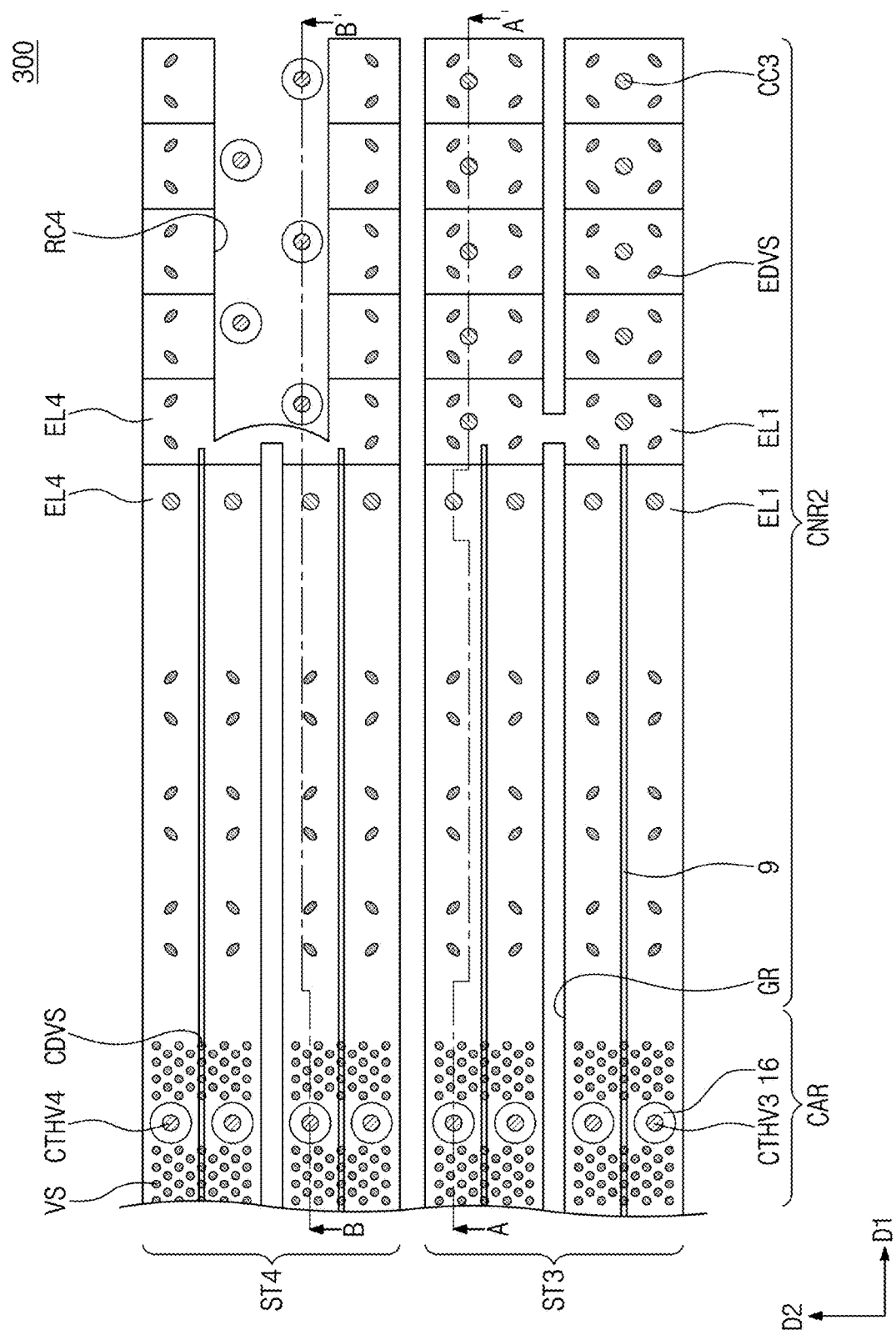
FIG. 9B illustrates a plan view showing a second memory chip of FIG. 1A.
Figure 10:
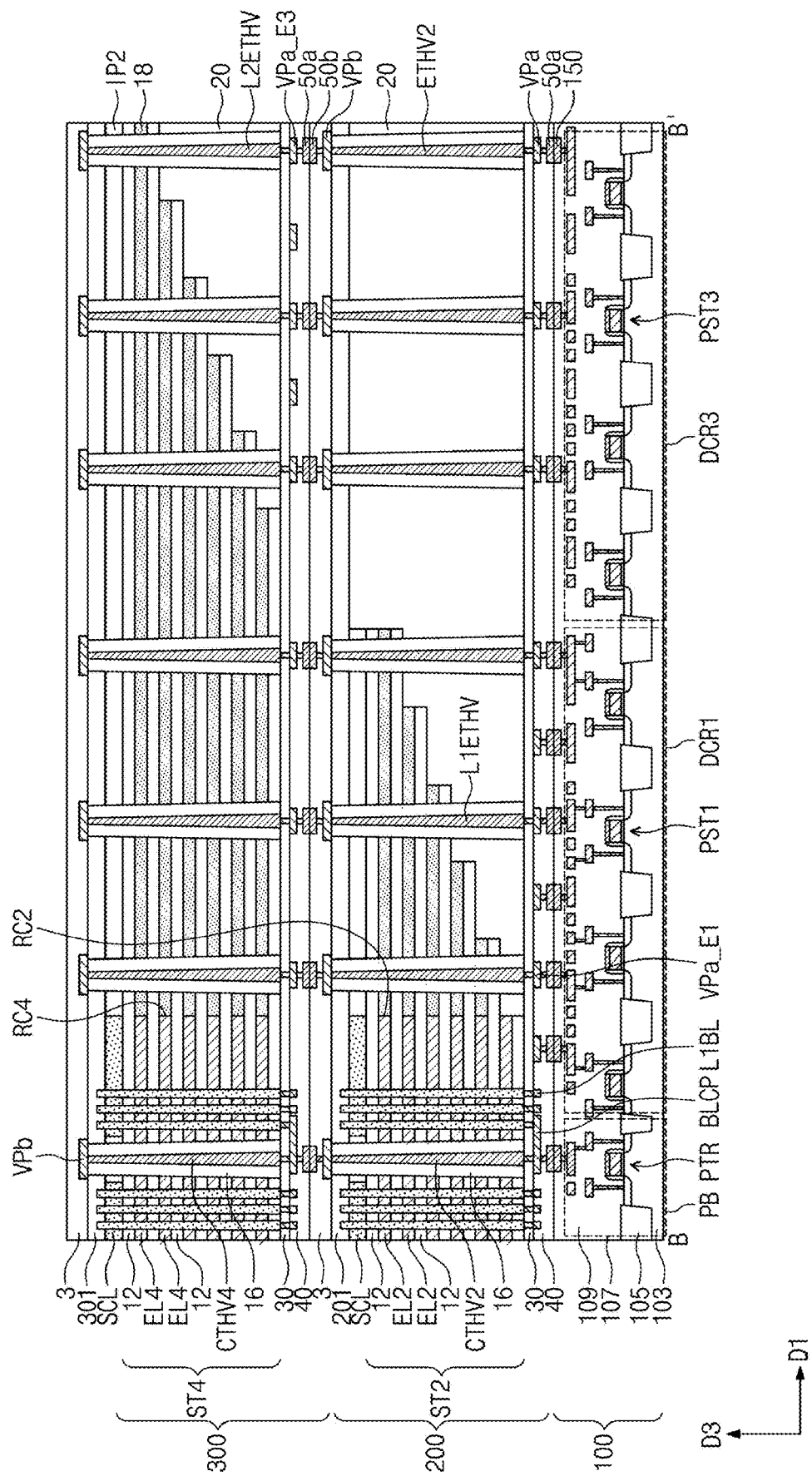
FIG. 10 illustrates a cross-sectional view taken along line B-B' of FIG. 9A or 9B.
Figure 11:
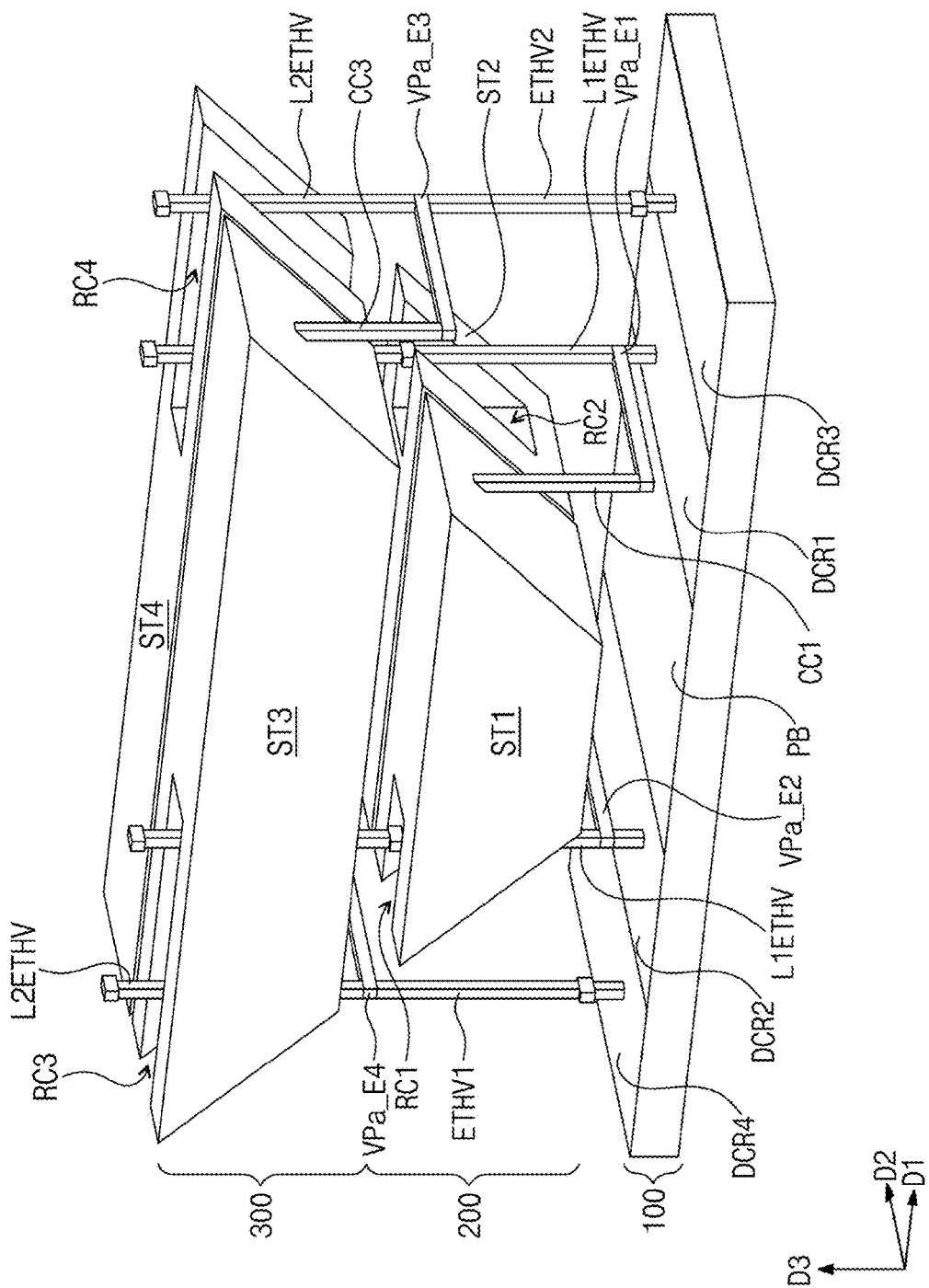
FIG. 11 illustrates a detailed perspective view of FIG. 1A.

FIG. 9A illustrates a plan view showing the first memory chip of FIG. 1A. FIG. 9B illustrates a plan view showing the second memory chip of FIG. 1A. FIG. 10 illustrates a cross-sectional view taken along line B-B' of FIG. 9A or 9B. FIG. 11 illustrates a detailed perspective view of FIG. 1A. FIG. 11 shows simplified shapes of stack structures. In addition, for clarity of illustration, FIG. 11 exemplarily shows only one of a plurality of contact plugs and only one of a plurality of through vias.

A cross-section taken along line A-A' of FIG. 9A or 9B may be the same as or similar to that of FIG. 7A.

Referring to FIGS. 9A to 11, the first memory chip 200 may further include first-layered edge through vias L1ETHV. On the second connection region CNR2 of the first memory chip 200, the first electrode connection line VPa_E1 may have an end in contact with one of the first-layered edge through vias L1ETHV. The first-layered edge through via L1ETHV may be disposed in the second recess RC2. The first-layered edge through via L1ETHV may be spaced apart from the second edge through via ETHV2.

On the first connection region CNR1 of the first memory chip 200, the second electrode connection line VPa_E2 may have an end in contact with another of the first-layered edge through vias L1ETHV. The first-layered edge through via L1ETHV may be disposed in the first recess RC1. The first-layered edge through via L1ETHV may be spaced apart from the first edge through via ETHV1.

The third electrode layers EL3 of the third stack structure ST3 included in the second memory chip 300 may have third recesses RC3 on the first connection region CNR1. The third recess RC3 may have a width parallel to the first direction D1 greater than a width parallel to the first direction D1 of the first recess RC1 of the first electrode layer EL1 included in the first stack structure ST1. The fourth electrode layers EL4 of the fourth stack structure ST4 may have fourth recesses RC4 on the second connection region CNR2. The fourth recess RC4 may have a width parallel to the first direction D1 greater than a width parallel to the first direction D1 of the second recess RC2 of the second electrode layer EL2 included in the second stack structure ST2.

The second memory chip 300 may further include second-layered edge through vias L2ETHV. On the second connection region CNR2 of the second memory chip 300, the third electrode connection line VPa_E3 may have an end in contact with one of the second-layered edge through vias L2ETHV. The second-layered edge through via L2ETHV may be disposed in the fourth recess RC4. The second-layered edge through via L2ETHV may be spaced apart from the third cell contact plug CC3.

On the first connection region CNR1 of the second memory chip 300, the fourth electrode connection line VPa_E4 may have an end in contact with another of the second-layered edge through vias L2ETHV. The second-layered edge through via L2ETHV may be disposed in the third recess RC3. Other structural features may be identical or similar to those discussed above.

The first-layered edge through vias L1ETHV and the second-layered edge through vias L2ETHV may be provided to allow the first to fourth electrode layers EL1 to EL4 of the first to fourth stack structures ST1 to ST4 to have connection with at least one memory chip or wiring lines additionally disposed on the second memory chip 300. The first-layered edge through vias L1ETHV and the second-layered edge through vias L2ETHV may be used to variously change an interconnection relationship of the three-dimensional semiconductor memory device.

Figure 12:
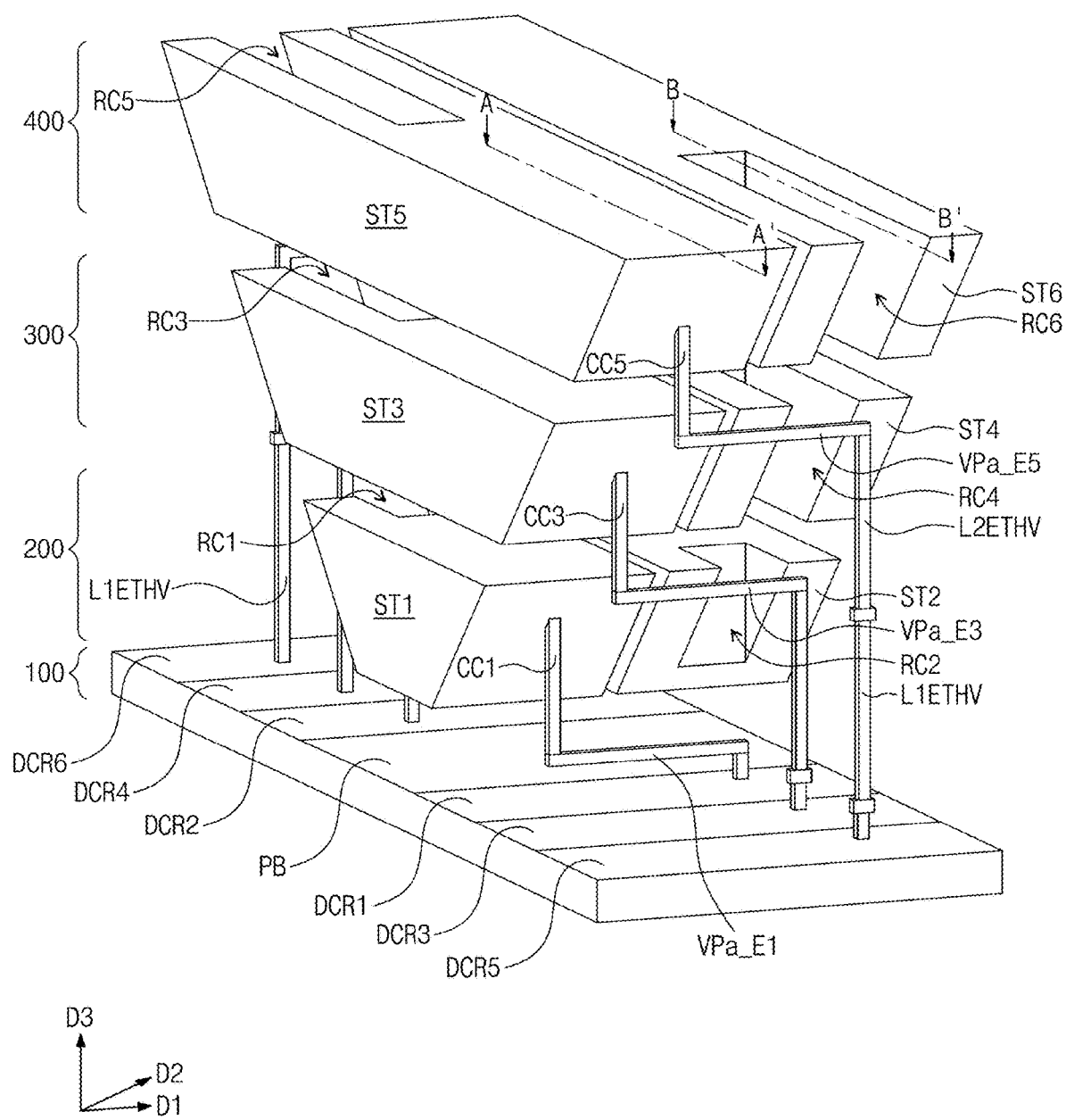
FIG. 12 illustrates a perspective view showing a three-dimensional semiconductor memory device according to some example embodiments of the present inventive concepts.
Figure 13A:
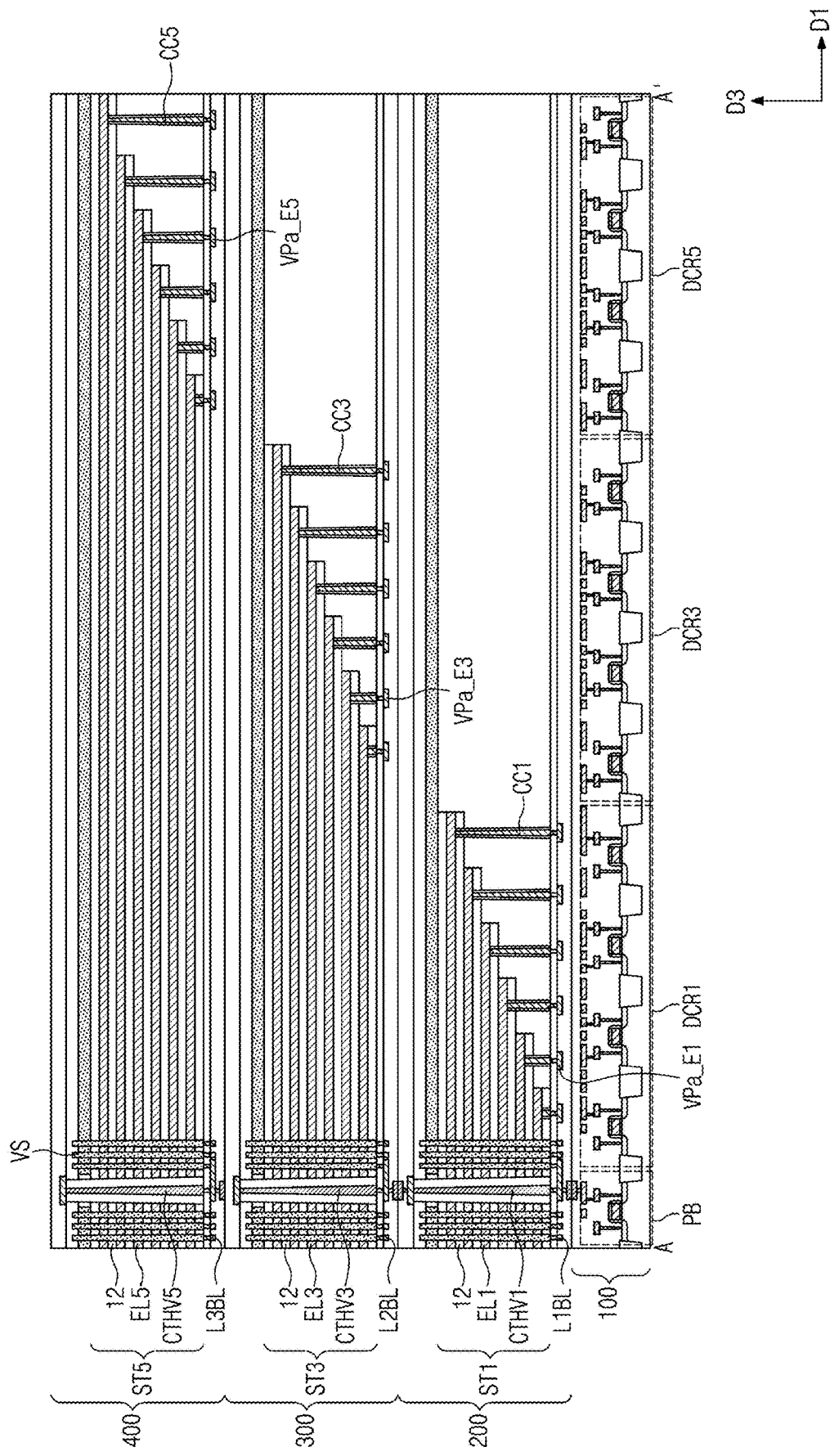
FIG. 13A illustrates a cross-sectional view taken along line A-A' of FIG. 12.
Figure 13B:
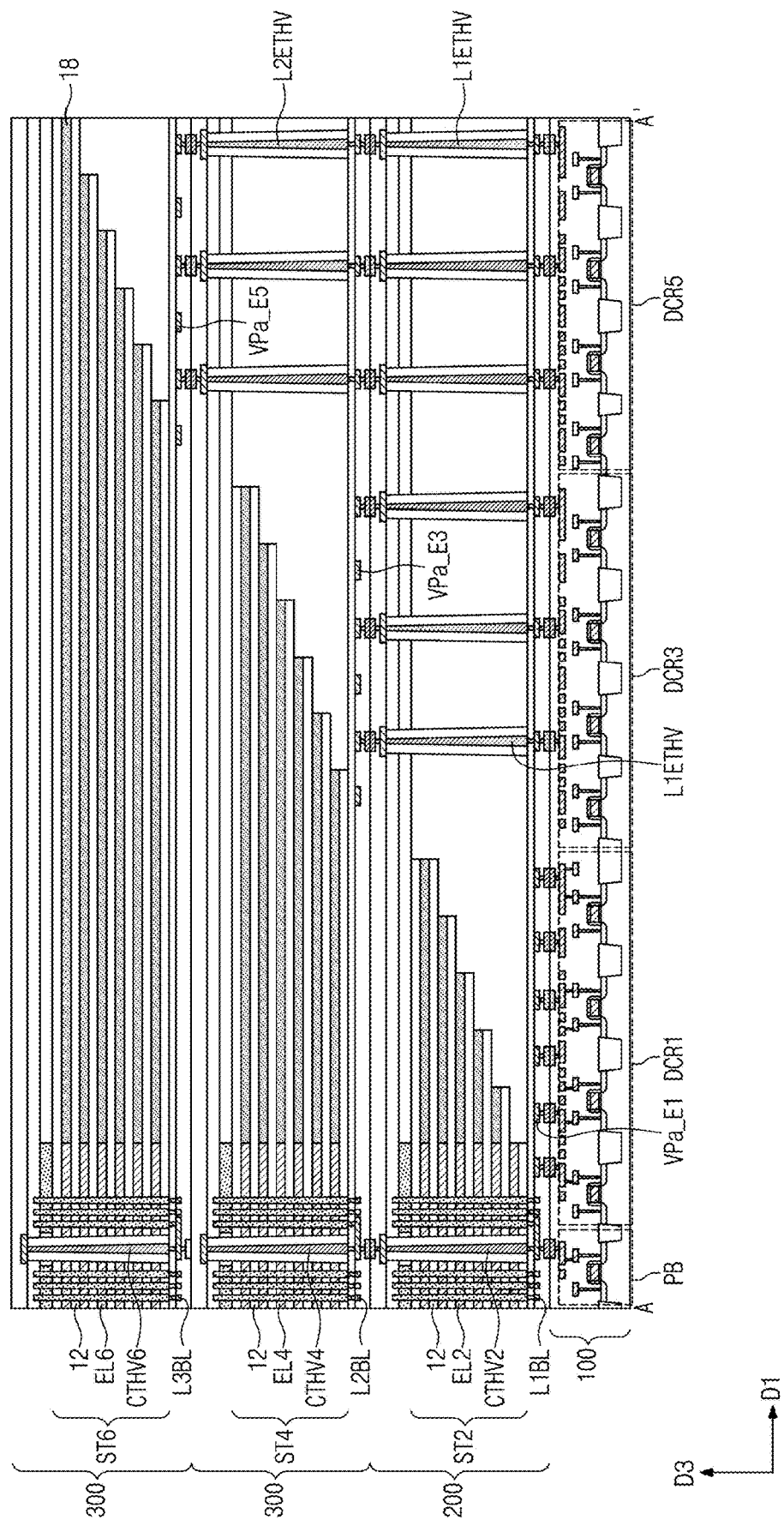
FIG. 13B illustrates a cross-sectional view taken along line B-B' of FIG. 12.

FIG. 12 illustrates a perspective view showing a three-dimensional semiconductor memory device according to some example embodiments of the present inventive concepts. FIG. 13A illustrates a cross-sectional view taken along line A-A' of FIG. 12. FIG. 13B illustrates a cross-sectional view taken along line B-B' of FIG. 12.

Referring to FIGS. 12, 13A, and 13B, the logic chip 100 may include first to sixth decoder circuit parts DCR1 to DCR6 and a page buffer circuit part PB. The first to sixth decoder circuit parts DCR1 to DCR6 and the page buffer circuit part PB may be spaced part from each other in the first direction D1. The page buffer circuit part PB may be disposed on a central portion of the logic chip 100. The sixth decoder circuit part DCR6 and the fifth decoder circuit part DCR5 may be spaced apart from each other across the page buffer circuit part PB. The fourth decoder circuit part DCR4 may be disposed between the sixth decoder circuit part DCR6 and the page buffer circuit part PB. The second decoder circuit part DCR2 may be disposed between the fourth decoder circuit part DCR4 and the page buffer circuit part PB. The third decoder circuit part DCR3 may be disposed between the fifth decoder circuit part DCR5 and the page buffer circuit part PB. The first decoder circuit part DCR1 may be disposed between the third decoder circuit part DCR3 and the page buffer circuit part PB.

Likewise that shown in FIG. 2B, each of first to third memory chip 200, 300, and 400 may include a first connection region CNR1 and a second connection region CNR2 that are spaced apart from each other in the first direction D1, and may also include a cell array region CAR positioned between the first and second connection regions CNR1 and CNR2. In some example embodiments, the cell array region CAR may overlap the page buffer circuit part PB of the logic chip 100. The first connection region CNR1 may overlap the second, fourth, and sixth decoder circuit parts DCR2, DCR4, and DCR6. The second connection region CNR2 may overlap the first, third, and fifth decoder circuit parts DCR1, DCR3, and DCR5.

The third memory chip 400 may be disposed on the second memory chip 300. The third memory chip 400 may include a fifth stack structure ST5 and a sixth stack structure ST6 that are spaced apart from each other in the second direction D2. The sixth stack structure ST6 may have a shape obtained when the fifth stack structure ST5 rotates about 180 degrees. The fifth stack structure ST5 may include fifth electrode layers EL5 and inter-electrode dielectric layers 12 interposed between the fifth electrode layers EL5. The sixth stack structure ST6 may include sixth electrode layers EL6 and inter-electrode dielectric layers 12 interposed between the sixth electrode layers EL6.

Each of the fifth and sixth stack structures ST5 and ST6 may have a maximum width parallel to the first direction D1 greater than a maximum width parallel to the first direction D1 of each of the third and fourth stack structures ST3 and ST4. Each of the fifth and sixth stack structures ST5 and ST6 may have a minimum width parallel to the first direction D1 greater than the maximum width parallel to the first direction D1 of each of the third and fourth stack structures ST3 and ST4.

The fifth electrode layers EL5 of the fifth stack structure ST5 may have fifth recesses RC5 on the first connection region CNR1. The sixth electrode layers EL6 of the sixth stack structure ST6 may have sixth recesses RC6 on the second connection region CNR2.

On the cell array region CAR, a plurality of cell vertical patterns VS may penetrate each of the fifth and sixth stack structures ST5 and ST6. Third-layered bit lines L3BL may connect ends of the cell vertical patterns VS. Fifth cell through vias CTHV5 penetrating the fifth stack structure ST5 may be disposed between the cell vertical patterns VS. The fifth cell through via CTHV5 may be electrically connected to one of the third-layered bit lines L3BL. Sixth cell through vias CTHV6 penetrating the sixth stack structure ST6 may be disposed between the cell vertical patterns VS. The sixth cell through via CTHV6 may be electrically connected to one of the third-layered bit lines L3BL.

On the second connection region CNR2, the fifth electrode layers EL5 may be connected to corresponding fifth cell contact plugs CC5. The fifth cell contact plugs CC5 may be connected to corresponding fifth electrode connection lines VPa_E5. On the second connection region CNR2, the sixth electrode layers EL6 may be connected to corresponding sixth cell contact plugs. The sixth cell contact plugs may be connected to corresponding sixth electrode connection lines (see VPa_E6 of FIG. 14). According to some example embodiments, the fifth and sixth cell contact plugs CC5 and CC6 may correspond to the third and fourth cell contact plugs CC3 and CC4 discussed above.

The first memory chip 200 may include first-layered edge through vias L1ETHV. Ones of the first-layered edge through vias L1ETHV may correspond to the first and second edge through vias ETHV1 and ETHV2 discussed with reference to FIGS. 2A to 11. The second memory chip 300 may include second-layered edge through vias L2ETHV.

The first electrode layers EL1 of the first stack structure ST1 included in the first memory chip 200 may be electrically connected to corresponding first pass transistors of the first decoder circuit part DCR1 through the first cell contact plugs CC1 and the first electrode connection lines VPa_E1. The second electrode layers EL2 of the second stack structure ST2 included in the first memory chip 200 may be electrically connected to corresponding second pass transistors of the second decoder circuit part DCR2 through the second cell contact plugs and the second electrode connection lines.

The third electrode layers EL3 of the third stack structure ST3 included in the second memory chip 300 may be electrically connected to corresponding third pass transistors of the third decoder circuit part DCR3 through the third cell contact plugs CC3, the third electrode connection lines VPa_E3, and ones of the first-layered edge through vias L1ETHV. The fourth electrode layers EL4 of the fourth stack structure ST4 included in the second memory chip 300 may be electrically connected to corresponding fourth pass transistors of the fourth decoder circuit part DCR4 through the fourth cell contact plugs, the fourth electrode connection lines, and ones of the first-layered edge through vias L1ETHV.

The fifth electrode layers EL5 of the fifth stack structure ST5 included in the third memory chip 400 may be electrically connected to corresponding fifth pass transistors of the fifth decoder circuit part DCR5 through the fifth cell contact plugs CC5, the fifth electrode connection lines VPa_E5, ones of the second-layered edge through vias L2ETHV, and ones of the first-layered edge through vias L1ETHV. The sixth electrode layers EL6 of the sixth stack structure ST6 included in the third memory chip 400 may be electrically connected to corresponding sixth pass transistors of the sixth decoder circuit part DCR6 through the sixth cell contact plugs, the sixth electrode connection lines VPa_E6, ones of the second-layered edge through vias L2ETHV, and ones of the first-layered edge through vias L1ETHV.

Figure 14:
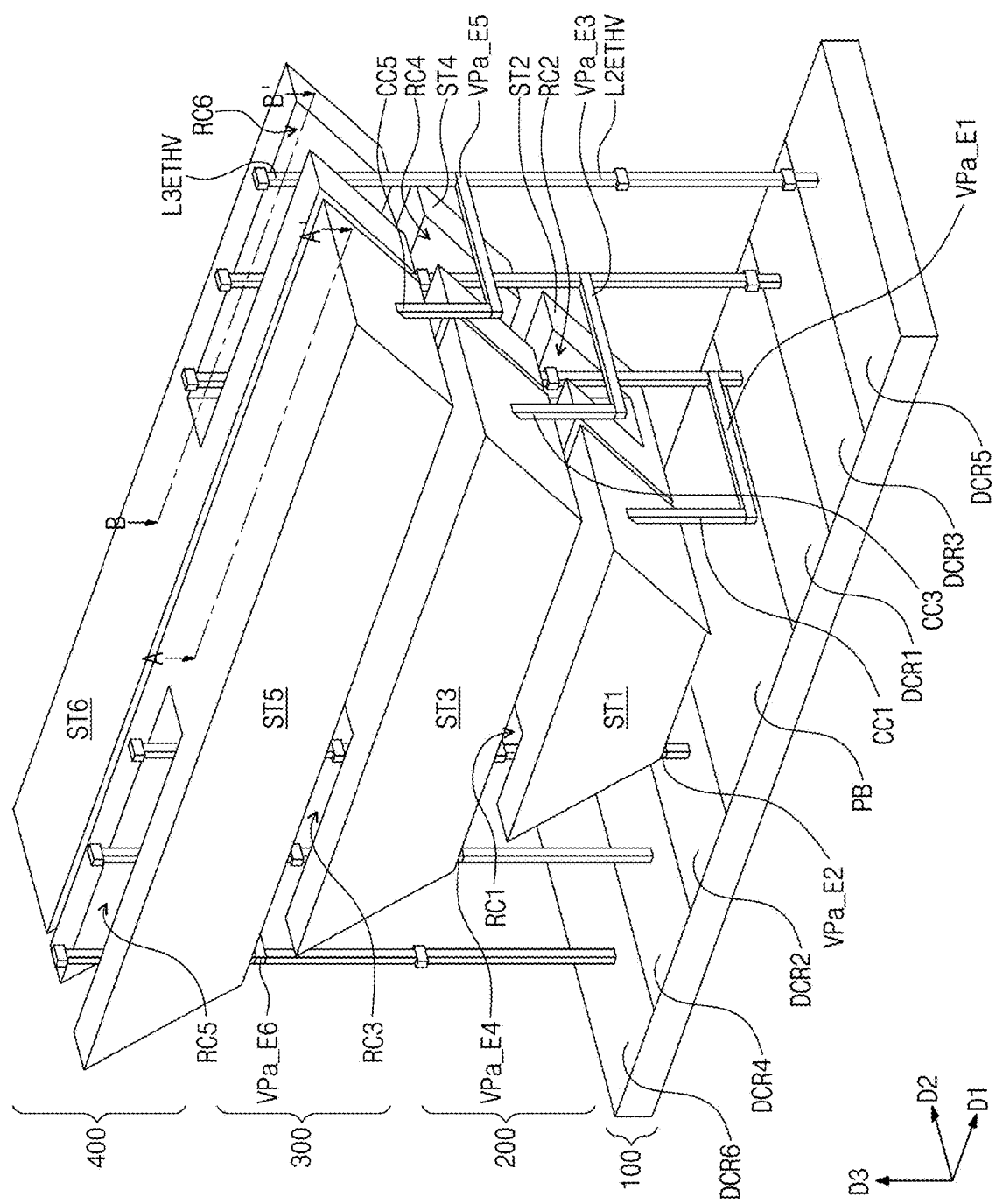
FIG. 14 illustrates a perspective view showing a three-dimensional semiconductor memory device according to some example embodiments of the present inventive concepts.
Figure 15:
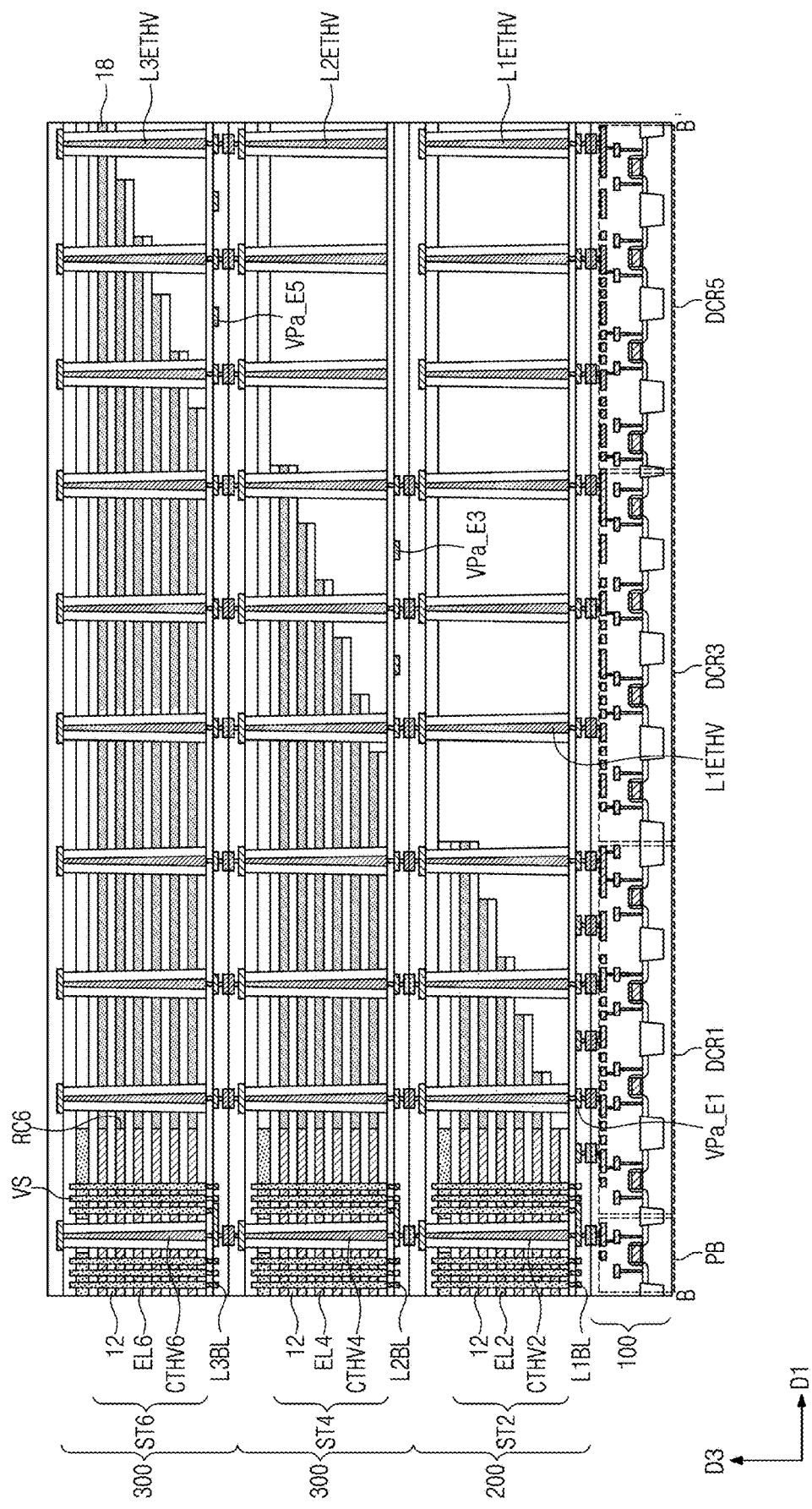
FIG. 15 illustrates a cross-sectional view taken along line B-B' of FIG. 14.

FIG. 14 illustrates a perspective view showing a three-dimensional semiconductor memory device according to some example embodiments of the present inventive concepts. FIG. 15 illustrates a cross-sectional view taken along line B-B' of FIG. 14. A cross-section taken along line A-A' of FIG. 15 may be the same as or similar to that of FIG. 13B.

Referring to FIGS. 13B, 14, and 15, the first memory chip 200 may include a plurality of first-layered edge through vias L1ETHV that penetrate each of the first and second stack structures ST1 and ST2. The second memory chip 300 may include a plurality of second-layered edge through vias L2ETHV that penetrate each of the third and fourth stack structures ST3 and ST4. The third memory chip 400 may include a plurality of third-layered edge through vias L3ETHV that penetrate each of the fifth and sixth stack structures ST5 and ST6. The first-, second-, and third-layered edge through vias L1ETHV, L2ETHV, and L3ETHV may be provided to allow the first to sixth stack structures ST1 to ST6 to have connection with at least one memory chip or wiring lines additionally disposed on the third memory chip 400. Other structural features may be identical or similar to those discussed with reference to FIGS. 10 to 12.

Figure 16:
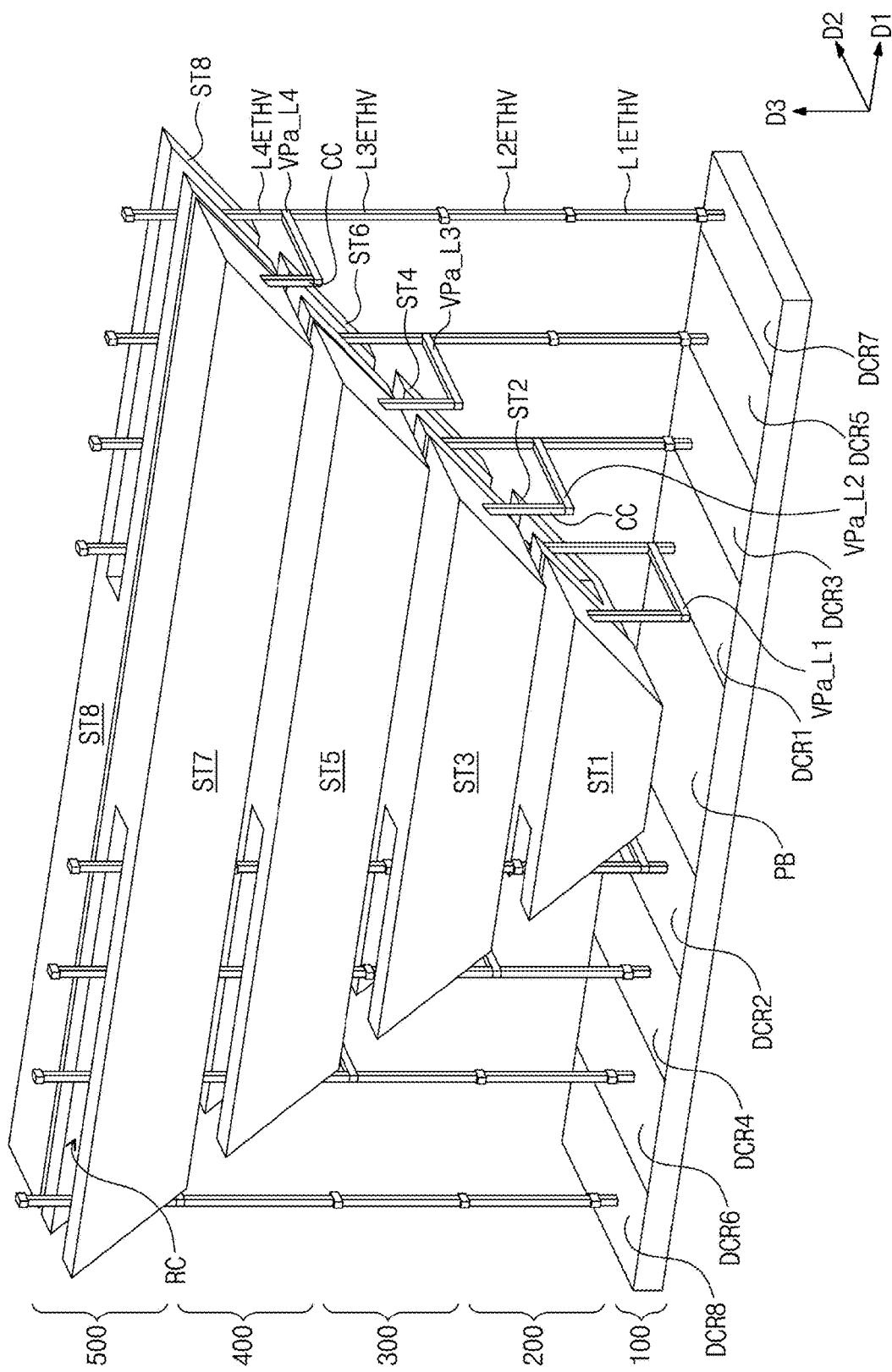
FIG. 16 illustrates a perspective view showing a three-dimensional semiconductor memory device according to some example embodiments of the present inventive concepts.

FIG. 16 illustrates a perspective view showing a three-dimensional semiconductor memory device according to some example embodiments of the present inventive concepts.

Referring to FIG. 16, first, second, third, and fourth memory chips 200, 300, 400, and 500 may be sequentially stacked the logic chip 100. The logic chip 100 may include first to eighth decoder circuit parts DCR1 to DCR8 and a page buffer circuit part PB. The first to eighth decoder circuit parts DCR1 to DCR8 and the page buffer circuit part PB may be spaced part from each other in the first direction D1. The page buffer circuit part PB may be disposed on a central portion of the logic chip 100. The second, fourth, sixth, and eighth decoder circuit parts DCR2, DCR4, DCR6, and DCR8 may be sequentially farther away from one side of the page buffer circuit part PB. The first, third, fifth, and seventh decoder circuit parts DCR1, DCR3, DCR5, and DCR7 may be sequentially farther away from another side of the page buffer circuit part PB.

Likewise that shown in FIG. 2B, each of the first, second, third, and fourth memory chips 200, 300, 400, and 500 may include a first connection region CNR1 and a second connection region CNR2 that are spaced apart from each other in the first direction D1, and may also include a cell array region CAR positioned between the first and second connection regions CNR1 and CNR2. In some example embodiments, the cell array region CAR may overlap the page buffer circuit part PB of the logic chip 100. The first connection region CNR1 may overlap the second, fourth, sixth, and eighth decoder circuit parts DCR2, DCR4, DCR6, and DCR8. The second connection region CNR2 may overlap the first, third, fifth, and seventh decoder circuit parts DCR1, DCR3, DCR5, and DCR7.

The fourth memory chip 500 may include a seventh stack structure ST7 and an eighth stack structure ST8 that are spaced apart from each other in the second direction D2. Each of the seventh and eighth stack structures ST7 and ST8 may have a minimum width parallel to the first direction D1 greater than a maximum width parallel to the first direction D1 of each of the fifth and sixth stack structures ST5 and ST6. The first, third, fifth, and seventh stack structures ST1, ST3, ST5, and ST7 may include recesses RC on the first connection region CNR1. The second, fourth, sixth, and eighth stack structures ST2, ST4, ST6, and ST8 may include recesses RC on the second connection region CNR2. Ones of the recesses RC may correspond to the first to sixth recesses RC1 to RC6 discussed with reference to FIGS. 2A to 15. The fourth memory chip 500 may further include fourth-layered edge through vias L4ETHV. The first to eighth stack structures ST1 to ST8 may have their electrode layers that are electrically connected to the first to eighth decoder circuit parts DCR1 to DCR8 through cell contact plugs CC, first- to fourth-layered electrode connection lines VPa_L1 to VPa_L4, and edge through vias L1ETHV to L4ETHV. The cell contact plugs CC may have their detailed shapes identical or similar to those of the cell contact plugs CC1 to CC6 discussed with reference to FIG. 3A, 3B, 7A, or 13A. The edge through vias L1ETHV to L4ETHV may have their detailed shapes identical or similar to those of the edge through vias ETHV1 and ETHV2 discussed with reference to FIG. 3A, 7A, or 10.

Figure 17:
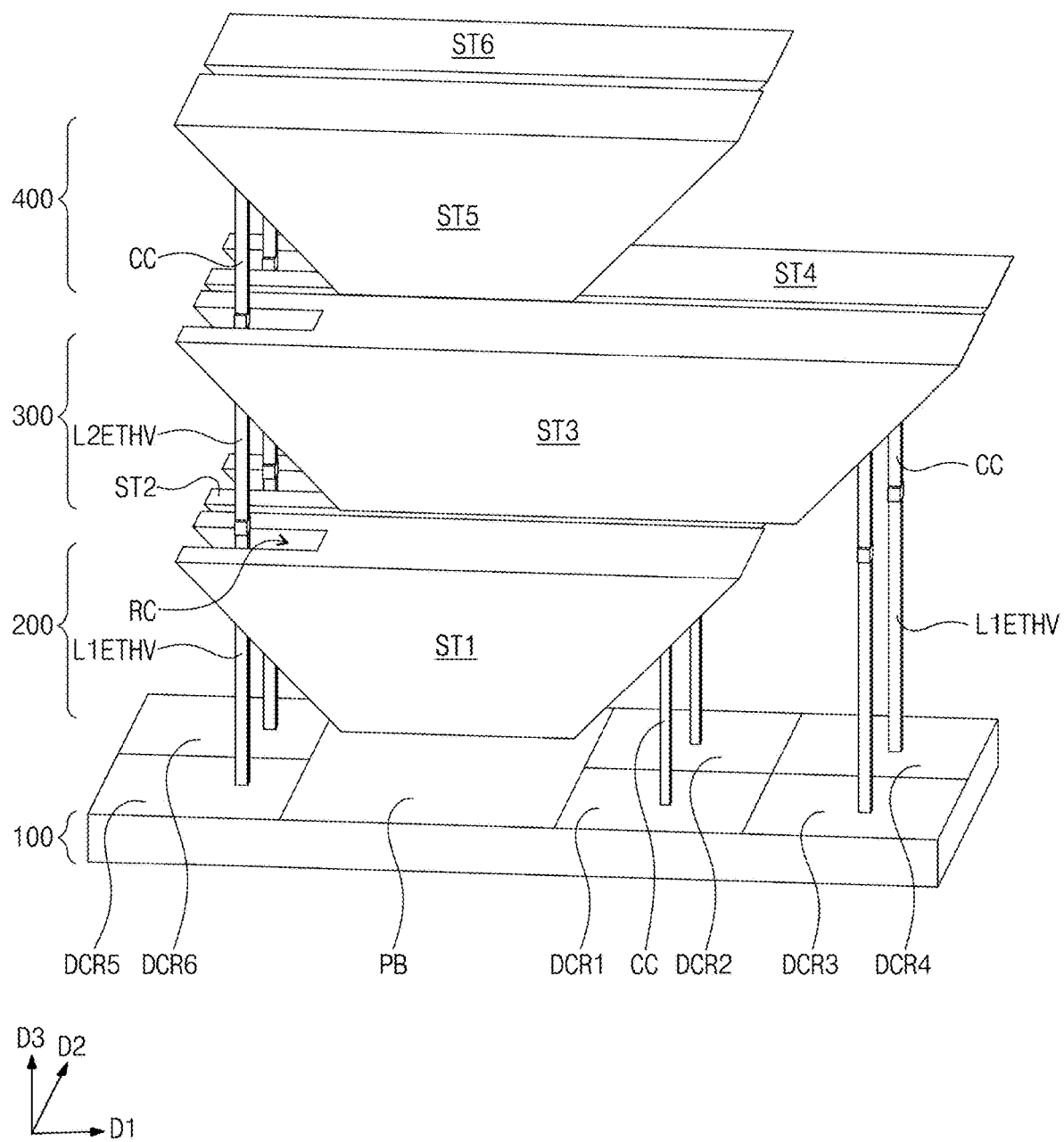
FIG. 17 illustrates a perspective view showing a three-dimensional semiconductor memory device according to some example embodiments of the present inventive concepts.

FIG. 17 illustrates a perspective view showing a three-dimensional semiconductor memory device according to some example embodiments of the present inventive concepts.

Referring to FIG. 17, first, second, and third memory chips 200, 300, and 400 may be sequentially stacked on the logic chip 100. The logic chip 100 may include first to sixth decoder circuit parts DCR1 to DCR6 and a page buffer circuit part PB. The page buffer circuit part PB may be disposed adjacent to a central portion of the logic chip 100. The fifth and sixth decoder circuit parts DCR5 and DCR6 may be disposed adjacent to one side of the page buffer circuit part PB. The fifth and sixth decoder circuit parts DCR5 and DCR6 may be disposed side by side along the second direction D2. The third and fourth decoder circuit parts DCR3 and DCR4 may be spaced apart from the page buffer circuit part PB. The third and fourth decoder circuit parts DCR3 and DCR4 may be disposed side by side along the second direction D2. The first decoder circuit part DCR1 may be disposed between the third decoder circuit part DCR3 and the page buffer circuit part PB. The second decoder circuit part DCR2 may be disposed between the fourth decoder circuit part DCR4 and the page buffer circuit part PB.

Likewise that shown in FIG. 2B, each of the first, second, and third memory chips 200, 300, and 400 may include a first connection region CNR1 and a second connection region CNR2 that are spaced apart from each other in the first direction D1, and may also include a cell array region CAR positioned between the first and second connection regions CNR1 and CNR2. In some example embodiments, the cell array region CAR may overlap the page buffer circuit part PB of the logic chip 100. The first connection region CNR1 may overlap the fifth and sixth decoder circuit parts DCR5 and DCR6. The second connection region CNR2 may overlap the first to fourth decoder circuit parts DCR1 to DCR4.

Each of the first and second stack structures ST1 and ST2 included in the first memory chip 200 may have a width the same as or similar to that of each of the fifth and sixth stack structures ST5 and ST6 included in the third memory chip 400. The third and fourth stack structures ST3 and ST4 included in the second memory chip 300 may have a maximum width greater than that of each of the first and second stack structures ST1 and ST2 included in the first memory chip 200. The third and fourth stack structures ST3 and ST4 of the second memory chip 300 may laterally protrude beyond the first and second stack structures ST1 and ST2 of the first memory chip 200. On the first connection region CNR1, the first, third, and fifth stack structures ST1, ST3, and ST5 may have their ends aligned with each other.

The first to fourth stack structures ST1 to ST4 may all include recesses RC on the first connection region CNR1. Neither the fifth stack structure ST5 nor the sixth stack structure ST6 may have the recesses RC. The first to sixth stack structures ST1 to ST6 may have their electrode layers that are electrically connected to the first to sixth decoder circuit parts DCR1 to DCR6 through the cell contact plugs CC and the edge through vias L1ETHV and L2ETHV.

Figure 18:
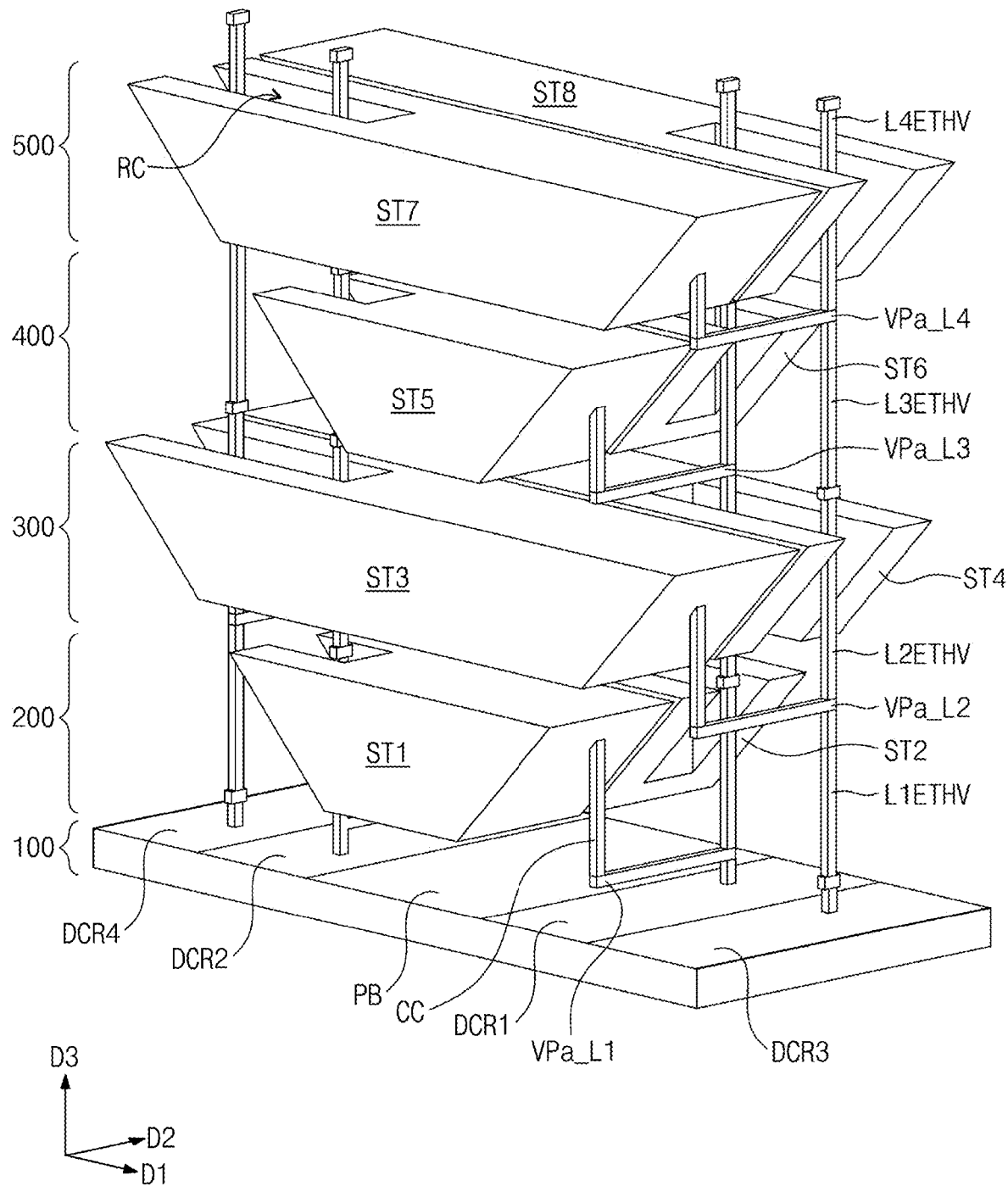
FIG. 18 illustrates a perspective view showing a three-dimensional semiconductor memory device according to some example embodiments of the present inventive concepts.

FIG. 18 illustrates a perspective view showing a three-dimensional semiconductor memory device according to some example embodiments of the present inventive concepts.

Referring to FIG. 18, first, second, third, and fourth memory chips 200, 300, 400, and 500 may be sequentially stacked on the logic chip 100. The logic chip 100 may include first to fourth decoder circuit parts DCR1 to DCR4 and a page buffer circuit part PB. The page buffer circuit part PB may be disposed on central portion of the logic chip 100 or disposed adjacent to the central portion. The second and fourth decoder circuit parts DCR2 and DCR4 may be sequentially farther away from one side of the page buffer circuit part PB. The first and third decoder circuit parts DCR1 and DCR3 may be sequentially farther away from another side of the page buffer circuit part PB.

Likewise that shown in FIG. 2B, each of the first, second, third, and fourth memory chips 200, 300, 400, and 500 may include a first connection region CNR1 and a second connection region CNR2 that are spaced apart from each other in the first direction D1, and may also include a cell array region CAR positioned between the first and second connection regions CNR1 and CNR2. The first connection region CNR1 may overlap the second and fourth decoder circuit parts DCR2 and DCR4. The second connection region CNR2 may overlap the first and third decoder circuit parts DCR1 and DCR3. The first memory chip 200 may include first and second stack structures ST1 and ST2 that have the same structure as or a similar structure to that of fifth and sixth stack structures ST5 and ST6 of the third memory chip 400. The second memory chip 300 may include third and fourth stack structures ST3 and ST4 that have the same structure as or a similar structure to that of seventh and eighth stack structures ST7 and ST8 of the fourth memory chip 500. The first and fifth stack structures ST1 and ST5 may include respective first and fifth electrode layers EL1 and EL5 that are connected in common to the first decoder circuit part DCR1 through the cell contact plugs CC, the first- and third-layered electrode connection lines VPa_L1 and VPa_L3, and the first- and second-layered edge through vias L1ETHV and L2ETHV. For example, the first and fifth stack structures ST1 and ST5 may simultaneously or contemporaneously operate like one memory block. The third and seventh stack structures ST3 and ST7 may include respective third and seventh electrode layers EL3 and EL7 that are connected in common to the third decoder circuit part DCR3 through the cell contact plugs CC, the second- and fourth-layered electrode connection lines VPa_L2 and VPa_L4, and the first-, second-, and third-layered edge through vias L1ETHV, L2ETHV, and L3ETHV. For example, the third and seventh stack structures ST3 and ST7 may simultaneously or contemporaneously operate like one memory block.

Likewise, the second and sixth stack structures ST2 and ST6 may include respective second and sixth electrode layers EL2 and EL6 that are connected in common to the second decoder circuit part DCR2 through the cell contact plugs CC and the first- and second-layered edge through vias L1ETHV and L2ETHV. For example, the second and sixth stack structures ST2 and ST6 may simultaneously or contemporaneously operate like one memory block. The fourth and eighth stack structures ST4 and ST8 may include respective fourth and eighth electrode layers EL4 and EL8 that are connected in common to the fourth decoder circuit part DCR4 through the cell contact plugs CC and the first-, second-, and third-layered edge through vias L1ETHV, L2ETHV, and L3ETHV. For example, the fourth and eighth stack structures ST4 and ST8 may simultaneously or contemporaneously operate like one memory block. A semiconductor memory device according to some example embodiments may be configured such that one decoder circuit part is connected to both two stack structures, and thus the number of decoder circuit parts may be decreased to reduce a size of the logic chip 100.

Furthermore, when additional memory chips are stacked on the fourth memory chip 500 of FIG. 18, stack structures of odd-numbered memory chips may be connected to each other, and stack structures of even-numbered memory chips may be connected to each other.

Figure 19:
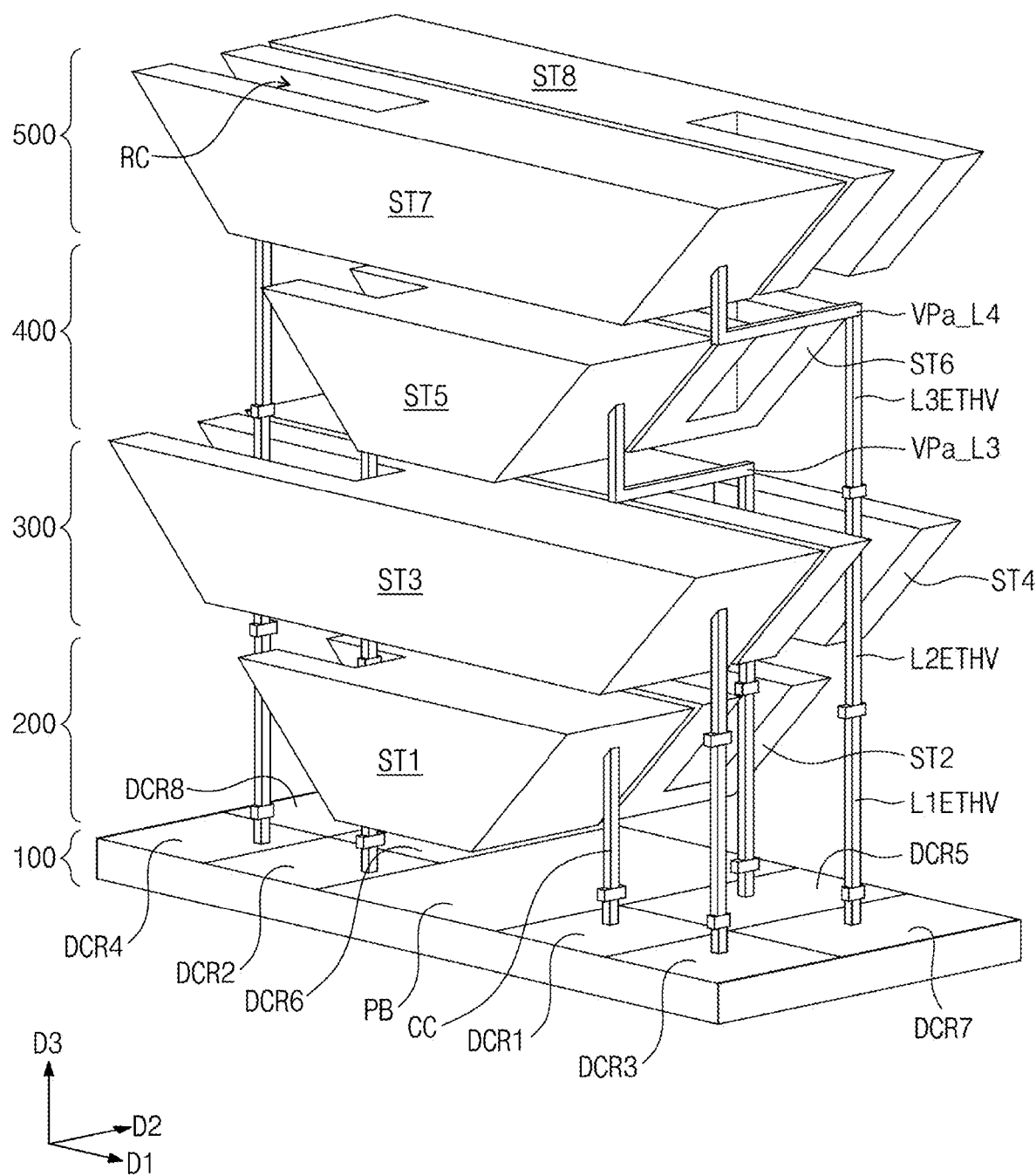
FIG. 19 illustrates a perspective view showing a three-dimensional semiconductor memory device according to some example embodiments of the present inventive concepts.

FIG. 19 illustrates a perspective view showing a three-dimensional semiconductor memory device according to some example embodiments of the present inventive concepts.

Referring to FIG. 19, first, second, third, and fourth memory chips 200, 300, 400, and 500 may be sequentially stacked on the logic chip 100. The logic chip 100 may include first to eighth decoder circuit parts DCR1 to DCR8 and a page buffer circuit part PB. The page buffer circuit part PB may be disposed on a central portion of the logic chip 100 or placed adjacent to the central portion. The fourth and eighth decoder circuit parts DCR4 and DCR8 may be spaced apart from one side of the page buffer circuit part PB and may be disposed side by side in the second direction D2. The second decoder circuit part DCR2 may be disposed between the fourth decoder circuit part DCR4 and the one side of the page buffer circuit part PB. The sixth decoder circuit part DCR6 may be disposed between the eighth decoder circuit part DCR8 and the one side of the page buffer circuit part PB.

The third and seventh decoder circuit parts DCR3 and DCR7 may be spaced apart from another side of the page buffer circuit part PB and may be disposed side by side in the second direction D2. The first decoder circuit part DCR1 may be disposed between the third decoder circuit part DCR3 and the other side of the page buffer circuit part PB, wherein the other side is opposite to the one side of the page buffer circuit part PB. The fifth decoder circuit part DCR5 may be disposed between the seventh decoder circuit part DCR7 and the other side of the page buffer circuit part PB.

Likewise that shown in FIG. 2B, each of the first, second, third, and fourth memory chips 200, 300, 400, and 500 may include a first connection region CNR1 and a second connection region CNR2 that are spaced apart from each other in the first direction D1, and may also include a cell array region CAR positioned between the first and second connection regions CNR1 and CNR2. The first connection region CNR1 may overlap the second, fourth, sixth, and eighth decoder circuit parts DCR2, DCR4, DCR6, and DCR8. The second connection region CNR2 may overlap the first, third, fifth, and seventh decoder circuit parts DCR1, DCR3, DCR5, and DCR7.

The first, third, fifth, and seventh stack structures ST1, ST3, ST5, and ST7 may have recesses RC on the first connection region CNR1. The second, fourth, sixth, and eighth stack structures ST2, ST4, ST6, and ST8 may have recesses RC on the second connection region CNR2. The first to eighth stack structures ST1 to ST8 may be correspondingly connected to the first to eighth decoder circuit parts DCR1 to DCR8 through the cell contact plugs CC and the edge through vias L1ETHV to L3ETHV.

Figure 20:
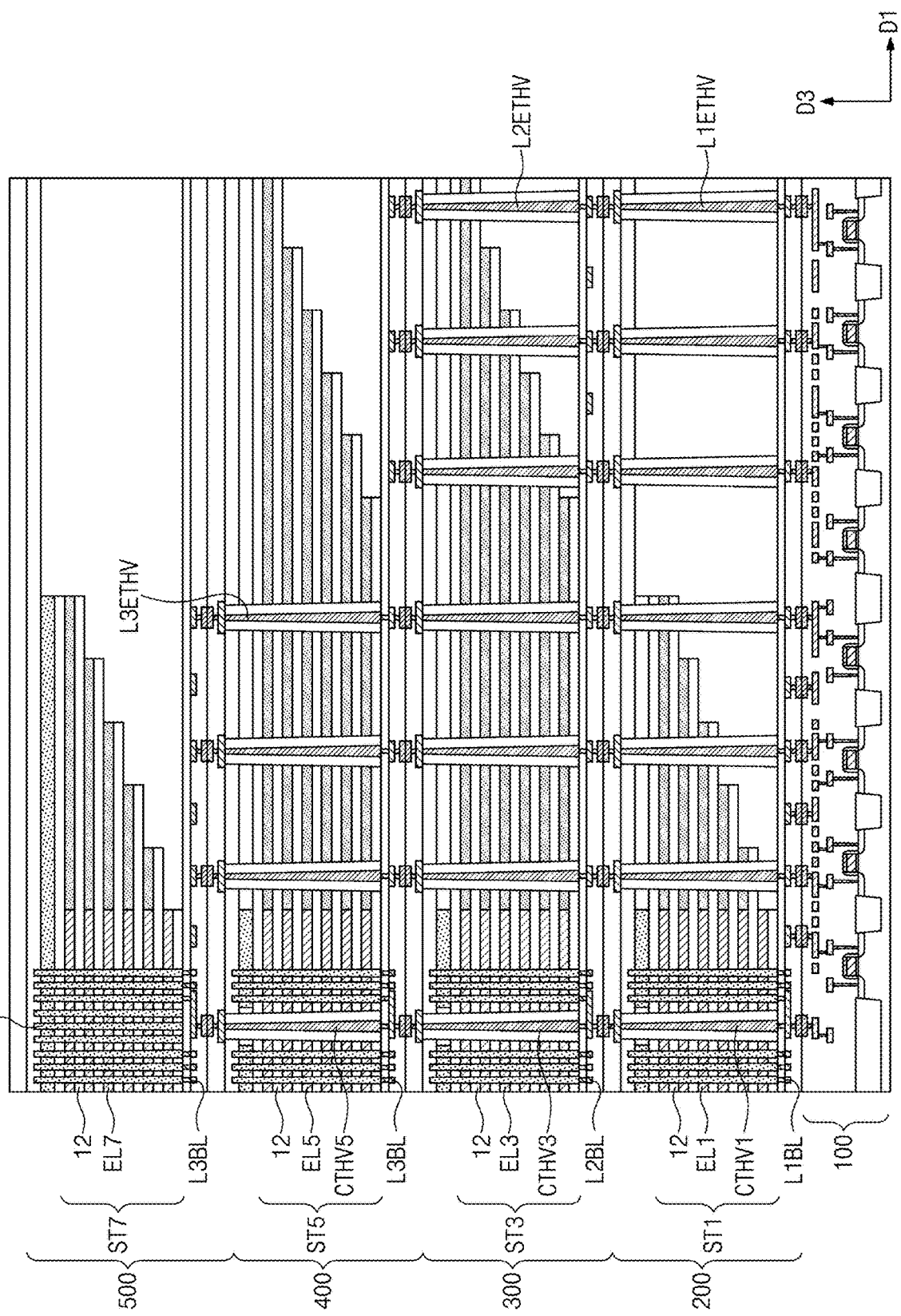
FIG. 20 illustrates a cross-sectional view showing a three-dimensional semiconductor memory device according to some example embodiments of the present inventive concepts.

FIG. 20 illustrates a cross-sectional view showing a three-dimensional semiconductor memory device according to some example embodiments of the present inventive concepts.

Referring to FIG. 20, first, second, third, and fourth memory chips 200, 300, 400, and 500 may be sequentially stacked on the logic chip 100. The first memory chip 200 may include a first cell through via CTHV1 and first-layered edge through vias L1ETHV. The second memory chip 300 may include a second cell through via CTHV2 and second-layered edge through vias L2ETHV. The third memory chip 400 may include a third cell through via CTHV3 and third-layered edge through vias L3ETHV. As shown in FIG. 20, when no additional memory chip is disposed on the fourth memory chip 500, or when no additional electrical connection is desired on a top surface of the fourth memory chip 500, the fourth memory chip 500 may not include a cell through via or edge through vias. Other structural features may be identical or similar to those discussed above.

Figure 21:
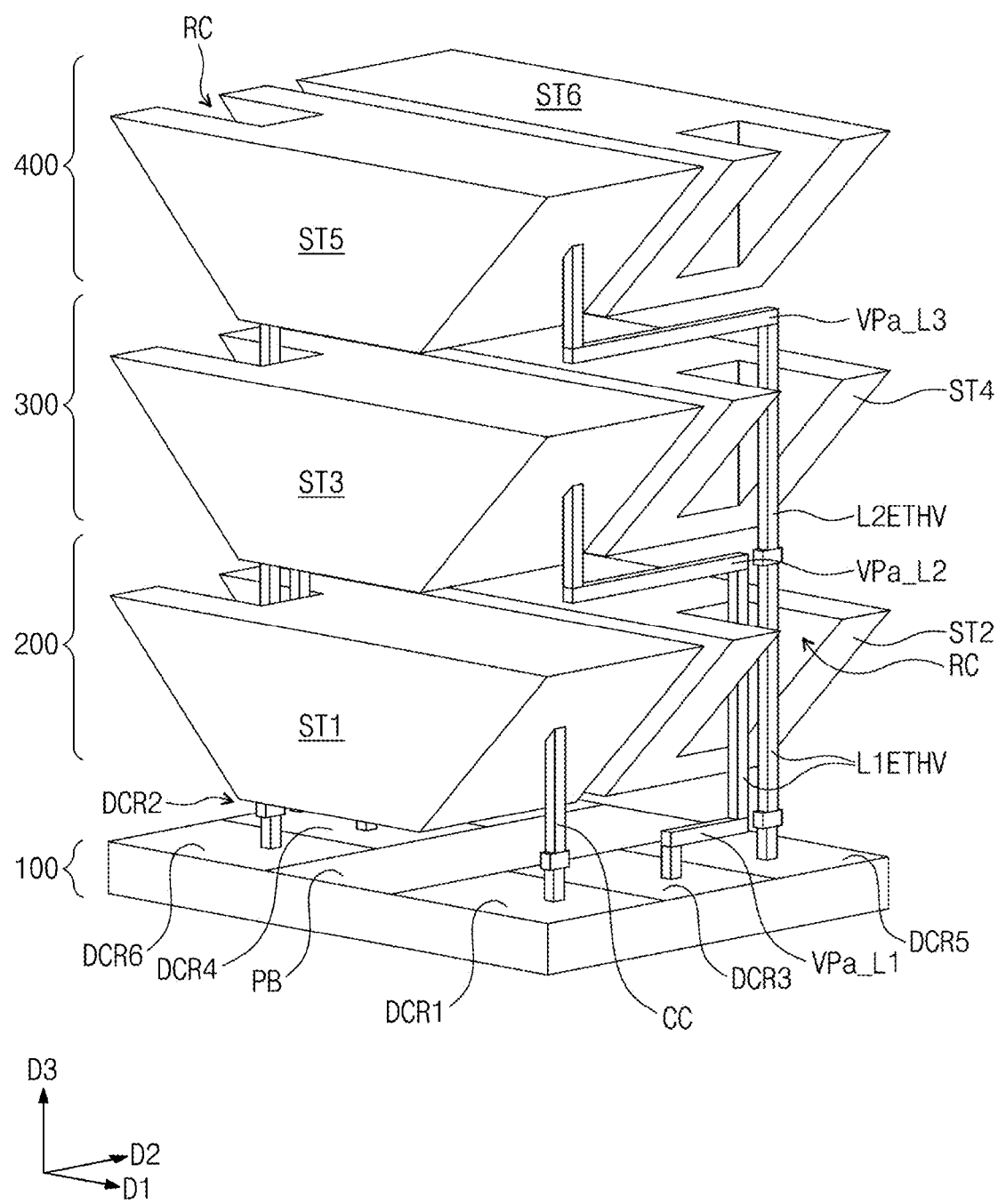
FIG. 21 illustrates a perspective view showing a three-dimensional semiconductor memory device according to some example embodiments of the present inventive concepts.

FIG. 21 illustrates a perspective view showing a three-dimensional semiconductor memory device according to some example embodiments of the present inventive concepts.

Referring to FIG. 21, first, second, and third memory chips 200, 300, and 400 may be sequentially stacked on the logic chip 100. The logic chip 100 may include first to sixth decoder circuit parts DCR1 to DCR6 and a page buffer circuit part PB. The page buffer circuit part PB may be disposed on a central portion of the logic chip 100 or placed adjacent to the central portion. The second, fourth, and sixth decoder circuit parts DCR2, DCR4, and DCR6 may be adjacent to one side of the page buffer circuit part PB. The second decoder circuit part DCR2 may be positioned below a distal end of the second stack structure ST2. The second, fourth, and sixth decoder circuit parts DCR2, DCR4, and DCR6 may be sequentially disposed side by side along a direction opposite to the second direction D2. The first, third, and fifth decoder circuit parts DCR1, DCR3, and DCR5 may be adjacent to another side of the page buffer circuit part PB. The first, third, and fifth decoder circuit parts DCR1, DCR3, and DCR5 may be sequentially disposed side by side along the second direction D2.

Likewise that shown in FIG. 2B, each of the first, second, and third memory chips 200, 300, and 400 may include a first connection region CNR1 and a second connection region CNR2 that are spaced apart from each other in the first direction D1, and may also include a cell array region CAR positioned between the first and second connection regions CNR1 and CNR2. The first connection region CNR1 may overlap the second, fourth, and sixth decoder circuit parts DCR2, DCR4, and DCR6. The second connection region CNR2 may overlap the first, third, and fifth decoder circuit parts DCR1, DCR3, and DCR5.

The first, third, and fifth stack structures ST1, ST3, and ST5 may include recesses RC on the first connection region CNR1 and may have the same shape as or a similar shape to each other. The second, fourth, and sixth stack structures ST2, ST4, and ST6 may include recesses RC on the second connection region CNR2 and may have the same shape as or a similar shape to each other. The second, fourth, sixth stack structures ST2, ST4, and ST6 may have their shapes obtained when the first, third, and fifth stack structures ST1, ST3, and ST5 rotate about 180 degrees, respectively. The first to sixth stack structures ST1 to ST6 may be correspondingly connected to the first to sixth decoder circuit parts DCR1 to DCR6 through the cell contact plugs CC and the edge through vias L1ETHV and L2ETHV. One recess RC may have therein the first-layered edge through vias L1ETHV that connect to each other different stack structures (e.g., the first and third stack structures ST1 and ST3).

Figure 22A:
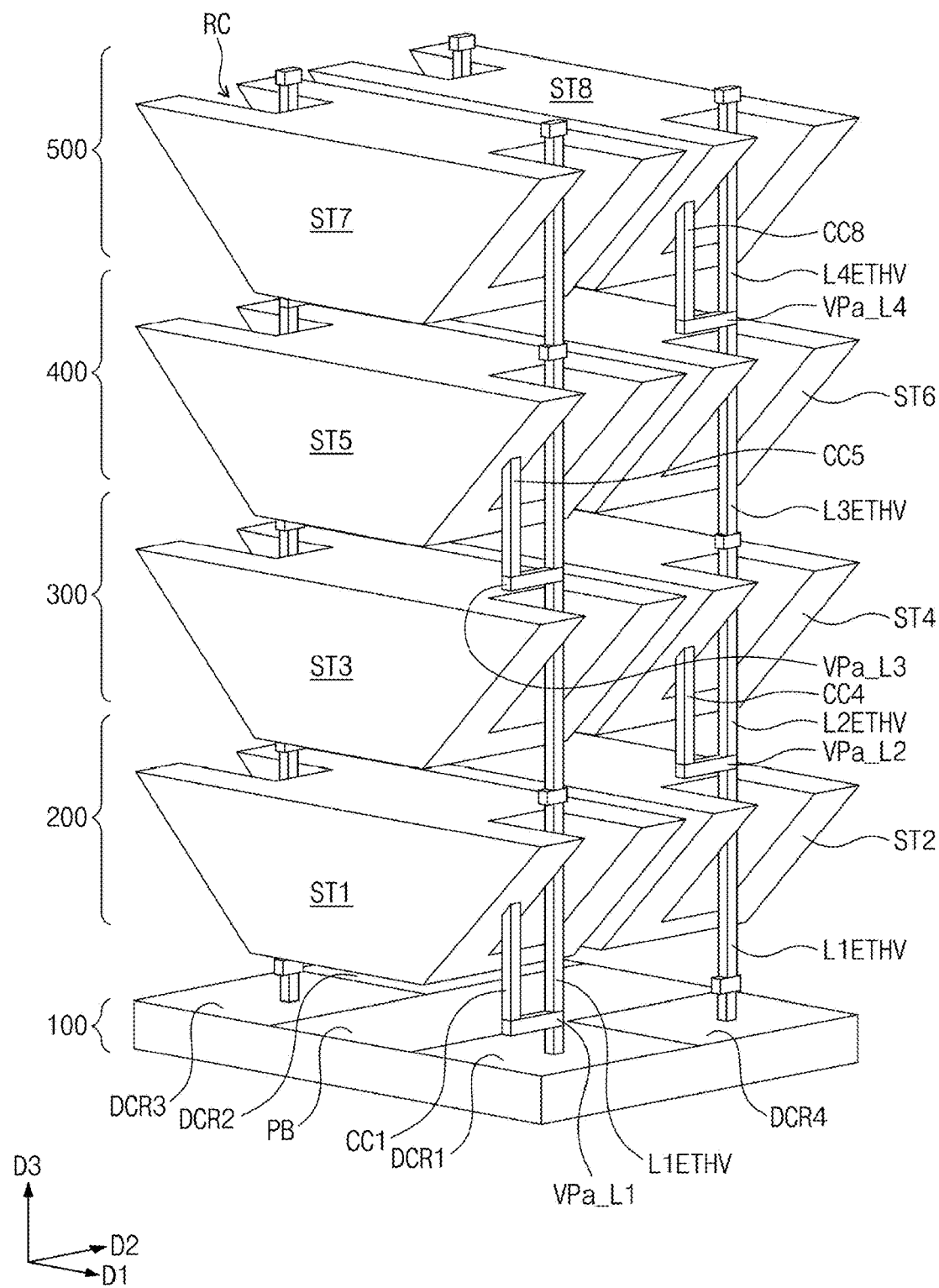
FIG. 22A illustrates a perspective view showing a three-dimensional semiconductor memory device according to some example embodiments of the present inventive concepts.
Figure 22C:
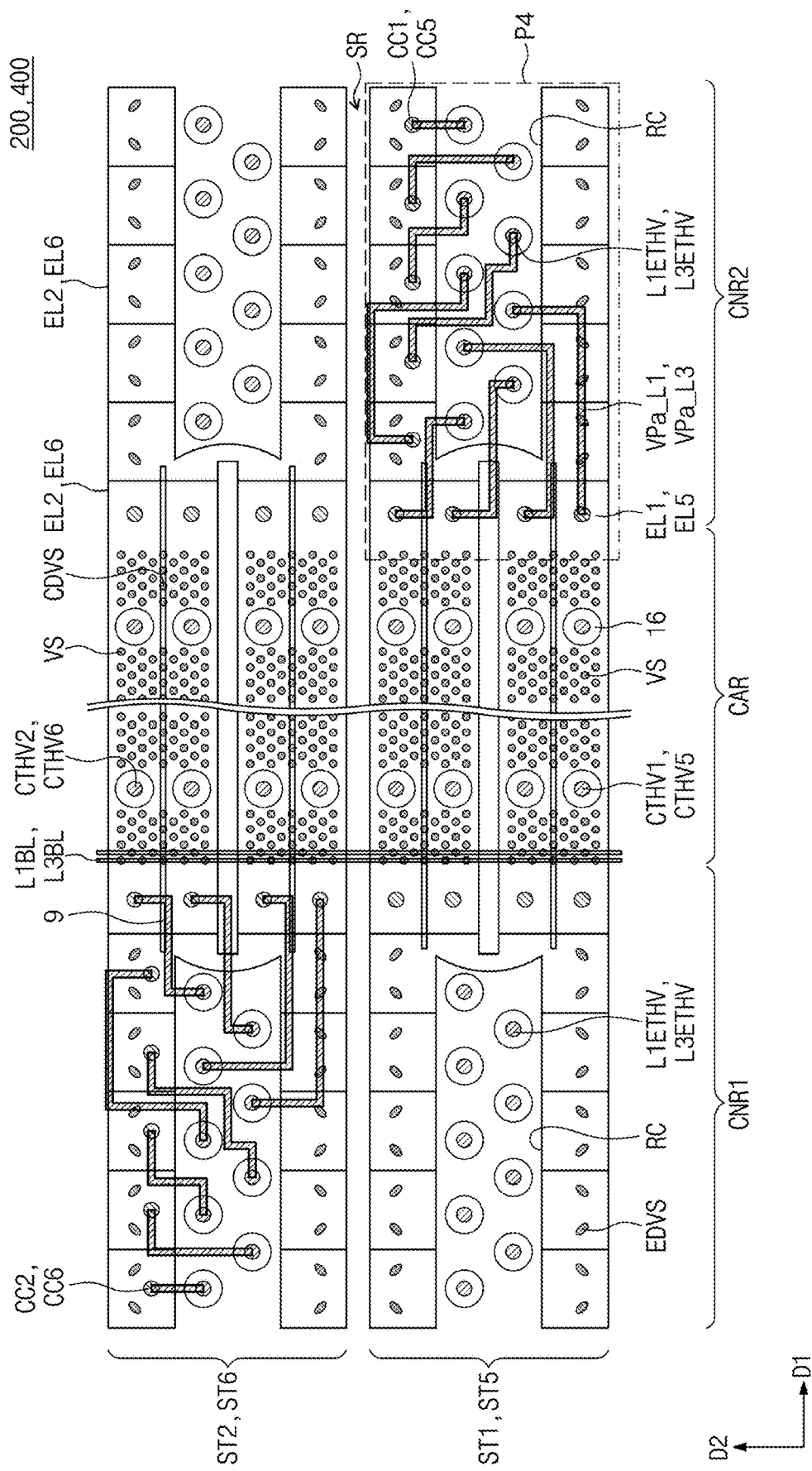
FIG. 22C illustrates a plan view showing first and third memory chips included in the three-dimensional semiconductor memory device of FIG. 22A.
Figure 22D:
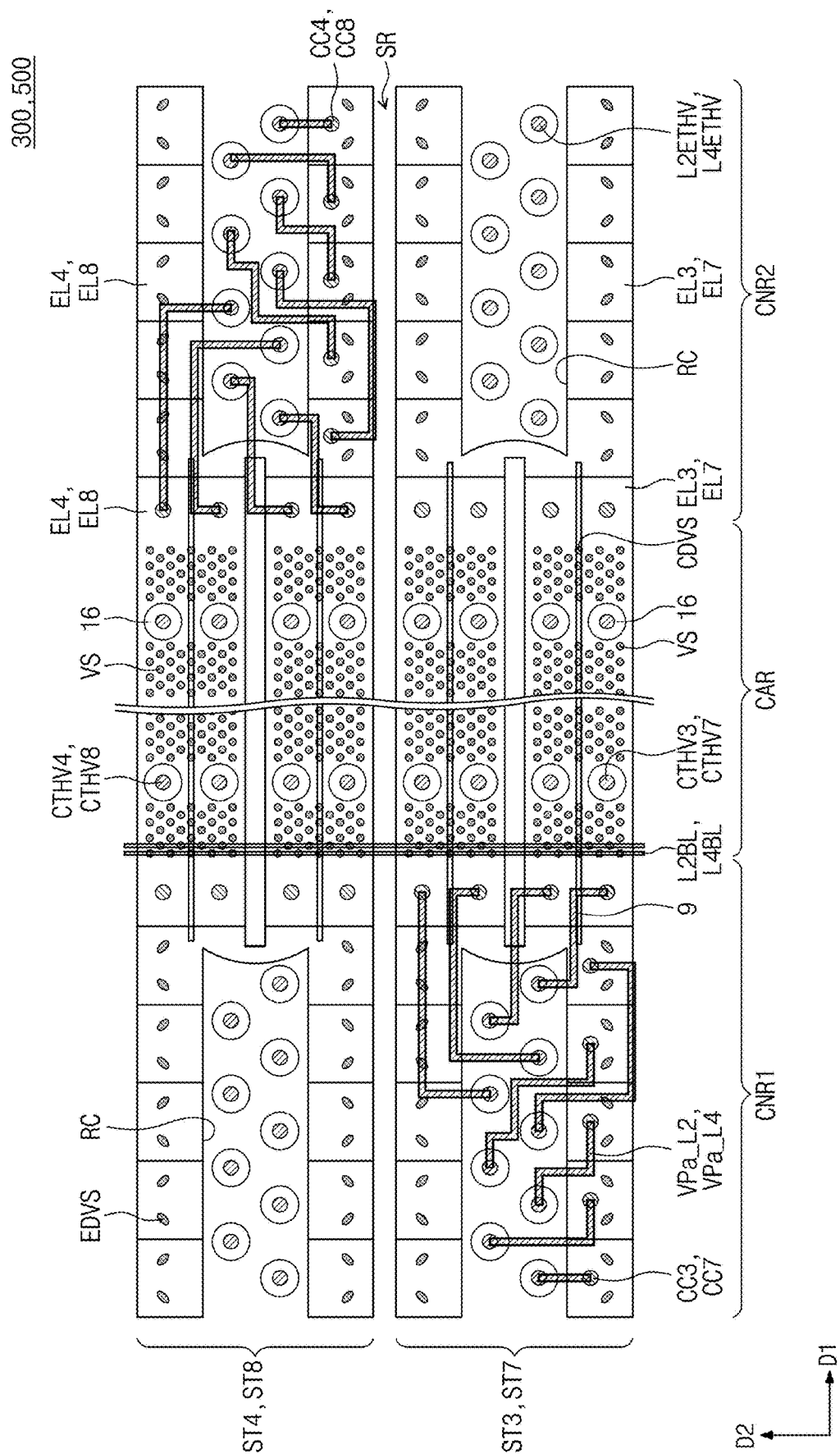
FIG. 22D illustrates a plan view showing second and fourth memory chips included in the three-dimensional semiconductor memory device of FIG. 22A.
Figure 22E:
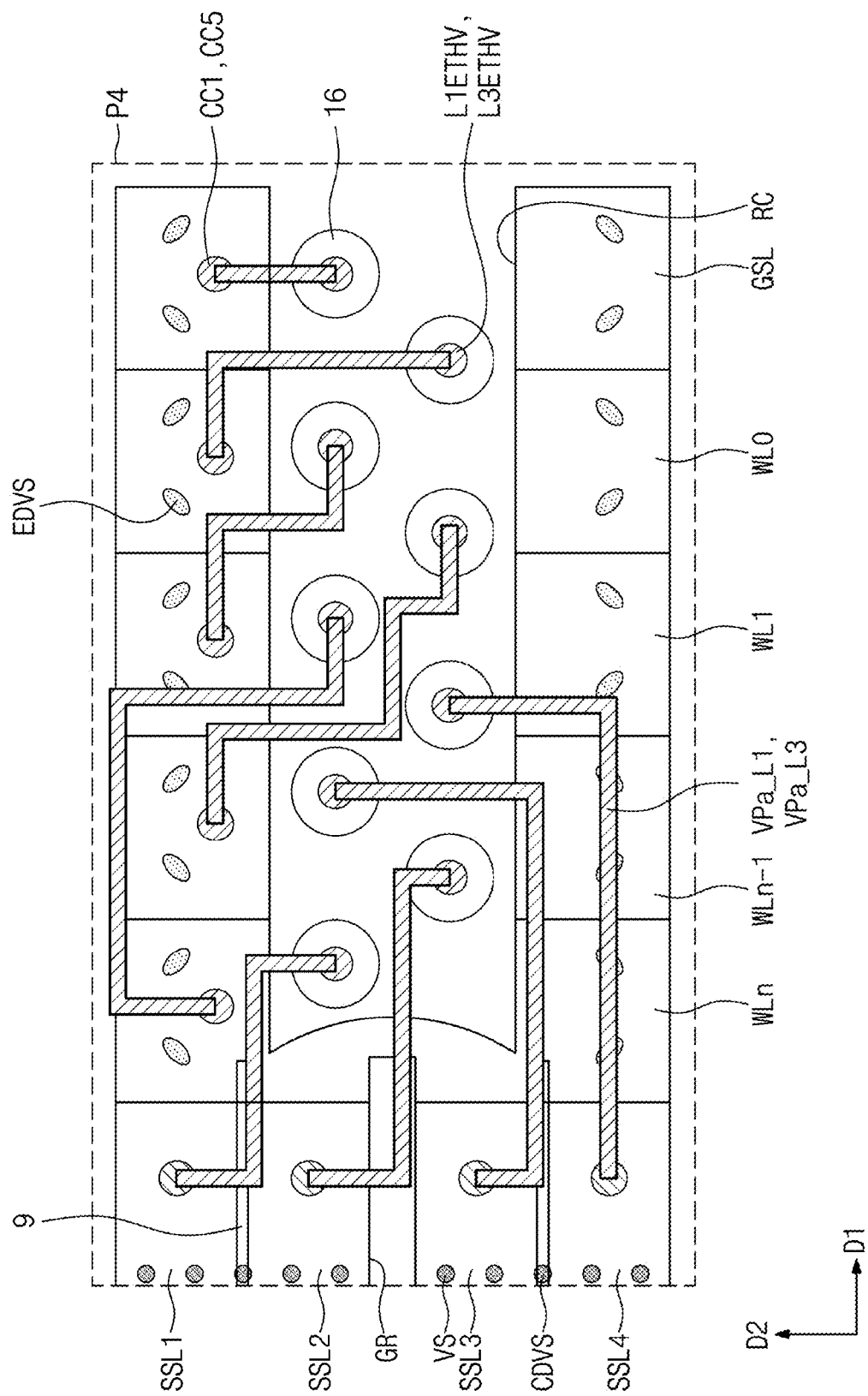
FIG. 22E illustrates an enlarged plan view showing section P4 of FIG. 22C.
Figure 22F:
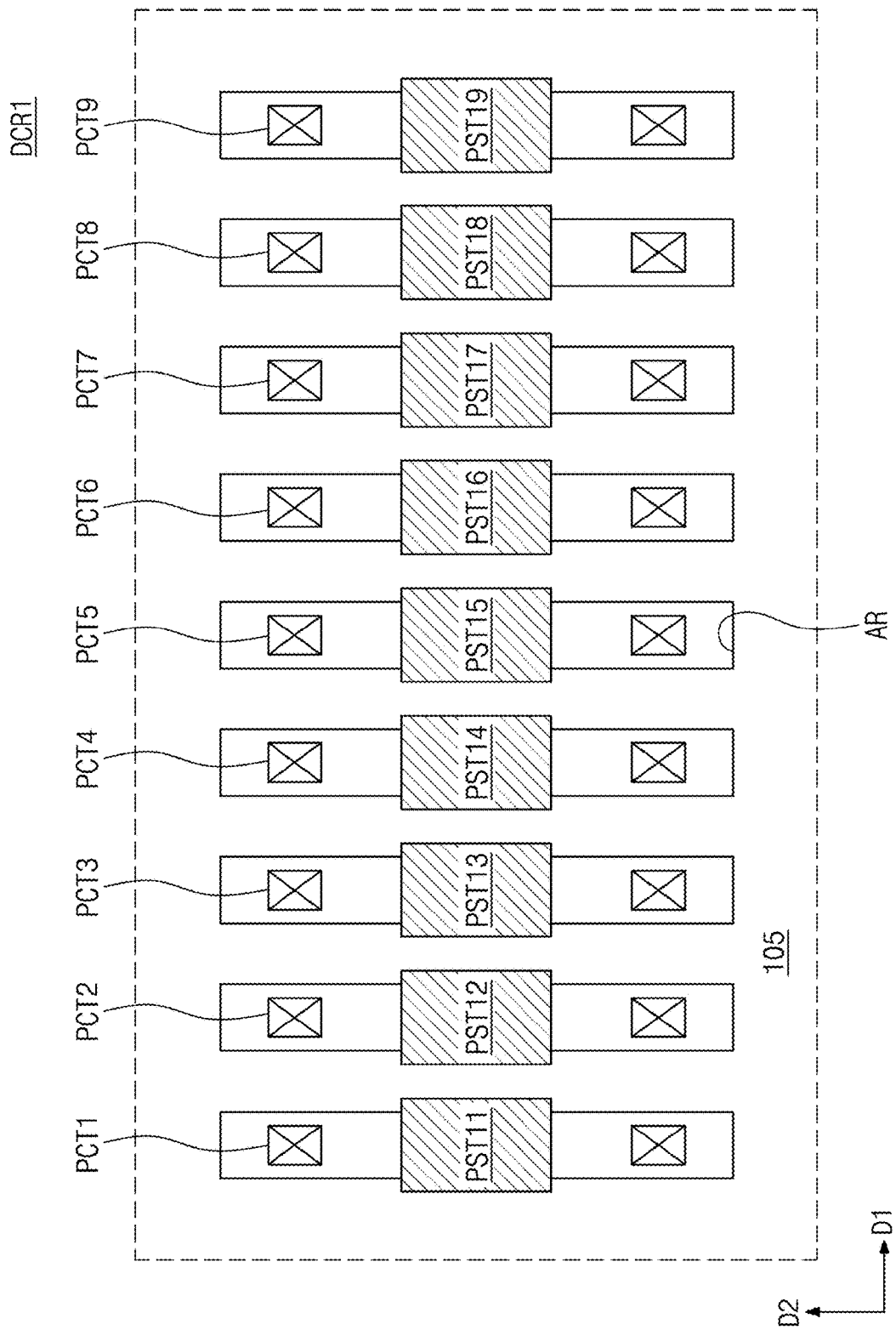
FIG. 22F illustrates an enlarged plan view showing a first decoder circuit part of FIG. 22B.

FIG. 22A illustrates a perspective view showing a three-dimensional semiconductor memory device according to some example embodiments of the present inventive concepts. FIG. 22B illustrates a plan view showing a logic chip included in the three-dimensional semiconductor memory device of FIG. 22A. FIG. 22C illustrates a plan view showing first and third memory chips included in the three-dimensional semiconductor memory device of FIG. 22A. FIG. 22D illustrates a plan view showing second and fourth memory chips included in the three-dimensional semiconductor memory device of FIG. 22A. FIG. 22E illustrates an enlarged view showing section P4 of FIG. 22C. FIG. 22F illustrates an enlarged plan view showing a first decoder circuit part of FIG. 22B.

Referring to FIGS. 22A to 22F, first, second, third, and fourth memory chips 200, 300, 400, and 500 may be sequentially stacked on the logic chip 100. The logic chip 100 may include first to fourth decoder circuit parts DCR1 to DCR4 and a page buffer circuit part PB. The page buffer circuit part PB may be disposed on a central portion of the logic chip 100 or placed adjacent to the central portion. The first and fourth decoder circuit parts DCR1 and DCR4 may be adjacent to one side of the page buffer circuit part PB. The first and fourth decoder circuit parts DCR1 and DCR4 may be sequentially disposed side by side in the second direction D2. The second and third decoder circuit parts DCR2 and DCR3 may be adjacent to another side of the page buffer circuit part PB. The second and third decoder circuit parts DCR2 and DCR3 may be sequentially disposed side by side in a direction opposite to the second direction D2.

Likewise that shown in FIG. 2B, each of the first, second, third, and fourth memory chips 200, 300, 400, and 500 may include a first connection region CNR1 and a second connection region CNR2 that are spaced apart from each other in the first direction D1, and may also include a cell array region CAR positioned between the first and second connection regions CNR1 and CNR2. The first connection region CNR1 may overlap the first and fourth decoder circuit parts DCR1 and DCR4. The second connection region CNR2 may overlap the second and third decoder circuit parts DCR2 and DCR3.

The first electrode layers EL1 of the first stack structure ST1 included in the first memory chip 200 may be electrically connected to the first decoder circuit part DCR1 through the first cell contact plugs CC1 and first-layered electrode connection lines VPa_L1. The fifth electrode layers EL5 of the fifth stack structure ST5 included in the third memory chip 400 may be electrically connected to the first decoder circuit part DCR1 through the fifth cell contact plugs CC5, third-layered electrode connection lines VPa_L3, the second-layered edge through vias L2ETHV, and the first-layered edge through vias L1ETHV.

Similarly, the second electrode layers EL2 of the second stack structure ST2 included in the first memory chip 200 may be electrically connected to the second decoder circuit part DCR2, and the sixth electrode layers EL6 of the sixth stack structure ST6 included in the third memory chip 400 may be electrically connected to the second decoder circuit part DCR2.

The fourth electrode layers EL4 of the fourth stack structure ST4 included in the second memory chip 300 may be electrically connected to the fourth decoder circuit part DCR4 through the fourth cell contact plugs CC4, second-layered electrode connection lines VPa_L2, and the first-layered edge through vias L1ETHV. The eighth electrode layers EL8 of the eighth stack structure ST8 included in the fourth memory chip 500 may be electrically connected to the fourth decoder circuit part DCR4 through the eighth cell contact plugs CC8, fourth-layered electrode connection lines VPa_L4, the third-layered edge through vias L3ETHV, the second-layered edge through vias L2ETHV, and the first-layered edge through vias L1ETHV.

Similarly, the third electrode layers EL3 of the third stack structure ST3 included in the second memory chip 300 may be electrically connected to the third decoder circuit part DCR3, and the seventh electrode layers EL7 of the seventh stack structure ST7 included in the fourth memory chip 500 may be electrically connected to the third decoder circuit part DCR3.

Referring to FIGS. 22C, 22D, and 22E, the electrode connection lines VPa_L1 to VPa_L4 may allow the electrode layers EL1 to EL8 of the stack structures ST1 to ST8 to have connection with corresponding edge through vias L1ETHV to L4ETHV. When viewed in plan, the electrode connection lines VPa_L1 to VPa_L4 may be I-shaped, L-shaped, C-shaped, N-shaped, or W-shaped, but any other suitable shape may be possible as desired.

Referring to FIGS. 22A and 22E, the first electrode layers EL1 may include first to fourth string selection lines SSL1 to SSL4 closest to the logic chip 100. The first to fourth string selection lines SSL1 to SSL4 may be spaced apart from each other in the second direction D2. The first electrode layers EL1 may include a ground selection line GSL farthest away from the logic chip 100. The first electrode layers EL1 may include word lines WL0 to WLn positioned between the ground selection line GSL and the string selection lines SSL1 to SSL4. The string selection lines SSL1 to SSL4, the word lines WL0 to WLn, and the ground selection line GSL may be one-to-one connected through the first-layered electrode connection lines VPa_L1 to the first-layered edge through vias L1ETHV.

Referring to FIG. 22F, the first decoder circuit part DCR1 may include, for example, pass transistors PST11 to PST19. Active regions AR may be limited by the device isolation layer 105 disposed in the logic substrate (see 103 of FIG. 3A). The pass transistors PST11 to PST19 may be disposed on corresponding active regions AR. The first decoder circuit part DCR1 may be configured such that the active region AR has a source/drain region at its portion on one side of a corresponding one of the pass transistors PST11 to PST19. First to ninth peripheral contact plugs PCT1 to PCT9 may be disposed on corresponding source/drain regions.

Referring to FIGS. 22E and 22F, the first string selection line SSL1 may be electrically connected to the source/drain region of the pass transistor PST11 through one of the first cell contact plugs CC1, one of the first-layered electrode connection lines VPa_L1, and the first peripheral contact plug PCT1. Likewise, the second to fourth string selection lines SSL2 to SSL4 may be electrically connected to corresponding source/drain regions of the pass transistors PST12 to PST14 through the second to fourth peripheral contact plugs PCT2 to PCT4. Similarly, the word lines WL0 to WLn may be electrically connected to corresponding source/drain regions of the pass transistors PST15 to PST18 through the fifth to eighth peripheral contact plugs PCT5 to PCT8. In addition, the ground selection line GSL may be electrically connected through the ninth peripheral contact plug PCT9 to the source/drain region of the pass transistor PST19.

Referring to FIGS. 22C, 22D, and 22E, the fifth electrode layers EL5 may include string selection lines SSL1 to SSL4, word lines WL0 to WLn, and a ground selection line GSL. The fifth electrode layers EL5 (e.g., the string selection lines SSL1 to SSL4, the word lines WL0 to WLn, and the ground selection line GSL that are included in the fifth stack structure ST5) may be one-to-one connected to the first to ninth peripheral contact plugs PCT1 to PCT9 of the first decoder circuit part DCR1 through the fifth cell contact plugs CC5, the third-layered electrode connection lines VPa_L3, and the third-layered edge through vias L3ETHV.

Likewise, the second electrode layers EL2 may include string selection lines SSL1 to SSL4, word lines WL0 to WLn, and a ground selection line GSL, and this description may hold true for the third to eighth electrode layers EL3 to EL8. The string selection lines SSL1 to SSL4, the word lines WL0 to WLn, and the ground selection line GSL included in the second electrode layers EL2 may be electrically connected to corresponding source/drain regions of pass transistors disposed on the second decoder circuit part DCR2, and this description may hold true for the sixth electrode layers EL6. The string selection lines SSL1 to SSL4, the word lines WL0 to WLn, and the ground selection line GSL included in the third electrode layers EL3 may be electrically connected to corresponding source/drain regions of pass transistors disposed on the third decoder circuit part DCR3, and this description may hold true for the seventh electrode layers EL7. The string selection lines SSL1 to SSL4, the word lines WL0 to WLn, and the ground selection line GSL included in the fourth electrode layers EL4 may be electrically connected to corresponding source/drain regions of pass transistors disposed on the fourth decoder circuit part DCR4, and this description may hold true for the eighth electrode layers EL8.

Figure 23:
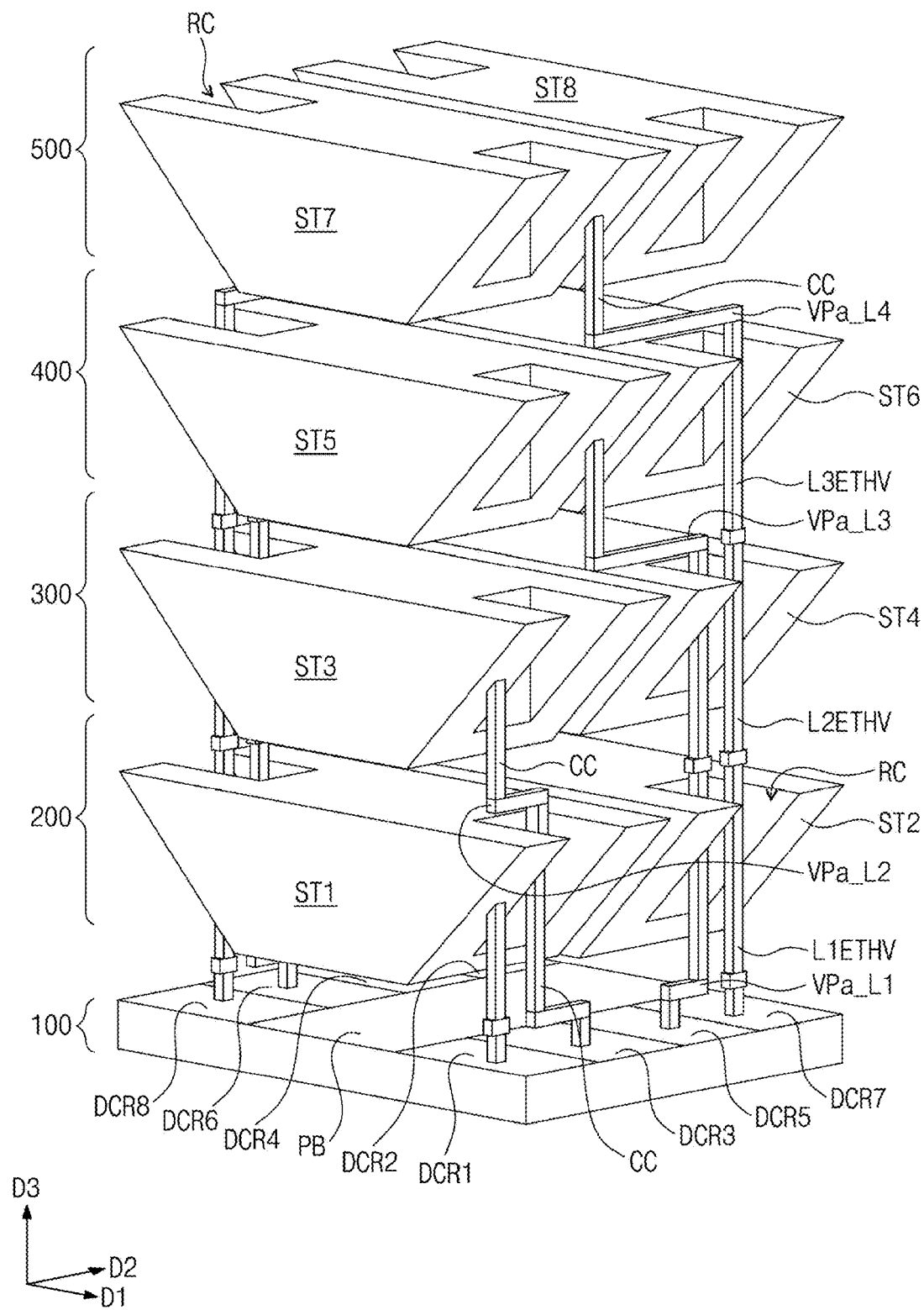
FIG. 23 illustrates a perspective view showing a three-dimensional semiconductor memory device according to some example embodiments of the present inventive concepts.

FIG. 23 illustrates a perspective view showing a three-dimensional semiconductor memory device according to some example embodiments of the present inventive concepts.

Referring to FIG. 23, first, second, third, and fourth memory chips 200, 300, 400, and 500 may be sequentially stacked on the logic chip 100. The logic chip 100 may include first to eighth decoder circuit parts DCR1 to DCR8 and a page buffer circuit part PB. The page buffer circuit part PB may be disposed on a central portion of the logic chip 100 or placed adjacent to the central portion. The second, fourth, sixth, and eighth decoder circuit parts DCR2, DCR4, DCR6, and DCR8 may be adjacent to one side of the page buffer circuit part PB. The second, fourth, sixth, and eighth decoder circuit parts DCR2, DCR4, DCR6, and DCR8 may be sequentially arranged in a direction opposite to the second direction D2. The first, third, fifth, and seventh decoder circuit parts DCR1, DCR3, DCR5, and DCR7 may be adjacent to another side of the page buffer circuit part PB. The first, third, fifth, and seventh decoder circuit parts DCR1, DCR3, DCR5, and DCR7 may be sequentially arranged in the second direction D2.

Likewise that shown in FIG. 2B, each of the first, second, third, and fourth memory chips 200, 300, 400, and 500 may include a first connection region CNR1 and a second connection region CNR2 that are spaced apart from each other in the first direction D1, and may also include a cell array region CAR positioned between the first and second connection regions CNR1 and CNR2. The first connection region CNR1 may overlap the second, fourth, sixth, and eighth decoder circuit parts DCR2, DCR4, DCR6, and DCR8. The second connection region CNR2 may overlap the first, third, fifth, and seventh decoder circuit parts DCR1, DCR3, DCR5, and DCR7.

The first to eighth stack structures ST1 to ST8 may be correspondingly connected to the first to eighth decoder circuit parts DCR1 to DCR8 through the cell contact plugs CC and the edge through vias L1ETHV to L3ETHV.

Figure 24:
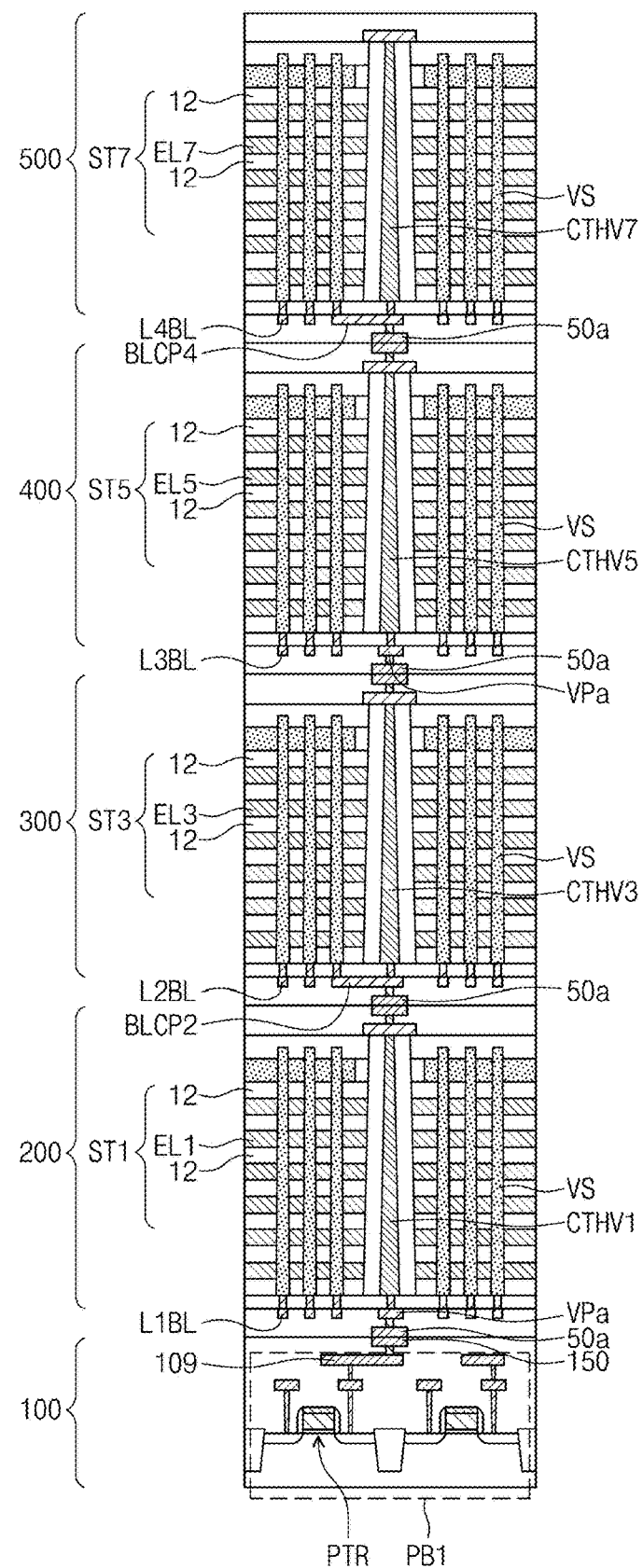
FIGS. 24 and 25 illustrate cross-sectional views showing a three-dimensional semiconductor memory device according to some example embodiments of the present inventive concepts.
Figure 25:
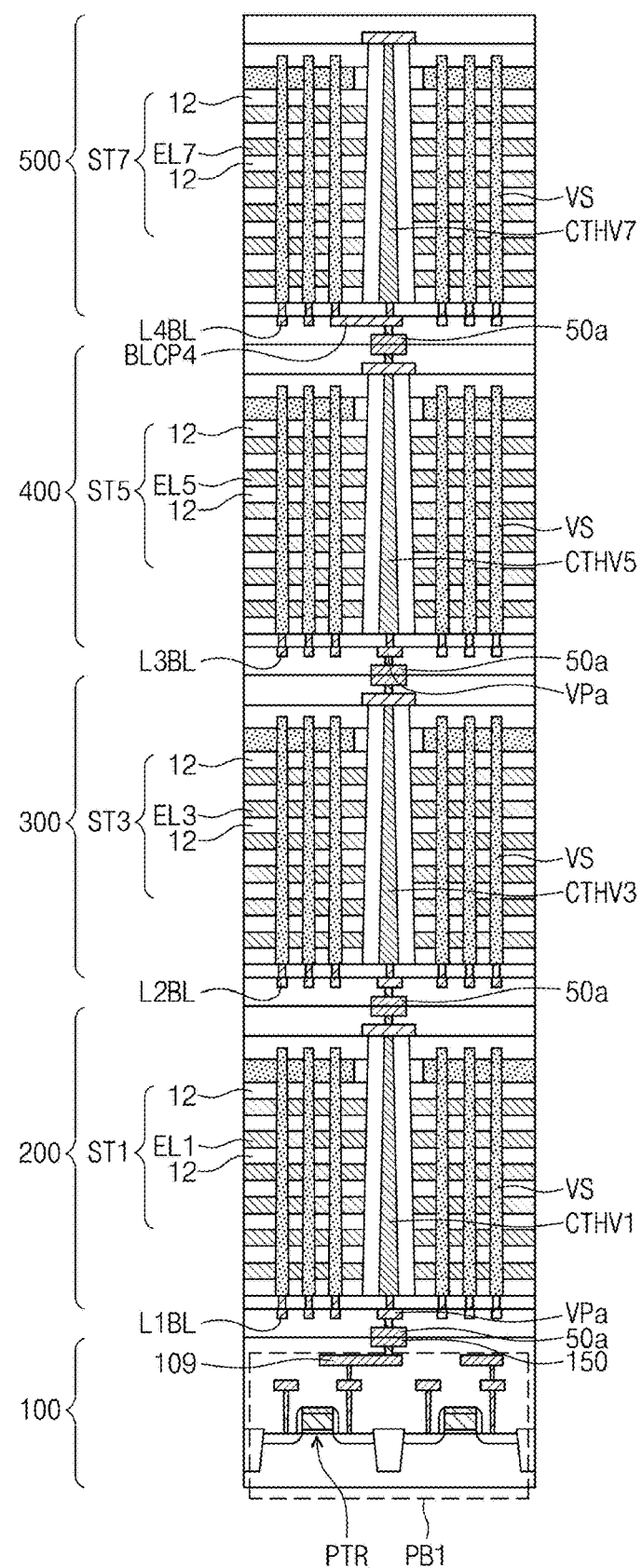

FIGS. 24 and 25 illustrate cross-sectional views showing a three-dimensional semiconductor memory device according to some example embodiments of the present inventive concepts.

Referring to FIG. 24, first, second, third, and fourth memory chips 200, 300, 400, and 500 may be sequentially stacked on the logic chip 100. The logic chip 100 may include a plurality of page buffer circuit parts that are different from each other. One of the page buffer circuit parts may be a first page buffer circuit part PB1. The first page buffer circuit part PB1 may be different from the others of the page buffer circuit parts. The first memory chip 200 may include a first cell through via CTHV1 that penetrates the first stack structure ST1. The second memory chip 300 may include a third cell through via CTHV3 that penetrates the third stack structure ST3. The third memory chip 400 may include a fifth cell through via CTHV5 that penetrates the fifth stack structure ST5. The fourth memory chip 500 may include a seventh cell through via CTHV7 that penetrates the seventh stack structure ST7. The first, third, fifth, and seventh cell through vias CTHV1, CTHV3, CTHV5, and CTHV7 may vertically overlap each other and have electrical connection with each other The first, third, fifth, and seventh cell through vias CTHV1, CTHV3, CTHV5, and CTHV7 may be electrically connected to a bit-line selection transistor PTR of the first page buffer circuit part PB1 included in the logic chip 100.

The seventh cell through via CTHV7 may be connected to a fourth bit-line connection line BLCP4 electrically connected to one of fourth-layered bit lines L4BL. The third cell through via CTHV3 may be connected to a second bit-line connection line BLCP2 electrically connected to one of second-layered bit lines L2BL. On the other hand, the first cell through via CTHV1 connected to the third cell through via CTHV3 may not be electrically connected to a first-layered bit line L1BL. In addition, the fifth cell through via CTHV5 connected to the seventh cell through via CTHV7 may not be electrically connected to a third-layered bit line L3BL.

A semiconductor memory device according to some example embodiments may be configured such that bit lines of the second and fourth memory chips 300 and 500 may be connected to the first page buffer circuit part PB1. Bit lines of the first and third memory chips 200 and 400 may be connected not to the first page buffer circuit part PB1, but to a page buffer circuit part different from the first page buffer circuit part PB1.

Alternatively, referring to FIG. 25, only the seventh cell through via CTHV7 of the fourth memory chip 500 may be electrically connected to one of the fourth-layered bit lines L4BL. The first, third, and fifth cell through vias CTHV1, CTHV3, and CTHV5 that are connected to the seventh cell through via CTHV7 may be connected to none of the first-, second-, and third-layered bit lines L1BL, L2BL, and L3BL. For example, only the fourth-layered bit lines L4BL of the fourth memory chip 500 may be electrically connected to the first page buffer circuit part PB1. The bit lines of the first, second, and third memory chips 200, 300, and 400 may be connected not to the first page buffer circuit part PB1, but to a page buffer circuit part different from the first page buffer circuit part PB1.

As shown in FIGS. 24 and 25, when a plurality of memory chips are stacked, connections between the bit lines may be separated from each other to reduce a total resistance of each of the bit lines and to decrease parasitic capacitance between the bit lines, which may result in an improvement in performance of the semiconductor memory device.

Figure 26:
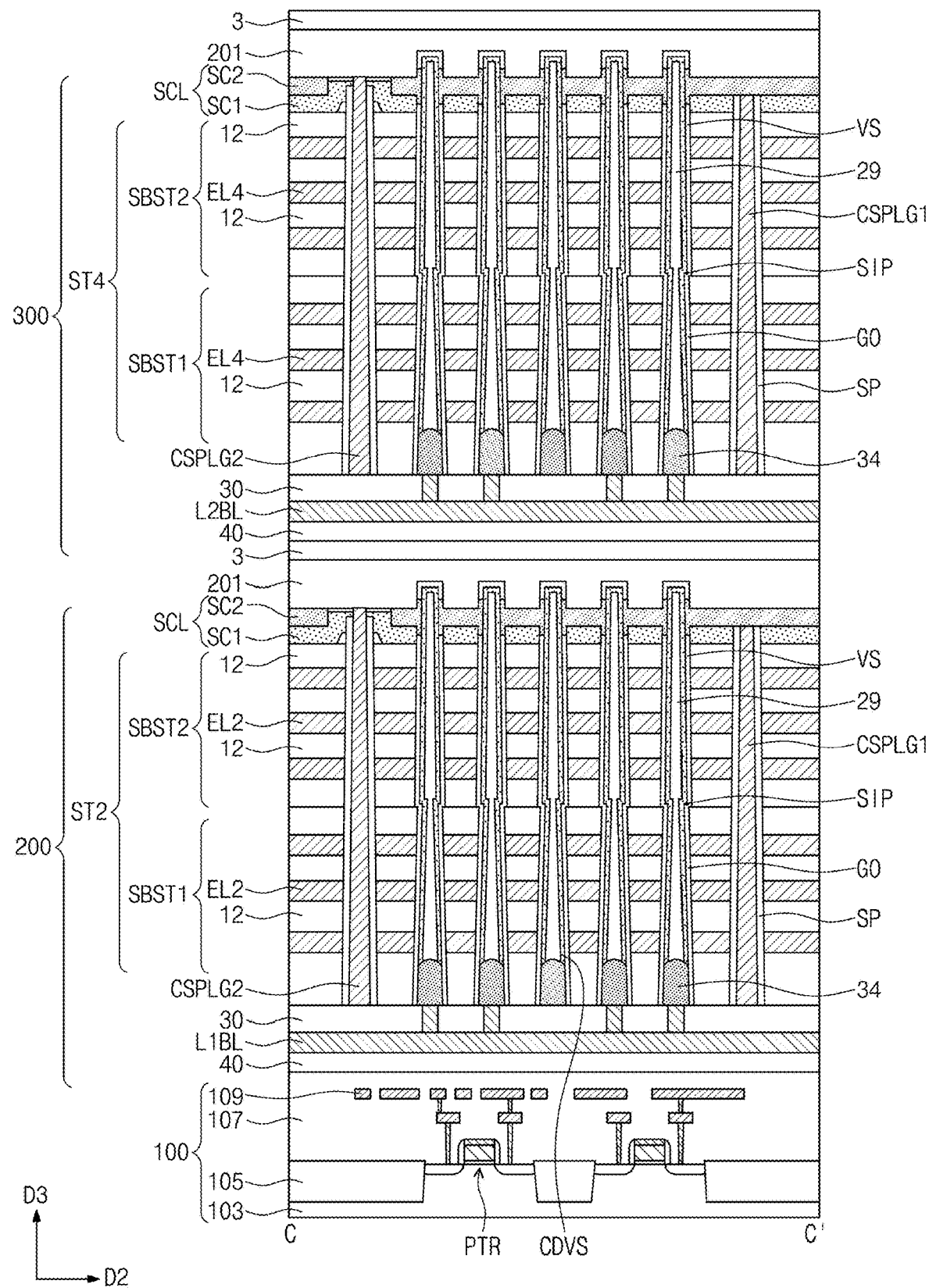
FIG. 26 illustrates a cross-sectional view taken along line C-C' of FIG. 2B or 2C.

FIG. 26 illustrates a cross-sectional view taken along line C-C' of FIG. 2B or 2C.

Referring to FIG. 26, each of the first to fourth stack structures ST1 to ST4 may include a first sub-stack structure SBST1 and a second sub-stack structure SBST2. The second sub-stack structure SBST2 may be closer than the first sub-stack structure SBST1 to the source layer SCL. The first sub-stack structure SBST1 may be closer than the second sub-stack structure SBST2 to the logic chip 100. The sidewalls of the vertical patterns VS, CDVS, and EDVS may have their inflection points SIP adjacent to a boundary between the first sub-stack structure SBST1 and the second sub-stack structure SBST2. In addition, the sidewall of the gate dielectric layer GO may have an inflection point adjacent to the boundary between the first sub-stack structure SBST1 and the second sub-stack structure SBST2. Other structural features may be identical or similar to those discussed above with reference to FIG. 3C.

Figure 27:
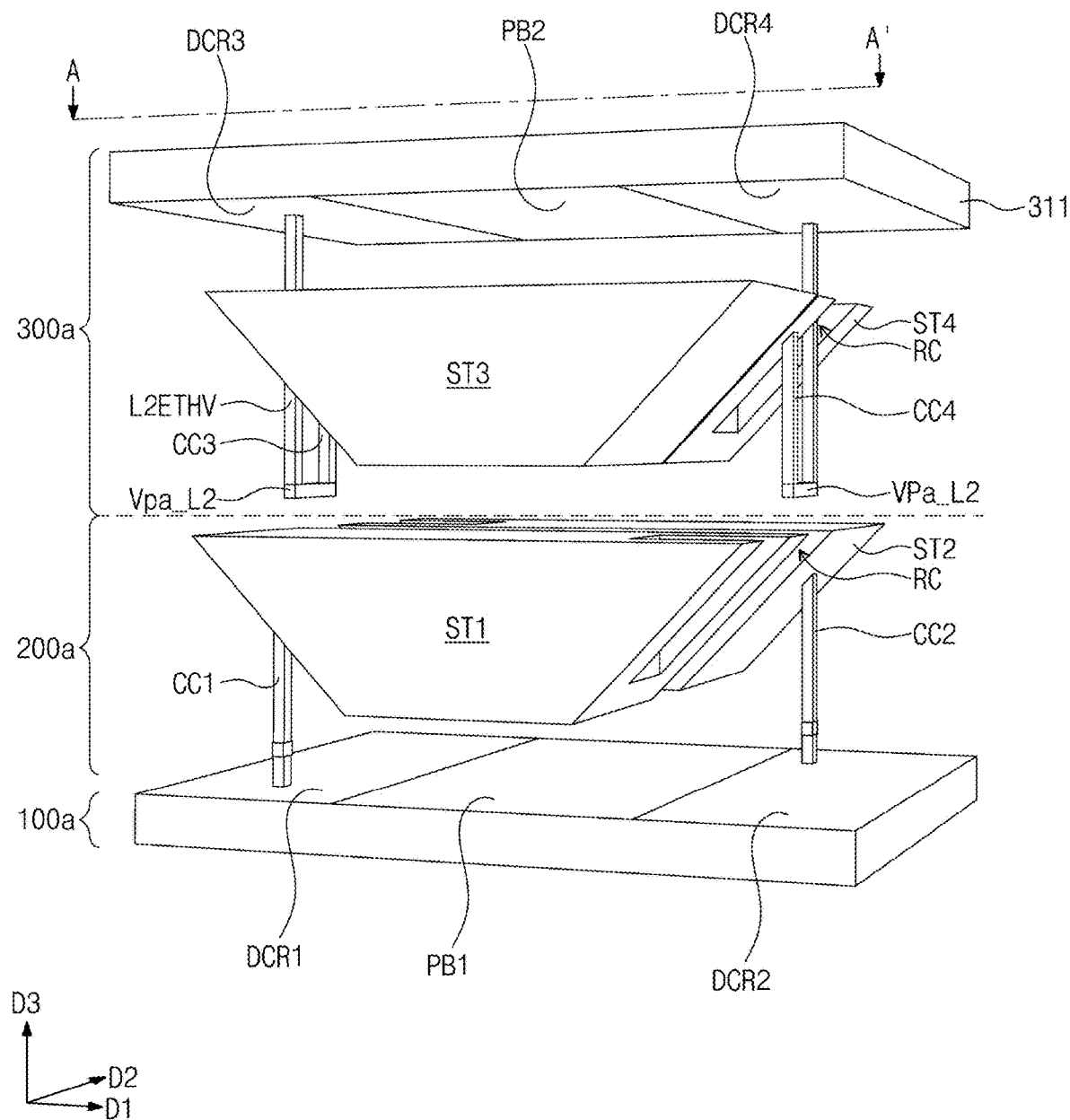
FIG. 27 illustrates a perspective view showing a three-dimensional semiconductor memory device according to some example embodiments of the present inventive concepts.
Figure 28:
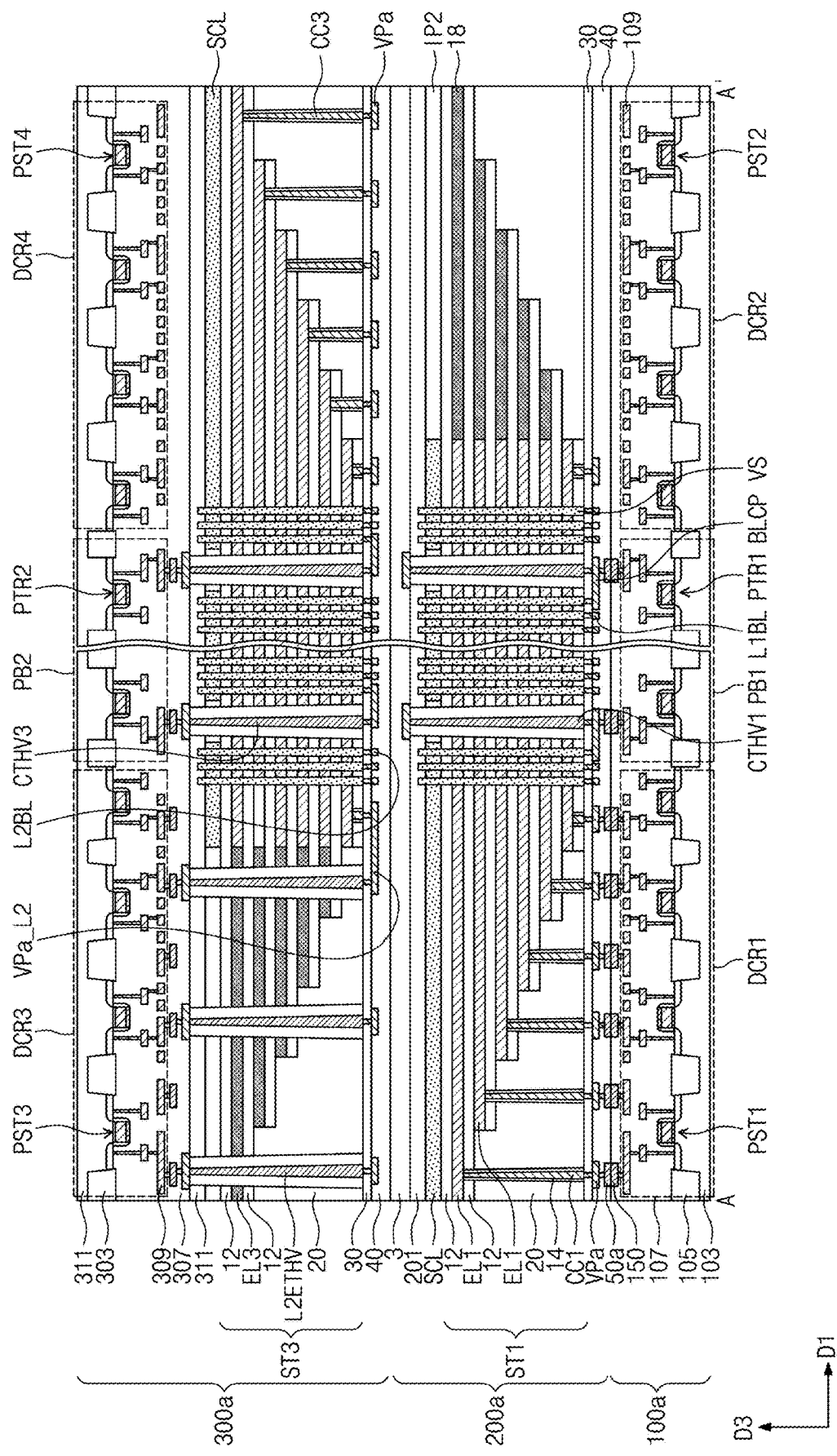
FIG. 28 illustrates a cross-sectional view taken along line A-A' of FIG. 27.

FIG. 27 illustrates a perspective view showing a three-dimensional semiconductor memory device according to some example embodiments of the present inventive concepts. FIG. 28 illustrates a cross-sectional view taken along line A-A' of FIG. 27.

Referring to FIGS. 27 and 28, a first semiconductor chip 100a, a second semiconductor chip 200a, and a third semiconductor chip 300a may be sequentially stacked. The first, second, and third semiconductor chips 100a, 200a, and 300a may be bonded to each other. The first semiconductor chip 100a may be electrically connected to the second semiconductor chip 200a. On the other hand, in some example embodiments, the second semiconductor chip 200a may not be electrically connected to the third semiconductor chip 300a.

The first semiconductor chip 100a may correspond to the logic chip 100 discussed above. The first semiconductor chip 100a may include a first decoder circuit part DCR1, a first page buffer circuit part PB1, and a second decoder circuit part DCR2 that are arranged side by side in the first direction D1. The first decoder circuit part DCR1 may include a plurality of first pass transistors PST1. The second decoder circuit part DCR2 may include a plurality of second pass transistors PST2. The first page buffer circuit part PB1 may include a plurality of first bit-line selection transistors PTR1.

The second semiconductor chip 200a may correspond to the first memory chip 200 discussed above. The second semiconductor chip 200a may include a first stack structure ST1 and a second stack structure ST2 that are arranged side by side in the second direction D2. The first stack structure ST1 may include first electrode layers EL1 that are stacked. The second stack structure ST2 may include second electrode layers EL2 that are stacked. The first stack structure ST1 and the second stack structure ST2 may have their stepwise ends whose distances from the first semiconductor chip 100a progressively increase in the first direction D1. The first electrode layers EL1 of the first stack structure ST1 may have their ends that are electrically connected to the first pass transistors PST1 of the first decoder circuit part DCR1 through first cell contact plugs CC1, first conductive patterns VPa, and logic connection terminals 150. The second electrode layers EL2 of the second stack structure ST2 may have their ends that are electrically connected to the second pass transistors PST2 of the second decoder circuit part DCR2 through second cell contact plugs CC2, first conductive patterns VPa, and logic connection terminals 150.

First cell through vias CTHV1 may penetrate the first electrode layers ELL Second cell through vias CTHV2 may penetrate the second electrode layers EL2. First-layered bit lines L1BL may be connected to the first and second cell through vias CTHV1 and CTHV2. The first-layered bit lines L1BL may be electrically connected through the first conductive patterns VPa and the logic connection terminals 150 to the first bit-line selection transistors PTR1 of the first page buffer circuit part PB1.

The third semiconductor chip 300a may have a cell-on-peripheral (COP) structure where a memory cell array is disposed on a peripheral circuit section (the peripheral circuit section may also be referred to herein as a peripheral circuit). For example, the third semiconductor chip 300a may include a third substrate 311; a third decoder circuit part DCR3, a second page buffer circuit part PB2, and a fourth decoder circuit part DCR4 that are arranged side by side along the first direction D1 on the third substrate 311; and a third stack structure ST3 and a fourth stack structure ST4 that are spaced apart from each other in the second direction D2 on the third decoder circuit part DCR3, the second page buffer circuit part PB2, and the fourth decoder circuit part DCR4. The third substrate 311 may be, for example, a single-crystalline silicon substrate or a silicon-on-insulator (SOI) substrate. The third substrate 311 may be provided therein with a third device isolation layer 303 that define active regions.

The third substrate 311 may include third pass transistors PST3, fourth pass transistors PST4, and second bit-line selection transistors PTR2. The third substrate 311 may be covered with a circuit dielectric layer 307. The circuit dielectric layer 307 may have a single- or multi-layered structure including one or more of a silicon oxide layer, a silicon nitride layer, a silicon oxynitride layer, and a porous dielectric layer. The circuit dielectric layer 307 may include therein multi-layered third wiring lines 309. The third pass transistors PST3 and ones of the third wiring lines 309 may constitute the third decoder circuit part DCR3. The fourth pass transistors PST4 and other ones of the third wiring lines 309 may constitute the fourth decoder circuit part DCR4. The second bit-line selection transistors PTR2 and still other ones of the third wiring lines 309 may constitute the second page buffer circuit part PB2.

The third stack structure ST3 may include third electrode layers EL3 that are stacked. The fourth stack structure ST4 may include fourth electrode layers EL4 that are stacked. The third stack structure ST3 and the fourth stack structure ST4 may have their stepwise ends whose distances from the first semiconductor chip 100a progressively increase in the first direction D1. The third electrode layers EL3 of the third stack structure ST3 may have their ends that are electrically connected to the third pass transistors PST3 of the third decoder circuit part DCR3 through third cell contact plugs CC3, second-layered electrode connection lines VPa_L2, second-layered edge through vias L2ETHV, and third wiring lines 309. The fourth electrode layers EL4 of the fourth stack structure ST4 may have their ends that are electrically connected to the fourth pass transistors PST4 of the fourth decoder circuit part DCR4 through fourth cell contact plugs CC4, second-layered electrode connection lines VPa_L2, second-layered edge through vias L2ETHV, and third wiring lines 309. According to some example embodiments, the third semiconductor chip 300a may be insulated from the first semiconductor chip 100a and the second semiconductor chip 200a.

Third cell through vias CTHV3 may penetrate the third electrode layers EL3. Fourth cell through vias CTHV4 may penetrate the fourth electrode layers EL4. Second-layered bit lines L2BL may be connected to the third and fourth cell through vias CTHV3 and CTHV4. The second-layered bit lines L2BL may be electrically connected to the second bit-line selection transistors PTR2 of the second page buffer circuit part PB2 through the third and fourth cell through vias CTHV3 and CTHV4 and the third wiring lines 309. Other structural features may be identical or similar to those discussed above.

Figure 29:
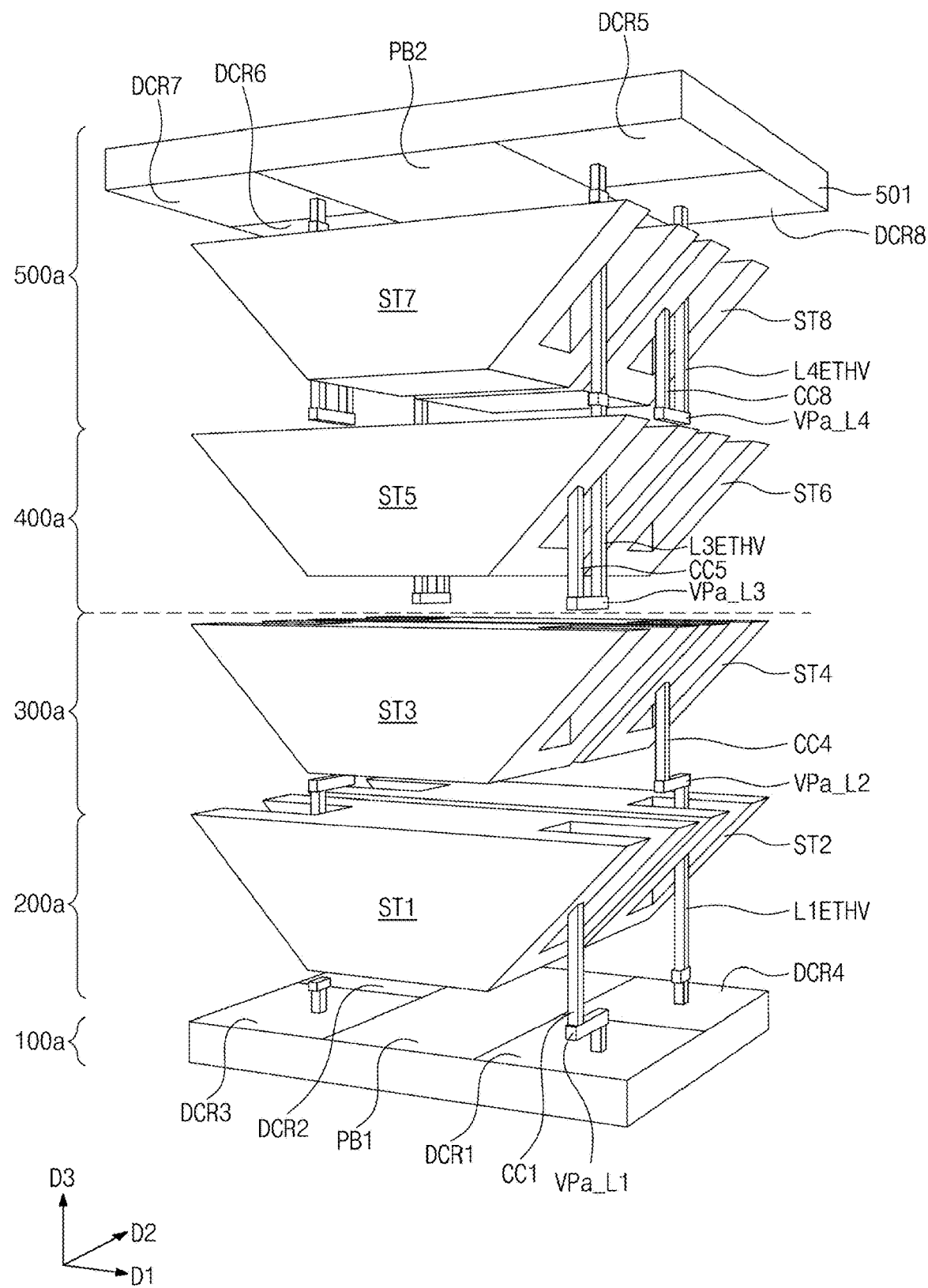
FIG. 29 illustrates a perspective view showing a three-dimensional semiconductor memory device according to some example embodiments of the present inventive concepts.

FIG. 29 illustrates a perspective view showing a three-dimensional semiconductor memory device according to some example embodiments of the present inventive concepts.

Referring to FIG. 29, first to fifth semiconductor chips 100a to 500a may be sequentially stacked. The first to fifth semiconductor chips 100a to 500a may be bonded to each other. The second and third semiconductor chips 200a and 300a may be electrically connected to the first semiconductor chip 100a. The fourth semiconductor chip 400a may be electrically connected to the fifth semiconductor chip 500a. An electrical connection member may be absent between the third semiconductor chip 300a and the fourth semiconductor chip 400a.

The first semiconductor chip 100a may correspond to the logic chip 100 discussed above. The first semiconductor chip 100a may include first and fourth decoder circuit parts DCR1 and DCR4 that are disposed on one side of a first page buffer circuit part PB1, and may also include second and third decoder circuit parts DCR2 and DCR3 that are disposed on another side of the first page buffer circuit part The second, third, and fourth semiconductor chips 200a, 300a, and 400a may respectively correspond to the first, second, and third memory chips 200, 300, and 400 that are discussed above. The second semiconductor chip 200a may include first and second stack structures ST1 and ST2 that are spaced apart from each other in the second direction D2. The third semiconductor chip 300a may include third and fourth stack structures ST3 and ST4 that are spaced apart from each other in the second direction D2. The fourth semiconductor chip 400a may include fifth and sixth stack structures ST5 and ST6 that are spaced apart from each other in the second direction D2.

Similar to the third semiconductor chip 300a discussed with reference to FIGS. 27 and 28, the fifth semiconductor chip 500a may have a cell-on-peripheral (COP) structure. The fifth semiconductor chip 500a may include a second page buffer circuit part PB2 disposed on a fifth substrate 501, first and eighth decoder circuit parts DCR5 and DCR8 that are disposed on one side of the second page buffer circuit part PB2, and sixth and seventh decoder circuit parts DCR6 and DCR7 that are disposed on another side of the second page buffer circuit part PB2. The fifth semiconductor chip 500a may also include seventh and eighth stack structures ST7 and ST8 that are disposed on the second page buffer circuit part PB2 and are spaced apart from each other in the second direction D2.

The first stack structure ST1 may include first electrode layers EL1 that are connected to the first decoder circuit part DCR1 through first cell contact plugs CC1 and first-layered electrode connection lines VPa_L1. The second stack structure ST2 may include second electrode layers EL2 that are connected to the second decoder circuit part DCR2 through second cell contact plugs CC2 and first-layered electrode connection lines VPa_L1. The third stack structure ST3 may include third electrode layers EL3 that are connected to the third decoder circuit part DCR3 through third cell contact plugs CC3, second-layered electrode connection lines VPa_L2, and first-layered edge through vias L1ETHV. The fourth stack structure ST4 may include fourth electrode layers EL4 that are connected to the fourth decoder circuit part DCR4 through fourth cell contact plugs CC4, second-layered electrode connection lines VPa_L2, and first-layered edge through vias L1ETHV.

The fifth stack structure ST5 may include fifth electrode layers EL5 that are connected to the fifth decoder circuit part DCR5 through fifth cell contact plugs CC5, third-layered electrode connection lines VPa_L3, third-layered edge through vias L3ETHV, and fourth-layered edge through vias L4ETHV. The sixth stack structure ST6 may include sixth electrode layers EL6 that are connected to the sixth decoder circuit part DCR6 through sixth cell contact plugs CC6, third-layered electrode connection lines VPa_L3, third-layered edge through vias L3ETHV, and fourth-layered edge through vias L4ETHV. The seventh stack structure ST7 may include seventh electrode layers EL7 that are connected to the seventh decoder circuit part DCR7 through seventh cell contact plugs CC7, fourth-layered electrode connection lines VPa_L4, and fourth-layered edge through vias L4ETHV. The eighth stack structure ST8 may include eighth electrode layers EL8 that are connected to the eighth decoder circuit part DCR8 through eighth cell contact plugs CC8, fourth-layered electrode connection lines VPa_L4, and fourth-layered edge through vias L4ETHV. Other structural features may be identical or similar to those discussed above.

In the three-dimensional semiconductor memory devices discussed with reference to FIGS. 1A to 26, the logic chip 100 may be called a peripheral circuit section or a peripheral circuit region. The memory chips may be called memory sections or memory regions.

In the three-dimensional semiconductor memory devices discussed with reference to FIGS. 1A to 26, the logic chip 100 and the first memory chip 200 may be included in a single semiconductor chip having a cell-on-peripheral (COP) structure. Examples of such case will be described below with reference to FIGS. 30 and 31.

Figure 30:
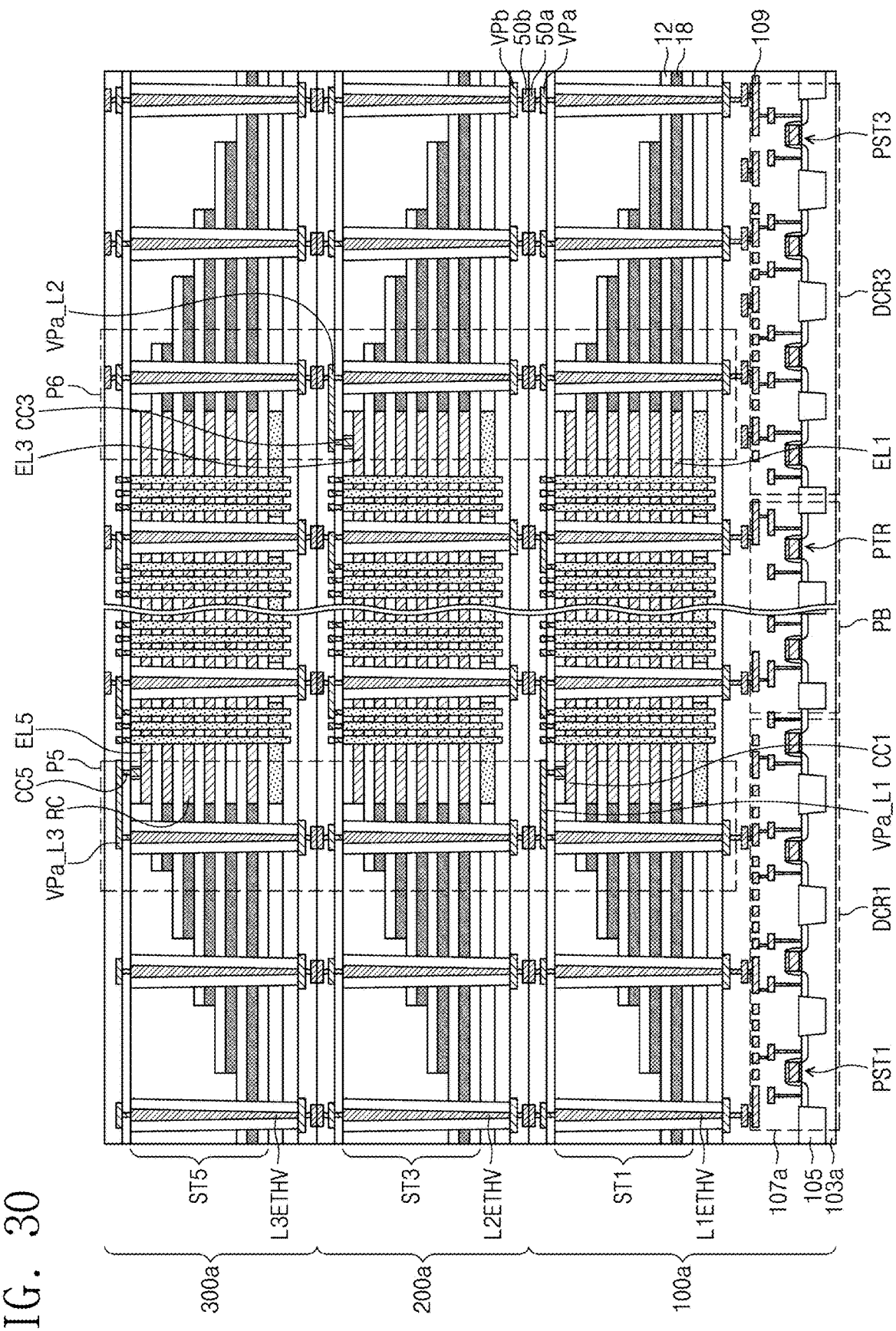
FIGS. 30 and 31 illustrate cross-sectional views showing a three-dimensional semiconductor memory device according to some example embodiments of the present inventive concepts.
Figure 31:
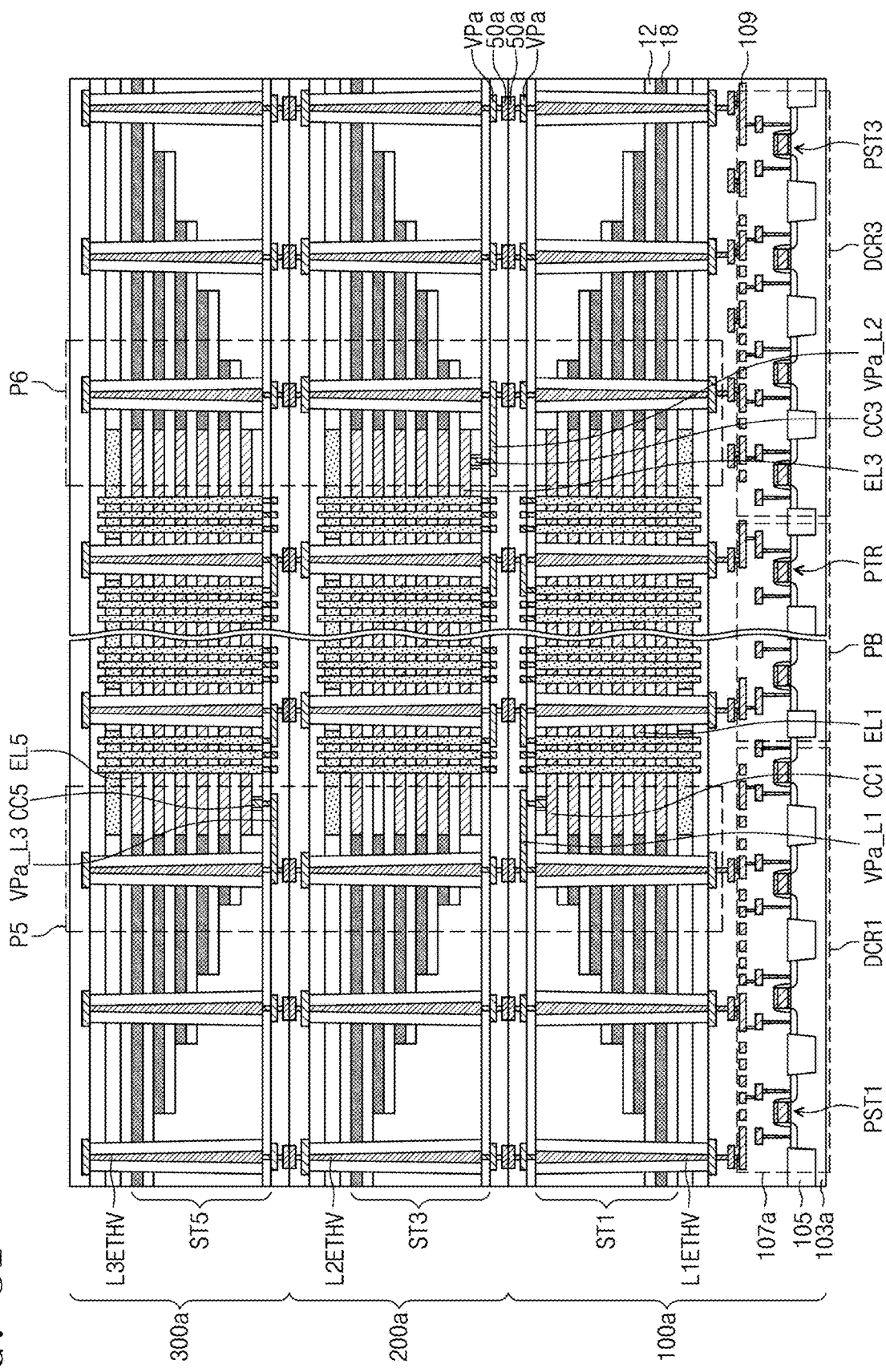

FIGS. 30 and 31 illustrate cross-sectional views showing a three-dimensional semiconductor memory device according to some example embodiments of the present inventive concepts.

Referring to FIG. 30, a first semiconductor chip 100a, a second semiconductor chip 200a, and a third semiconductor chip 300a may be sequentially stacked. The first, second, and third semiconductor chips 100a, 200a, and 300a may be bonded to each other. The first, second, and third semiconductor chips 100a, 200a, and 300a may be electrically connected to each other.

The first semiconductor chip 100a may have a structure including the logic chip 100 and the first memory chip 200 that are discussed with reference to FIG. 22A. The first semiconductor chip 100a may have a cell-on-peripheral (COP) structure. For example, the first semiconductor chip 100a may include a first substrate 103a; a first decoder circuit part DCR1, a page buffer circuit part PB, and a third decoder circuit part DCR3 that are disposed side by side along the first direction D1; and a first stack structure ST1 disposed on the first decoder circuit part DCR1, the page buffer circuit part PB, and the third decoder circuit part DCR3. Although not shown, the first semiconductor chip 100a may include a second decoder circuit part DCR2, a fourth decoder circuit part DCR4, and a second stack structure ST2. The first to fourth decoder circuit parts DCR1 to DCR4 may be covered with a circuit dielectric layer 107a.

The second semiconductor chip 200a and the third semiconductor chip 300a may respectively correspond to the second memory chip 300 and the third memory chip 400 that are discussed with reference to FIG. 22A. The first, second, and third semiconductor chips 100a, 200a, and 300a may include first to sixth stack structures ST1 to ST6 each of which includes recesses RC at its opposite sides as shown in FIG. 22A. In contrast, each of the first to sixth stack structures ST1 to ST6 shown in FIG. 30 may have a structure obtained by turning upside down a corresponding one of the first to sixth stack structures ST1 to ST6 shown in FIG. 22A. For example, the first to sixth stack structures ST1 to ST6 may have their stepwise ends, which have their top surfaces whose distances from the first substrate 103a progressively decrease in the first direction D1.

The three-dimensional semiconductor memory device of FIG. 31 may have a structure in which the second and third semiconductor chips 200a and 300a of FIG. 30 are turned upside down. Other structural features may be identical or similar to those discussed with reference to FIG. 30.

As shown in section P5 of FIG. 30 or 31, it may be ascertained that one of the first electrode layers EL1 and one of the fifth electrode layers EL5 are electrically connected in common to one of the first pass transistors PST1. As shown in section P6 of FIG. 30 or 31, it may be ascertained that one of the third electrode layers EL3 is electrically connected to one of the third pass transistors PST3. A connection relationship between the first to sixth stack structures ST1 to ST6 of FIG. 30 or 31 may be the same as or similar to that shown in FIG. 22 except for the seventh and eighth stack structures ST7 and ST8.

In the three-dimensional semiconductor memory device of FIG. 30, the first, second, and third semiconductor chips 100a, 200a, and 300a may be included in a single semiconductor chip. An example of such case will be explained below with reference to FIG. 32.

Figure 32:
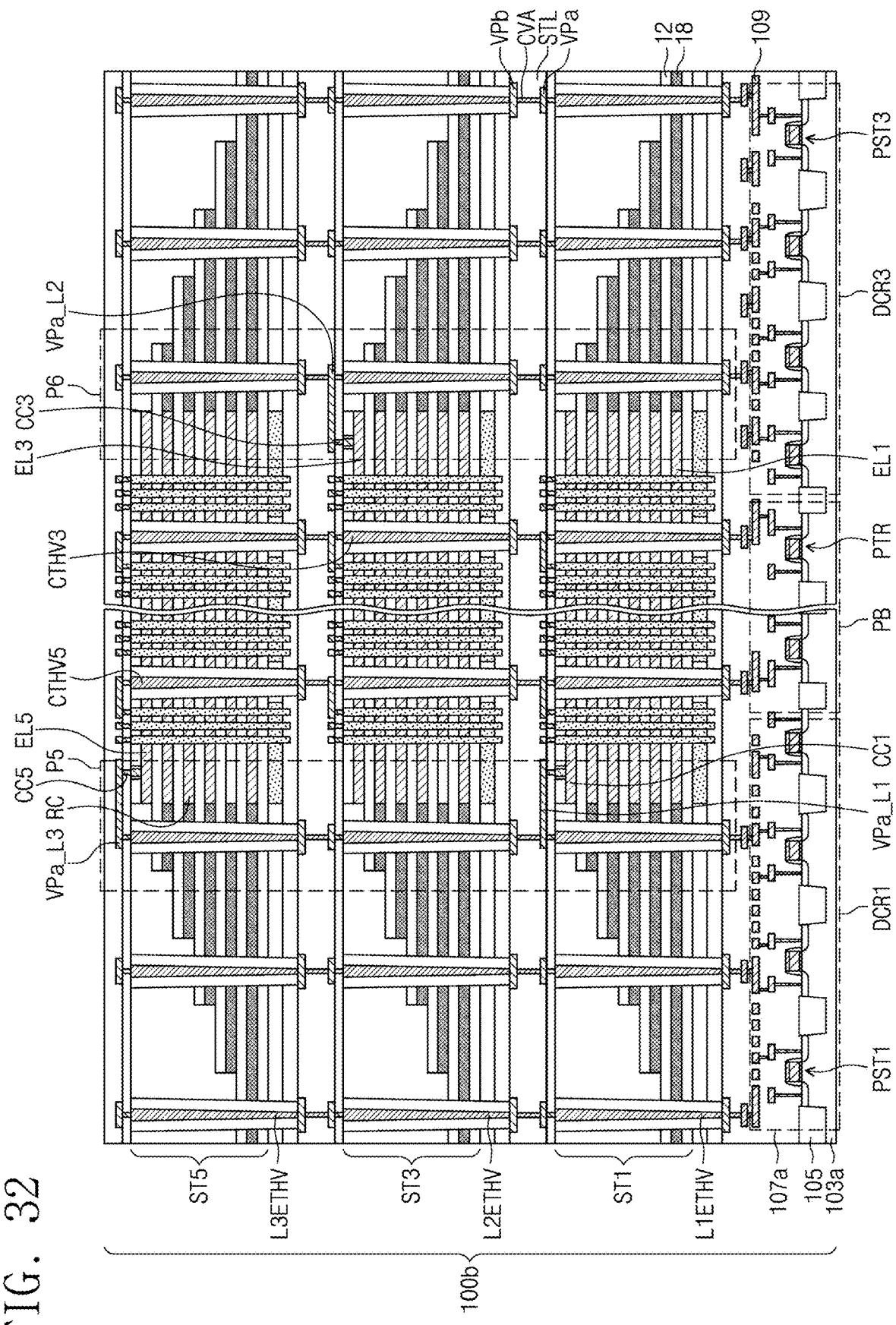
FIG. 32 illustrates a cross-sectional view showing a three-dimensional semiconductor memory device according to some example embodiments of the present inventive concepts.

FIG. 32 illustrates a cross-sectional view showing a three-dimensional semiconductor memory device according to some example embodiments of the present inventive concepts.

Referring to FIG. 32, a semiconductor chip 100b may include a first substrate 103a, and may also include a first decoder circuit part DCR1, a page buffer circuit part PB, and a third decoder circuit part DCR3 that are arranged side by side along the first direction D1 on the first substrate 103a. Although not shown, the semiconductor chip 100b may further include second and fourth decoder circuit parts DCR2 and DCR4. The first to fourth decoder circuit parts DCR1 to DCR4 may be covered with a circuit dielectric layer 107a. A first stack structure ST1, a third stack structure ST3, and a fifth stack structure ST5 may be sequentially stacked on the circuit dielectric layer 107a. Although not shown, the circuit dielectric layer 107a may be provided thereon with sequentially stacked second, fourth, and sixth stack structures ST2, ST4, and ST6 that are spaced apart from the first, third, and fifth stack structures ST1, ST3, and ST5, respectively, in the second direction D2.

First-, second-, and third-layered edge through vias L1ETHV, L2ETHV, and L3ETHV may penetrate ends of the first, third, and fifth stack structures ST1, ST3, and ST5, respectively. First-, second-, and third-layered electrode connection lines VPa_L1, VPa_L2, and VPa_L3 may be respectively disposed on the first, third, and fifth stack structures ST1, ST3, and ST5, thereby allowing first, third, and fifth cell contact plugs CC1, CC3, and CC5 to have connection with corresponding ones of the first-, second-, and third-layered edge through vias L1ETHV, L2ETHV, and L3ETHV.

On the cell array region CAR, first, third, and fifth cell through vias CTHV1, CTHV3, and CTHV5 may respectively penetrate the first, third, and fifth stack structures ST1, ST3, and ST5. The first, third, and fifth cell through vias CTHV1, CTHV3, and CTHV5 may be respectively connected to first-, second-, and third-layered bit lines L1BL, L2BL, and L3BL that are disposed on the first, third, and fifth stack structures ST1, ST3, and ST5.

An inter-stack dielectric layer STL may be interposed between ones of the first, third, and fifth stack structures ST1, ST3, and ST5. The inter-stack dielectric layer STL may have a single- or multi-layered structure including one or more of a silicon oxide layer, a silicon nitride layer, and a silicon oxynitride layer. The inter-stack dielectric layer STL may have therein connection via plugs CVA through which the first-, second-, and third-layered edge through vias L1ETHV, L2ETHV, and L3ETHV are electrically connected to each other. In addition, the first, third, and fifth cell through vias CTHV1, CTHV3, and CTHV5 may be electrically connected to each other through ones of the connection via plugs CVA. Other structural features may be identical or similar to those discussed above with reference to FIG. 30.

Figure 33:
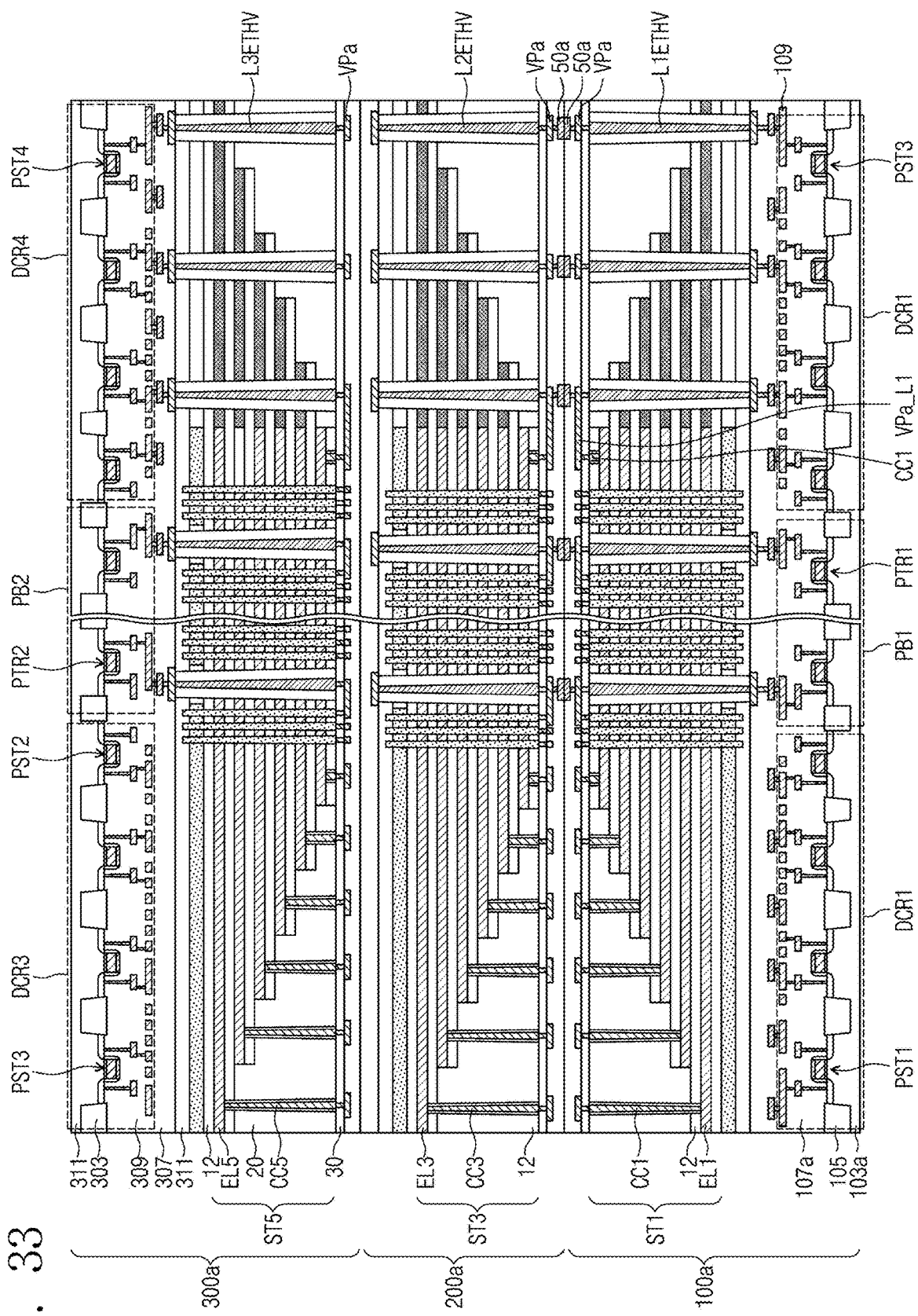
FIG. 33 illustrates a cross-sectional view showing a three-dimensional semiconductor memory device according to some example embodiments of the present inventive concepts.

FIG. 33 illustrates a cross-sectional view showing a three-dimensional semiconductor memory device according to some example embodiments of the present inventive concepts.

Referring to FIG. 33, a first semiconductor chip 100a, a second semiconductor chip 200a, and a third semiconductor chip 300a may be sequentially stacked. The first, second, and third semiconductor chips 100a, 200a, and 300a may be bonded to each other. The first and second semiconductor chips 100a and 200a may be electrically connected to each other, but may be insulated from the third semiconductor chip 300a. The first and second semiconductor chips 100a and 200a of FIG. 33 may respectively correspond to the first and second semiconductor chips 100a and 200a of FIG. 31, and may have their structure and connection relationship identical or similar to those of the first and second semiconductor chips 100a and 200a of FIG. 31. The third semiconductor chip 300a of FIG. 33 may be configured identically or similarly to the third semiconductor chip 300a of FIG. 28. The first and third semiconductor chips 100a and 300a may each have a cell-on-peripheral (COP) structure. The example shown in FIG. 33 may correspond to an example of a combination of some example embodiments shown in FIGS. 31 and 28. According to some example embodiments, the memory cell array of the third semiconductor chip 300a is electrically connected to the peripheral circuit section of the third semiconductor chip 300a and insulated from the first semiconductor chip 100a and the second semiconductor chip 200a.

Figure 34:
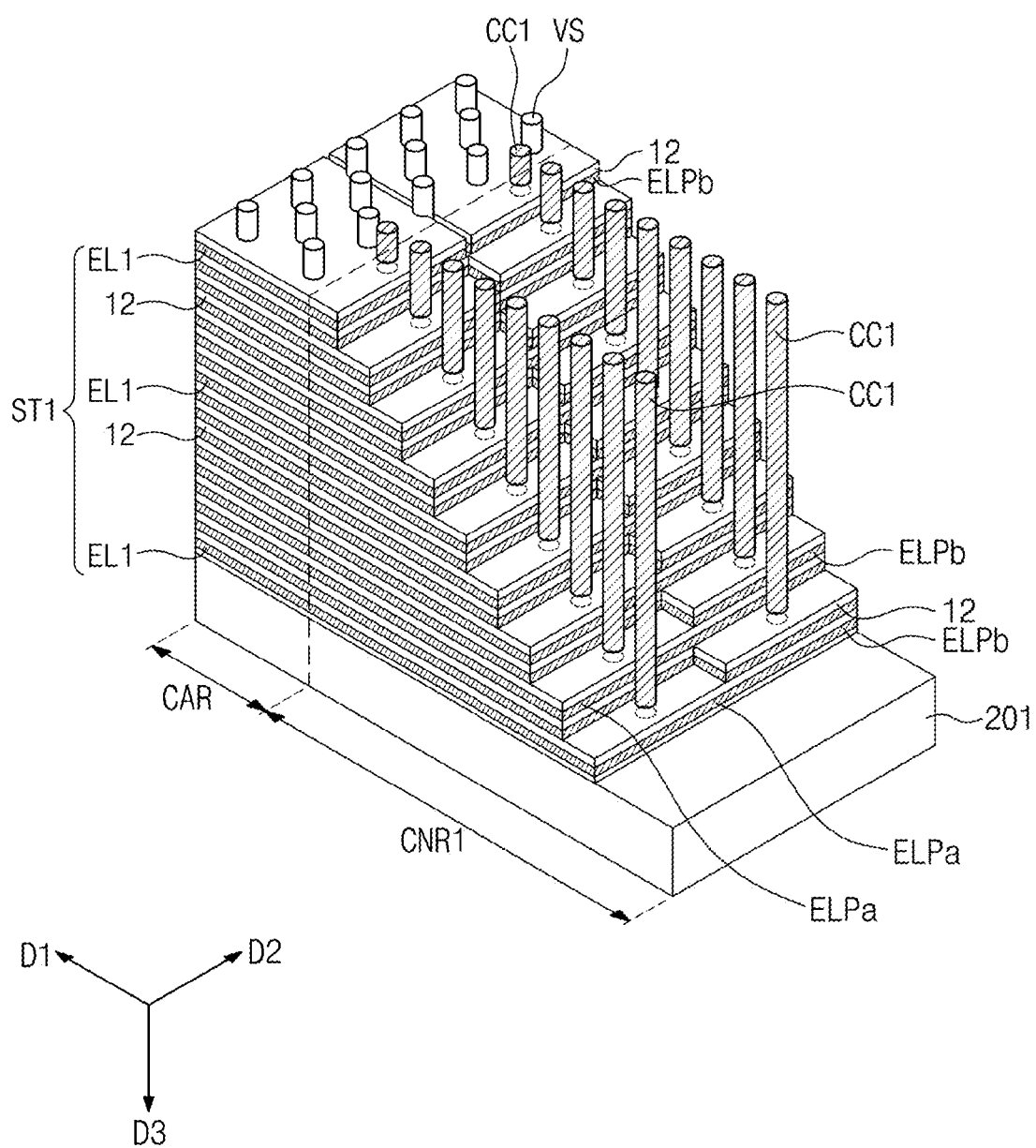
FIG. 34 illustrates a perspective view showing an end of a first stack structure according to some example embodiments of the present inventive concepts.

FIG. 34 illustrates a perspective view showing an end of a first stack structure according to some example embodiments of the present inventive concepts.

Referring to FIGS. 3A and 34, the first electrode layers EL1 included in the first stack structure ST1 may have pad portions ELPa and ELPb in contact with the first cell contact plugs CC1 on the first connection region CNR1. For example, odd-numbered ones of the first electrode layers EL1 stacked on the first memory substrate 201 may have their first pad portions ELPa. Even-numbered ones of the first electrode layers EL1 may have their second pad portions ELPb. The first pad portions ELPa may not overlap the second pad portions ELPb. The first pad portions ELPa may protrude laterally (e.g., in the second direction D2) from the second pad portions ELPb. When viewed along the second direction D2, a step difference may be provided between the first and second pad portions ELPa and ELPb. The first cell contact plugs CC1 may penetrate the inter-electrode dielectric layers 12 and may contact corresponding ones of the first and second pad portions ELPa and ELPb.

The first electrode layers EL1 may also have their structures on the second connection region CNR2 identical or similar to those on the first connection region CNR1. Moreover, in the three-dimensional semiconductor memory devices discussed with reference to FIGS. 1A to 33, the second to eighth electrode layers EL2 to EL8 may have their ends whose structures are the same as or similar to that mentioned above. The pad portions may have their positions discussed above, and therefore it may be possible to prevent or reduce bridges between the cell contact plugs and to increase the degree of freedom of wiring. As a result, three-dimensional semiconductor memory devices may increase in reliability.

The example shown in FIG. 34 shows that the odd-numbered electrode layers have their pad portions whose positions are different from those of the pad portions of the even-numbered electrode layers, but three or more electrode layers may have their pad portions constituting a single set that protrudes in the second direction D2 to form a stepwise shape.

Figure 35:
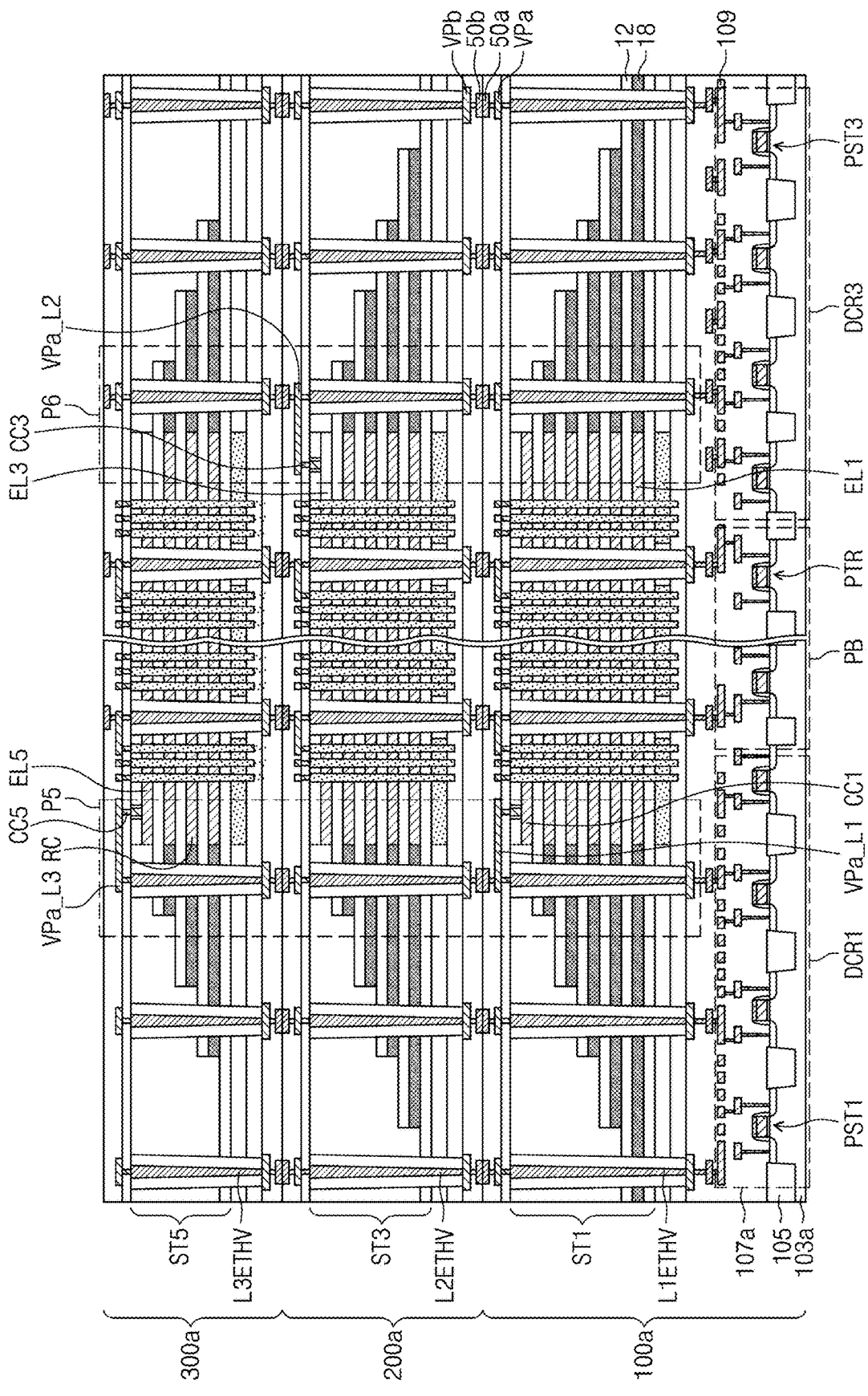
FIG. 35 illustrates a cross-sectional view showing a three-dimensional semiconductor memory device according to some example embodiments of the present inventive concepts.

FIG. 35 illustrates a cross-sectional view showing a three-dimensional semiconductor memory device according to some example embodiments of the present inventive concepts.

Referring to FIG. 35, the first, third, and fifth electrode layers EL1, EL3, and EL5 respectively included in the first, third, and fifth stack structures ST1, ST3, and ST5 may have different total numbers from each other. For example, the total number of the third electrode layers EL3 may be less than that of the first electrode layers EL1 and greater than that of the fifth electrode layers EL5. Therefore, the first, third, and fifth stack structures ST1, ST3, and ST5 may have their vertical lengths (or thicknesses) different from each other. For example, the third stack structure ST3 may be thinner than the first stack structure ST1 and thicker than the fifth stack structure ST5. Similar to that described above, the edge through vias L1ETHV, L2ETHV, and L3ETHV and the vertical patterns VS may have different vertical lengths from each other. Other structural features and connection relationships may be identical or similar to those discussed with reference to FIG. 30.

A three-dimensional semiconductor memory device according to the present inventive concepts may include a plurality of memory chips that are stacked on a logic chip, and may separate from each other a plurality of driver circuits (e.g., pass transistors or bit-line selection transistors) that operate memory blocks included in each memory chip. As a result, the three-dimensional semiconductor memory device may increase in reliability and may have advantages of high integration.

According to some example embodiments, the three-dimensional semiconductor memory device may be electrically connected to and configured to communicate with another device (e.g., a memory controller). The other device may be implemented using processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. According to some example embodiments, the circuits described herein (e.g., decoder circuits, page buffer circuits, control circuits, driver circuits, data input/output circuits, logic circuits, peripheral circuits, etc.) may be performed by processing circuitry.

Spatially relative terms, such as "beneath," "below," "lower," "above," "upper" and the like, may be used herein for ease of description to describe one element or feature's relationship to another element(s) or feature(s) as illustrated in the figures. For example, as used herein, the terms "upper," "higher," "on" and/or "top" may refer to an element or feature further in the third direction D3 (as depicted in FIG. 2) with respect to another element or feature, and the terms "lower" and/or "below" may refer to an element or feature further in a direction opposite the third direction D3 with respect to another element or feature. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that when an element is referred to as being "connected" or "coupled" to another element, it can be directly connected or coupled to the other element or intervening elements may be present. As used herein the term "and/or" includes any and all combinations of one or more of the associated listed items.

Some example embodiments are described herein with reference to cross-sectional illustrations that are schematic illustrations of idealized examples. As such, variations from the shapes of the illustrations as a result, for example, of manufacturing techniques and/or tolerances, are to be expected. Thus, some example embodiments should not be construed as limited to the particular shapes of regions illustrated herein but are to include deviations in shapes that result, for example, from manufacturing.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts. For example, there may be various combinations of some example embodiments discussed with reference to FIGS. 1A to 35.

What is claimed is:

1. A three-dimensional semiconductor memory device, comprising:
    a first peripheral circuit including a plurality of different decoder circuits;
    a first memory on the first peripheral circuit, the first memory including
        a first stack structure having a plurality of first electrode layers stacked on one another and a plurality of first inter-electrode dielectric layers between first electrode layers of the plurality of first electrode layers,
        a first planarized dielectric layer covering an end of the first stack structure, and
        a first through via that penetrates the first planarized dielectric layer and the end of the first stack structure, the first through via being insulated from the plurality of first electrode layers and electrically connected to one of the plurality of different decoder circuits; and
    a second memory on the first memory, the second memory including
        a second stack structure having a plurality of second electrode layers stacked on one another and a plurality of second inter-electrode dielectric layers between second electrode layers of the plurality of second electrode layers,
        a second planarized dielectric layer covering an end of the second stack structure, and
        a first cell contact plug that penetrates the second planarized dielectric layer, the first cell contact plug electrically connecting one of the plurality of second electrode layers to the first through via.

2. The three-dimensional semiconductor memory device of claim 1, wherein
    the first memory includes a first through dielectric layer surrounding the first through via;
    the second memory includes a first contact dielectric layer surrounding the first cell contact plug; and
    a thickness of the first through dielectric layer is greater than a thickness of the first contact dielectric layer.

3. The three-dimensional semiconductor memory device of claim 1, wherein
    the first memory includes a first through dielectric layer surrounding the first through via;
    the first through dielectric layer has a first thickness parallel to a first direction parallel to a top surface of the first peripheral circuit;
    one of the plurality of first inter-electrode dielectric layers has a second thickness parallel to a second direction perpendicular to the top surface of the first peripheral circuit; and the first thickness is the same as or greater than the second thickness.

4. The three-dimensional semiconductor memory device of claim 1, wherein
    the plurality of first electrode layers include a plurality of first recesses at the end of the first stack structure, inner walls of the plurality of first recesses being vertically aligned with each other;
    the first stack structure includes a plurality of first residual sacrificial patterns that fill the plurality of first recesses; and
    the first through via penetrates one of the plurality of first residual sacrificial patterns.

5. The three-dimensional semiconductor memory device of claim 1, wherein
    the plurality of different decoder circuits include a first decoder circuit and a second decoder circuit spaced apart from each other in a first direction parallel to a top surface of the first peripheral circuit; and
    one of the plurality of second electrode layers is electrically connected to the second decoder circuit through the first cell contact plug and the first through via.

6. The three-dimensional semiconductor memory device of claim 5, wherein the first memory further comprises:
    a second cell contact plug penetrating the first planarized dielectric layer, the second cell contact plug electrically connecting one of the plurality of first electrode layers to the first decoder circuit.

7. The three-dimensional semiconductor memory device of claim 5, wherein
    the plurality of different decoder circuits further include a third decoder circuit, the second decoder circuit and the third decoder circuit being adjacent in a second direction that is parallel to the top surface of the first peripheral circuit and intersects the first direction;
    the first memory includes a third stack structure spaced apart from the first stack structure in the second direction;
    the third stack structure includes a plurality of third electrode layers stacked on one another and a plurality of third inter-electrode dielectric layers between third electrode layers of the plurality of third electrode layers;
    the first planarized dielectric layer extends to cover an end of the third stack structure; and
    the first memory includes a third cell contact plug that penetrates the first planarized dielectric layer, the third cell contact plug electrically connecting one of the plurality of third electrode layers to the third decoder circuit.

8. The three-dimensional semiconductor memory device of claim 7, wherein the third stack structure is located at a first distance from the first peripheral circuit identical to a second distance from the first peripheral circuit at which the first stack structure is located.

9. The three-dimensional semiconductor memory device of claim 8, wherein the third stack structure has a shape obtained when the first stack structure rotates about 180 degrees.

10. The three-dimensional semiconductor memory device of claim 1, wherein
    the first stack structure has a first maximum width parallel to a first direction parallel to a top surface of the first peripheral circuit;
    the second stack structure has a second maximum width parallel to the first direction; and the second maximum width is greater than the first maximum width.

11. The three-dimensional semiconductor memory device of claim 1, wherein the end of the second stack structure protrudes laterally beyond the end of the first stack structure.

12. The three-dimensional semiconductor memory device of claim 1, further comprising:
a third memory on the second memory,
wherein
the plurality of different decoder circuits include a first decoder circuit and a second decoder circuit,
the third memory includes
a third stack structure having a plurality of third electrode layers stacked on one another and a plurality of third inter-electrode dielectric layers between third electrode layers of the plurality of third electrode layers; and
a third planarized dielectric layer that covers an end of the third stack structure,
the plurality of third electrode layers and the plurality of first electrode layers are electrically connected to the first decoder circuit, and
the plurality of second electrode layers are electrically connected to the second decoder circuit.

13. The three-dimensional semiconductor memory device of claim 1, wherein
the first memory includes
a plurality of first vertical patterns penetrating the plurality of first electrode layers, and
a plurality of first bit lines connected to ends of first vertical patterns among the plurality of first vertical patterns and are parallel to each other;
wherein the second memory includes
a plurality of second vertical patterns penetrating the plurality of second electrode layers, and
a plurality of second bit lines connected to ends of second vertical patterns among the plurality of second vertical patterns and are parallel to each other;
the first peripheral circuit includes a plurality of page buffer circuits;
the plurality of first bit lines are connected to one of the plurality of page buffer circuits; and
the plurality of second bit lines are not connected to the one of the plurality of page buffer circuits.

14. The three-dimensional semiconductor memory device of claim 13, further comprising:
a third memory on the second memory,
wherein
the third memory includes
a third stack structure that includes a plurality of third electrode layers stacked on one another and a plurality of third inter-electrode dielectric layers between third electrode layers of the plurality of third electrode layers, and
a third planarized dielectric layer that covers an end of the third stack structure,
a plurality of third vertical patterns penetrating the plurality of third electrode layers, and
a plurality of third bit lines connected to ends of third vertical patterns among the plurality of third vertical patterns and are parallel to each other, and
the plurality of third bit lines are connected to the one of the plurality of page buffer circuits.

15. The three-dimensional semiconductor memory device of claim 1, further comprising:
a third memory on the second memory; and
a second peripheral circuit on the third memory,
wherein the third memory is electrically connected to the second peripheral circuit and is insulated from the first peripheral circuit, the first memory, and the second memory.

16. A three-dimensional semiconductor memory device, comprising:
a peripheral circuit including a plurality of different decoder circuits;
a first memory on the peripheral circuit, the first memory including a first stack structure and a second stack structure spaced apart from each other in a first direction parallel to a top surface of the peripheral circuit, the first stack structure including a plurality of first electrode layers stacked on one another, the plurality of first electrode layers being electrically connected to a first decoder circuit among the plurality of different decoder circuits, and the second stack structure including a plurality of second electrode layers stacked on one another; and
a second memory on the first memory, the second memory including a third stack structure and a fourth stack structure spaced apart from each other in the first direction, the third stack structure including a plurality of third electrode layers stacked on one another, the plurality of third electrode layers being electrically connected to a second decoder circuit among the plurality of different decoder circuits, and the fourth stack structure including a plurality of fourth electrode layers stacked on one another.

17. The three-dimensional semiconductor memory device of claim 16, wherein
the second decoder circuit is spaced apart from the first decoder circuit in a second direction, the second direction being parallel to a top surface of the peripheral circuit and intersecting the first direction; and
the three-dimensional semiconductor memory device further comprises
a plurality of first cell contact plugs in contact with corresponding first electrode layers among the plurality of first electrode layers, the plurality of first cell contact plugs connecting the plurality of first electrode layers to the first decoder circuit,
a plurality of second cell contact plugs in contact with corresponding third electrode layers among the plurality of third electrode layers, and
a plurality of first through vias that connect the plurality of second cell contact plugs to the second decoder circuit, the plurality of first through vias being insulated from the plurality of first electrode layers.

18. The three-dimensional semiconductor memory device of claim 16, wherein
the plurality of second electrode layers are electrically connected to a third decoder circuit part among the plurality of different decoder circuits; and
the plurality of fourth electrode layers are electrically connected to a fourth decoder circuit among the plurality of different decoder circuits.

19. A three-dimensional semiconductor memory device, comprising:
a peripheral circuit including a first decoder circuit and a second decoder circuit, the first decoder circuit and the second decoder circuit are side by side in a first direction and different from each other;
a first memory on the peripheral circuit, the first memory including a first stack structure electrically connected to the first decoder; and a second memory on the first memory, the second memory including a second stack structure electrically connected to the second decoder circuit, a portion of the second stack structure protruding beyond the first stack structure.

20. The three-dimensional semiconductor memory device of claim 19, wherein the peripheral circuit includes a third decoder circuit spaced apart from the first decoder circuit in a direction opposite to the first direction;

the first stack structure has a first recess on the third decoder circuit;

the second stack structure has a second recess on the third decoder circuit; and the three-dimensional semiconductor memory device further comprises:

a third memory on the second memory and including a third stack structure, a cell contact plug in contact with the third stack structure on the third decoder circuit, a first through via in the first recess and electrically connected to the cell contact plug, and a second through via in the second recess and electrically connected to the cell contact plug.

* * * * *